(12) United States Patent
Lee

(10) Patent No.: US 8,723,335 B2
(45) Date of Patent: May 13, 2014

(54) SEMICONDUCTOR CIRCUIT STRUCTURE AND METHOD OF FORMING THE SAME USING A CAPPING LAYER

(76) Inventor: Sang-Yun Lee, Beaverton, OR (US)

(*) Notice: Subject to any disclaimer, the term of this patent is extended or adjusted under 35 U.S.C. 154(b) by 558 days.

(21) Appl. No.: 12/847,244

(22) Filed: Jul. 30, 2010

(65) Prior Publication Data

US 2011/0285027 A1    Nov. 24, 2011

Related U.S. Application Data

(60) Provisional application No. 61/346,847, filed on May 20, 2010.

(51) Int. Cl.
*H01L 29/40* (2006.01)

(52) U.S. Cl.
USPC ............. 257/781; 257/774; 257/E21.575; 257/E23.011; 438/478; 438/637

(58) Field of Classification Search
USPC ............. 257/774, 773, E23.011, E21.09; 438/478, 637
See application file for complete search history.

(56) References Cited

U.S. PATENT DOCUMENTS

| | | | |
|---|---|---|---|
| 4,704,785 A | 11/1987 | Curran | |
| 4,829,018 A | 5/1989 | Wahlstrom | |
| 4,939,568 A | 7/1990 | Kato et al. | |
| 5,047,979 A | 9/1991 | Leung | |
| 5,087,585 A | 2/1992 | Hayashi | |
| 5,093,704 A | 3/1992 | Saito et al. | |
| 5,106,775 A | 4/1992 | Kaga et al. | |
| 5,152,857 A | 10/1992 | Ito et al. | |
| 5,265,047 A | 11/1993 | Leung et al. | |
| 5,266,511 A | 11/1993 | Takao | |
| 5,308,782 A | 5/1994 | Mazure et al. | |
| 5,355,022 A | 10/1994 | Sugahara et al. | |
| 5,374,564 A | 12/1994 | Bruel | |
| 5,439,843 A | 8/1995 | Sakaguchi et al. | |
| 5,554,870 A | 9/1996 | Fitch et al. | |
| 5,627,106 A | 5/1997 | Hsu | |
| 5,695,557 A | 12/1997 | Yamagata et al. | |
| 5,737,748 A | 4/1998 | Shigeeda | |
| 5,829,026 A | 10/1998 | Leung et al. | |
| 5,835,396 A | 11/1998 | Zhang | |
| 5,892,225 A | 4/1999 | Okihara | |
| 5,915,167 A | 6/1999 | Leedy | |
| 5,977,579 A | 11/1999 | Noble | |
| 5,980,633 A | 11/1999 | Yamagata et al. | |
| 5,998,808 A | 12/1999 | Matsushita | |
| 6,009,496 A | 12/1999 | Tsai | |
| 6,057,212 A | 5/2000 | Chan et al. | |
| 6,103,597 A | 8/2000 | Aspar et al. | |
| 6,153,495 A | 11/2000 | Kub et al. | |
| 6,222,251 B1 | 4/2001 | Holloway | |
| 6,225,651 B1 | 5/2001 | Billon | |
| 6,229,161 B1 | 5/2001 | Nemati et al. | |
| 6,259,623 B1 | 7/2001 | Takahashi | |
| 6,331,468 B1 | 12/2001 | Aronowitz et al. | |
| 6,380,099 B2 | 4/2002 | Sakaguchi et al. | |
| 6,423,614 B1 | 7/2002 | Doyle | |

(Continued)

*Primary Examiner* — Elias M Ullah
(74) *Attorney, Agent, or Firm* — Greg L Martinez

(57) ABSTRACT

A semiconductor structure includes an interconnect region, and a material transfer region coupled to the interconnect region through a bonding interface. The semiconductor structure includes a capping layer sidewall portion which extends annularly around the material transfer region and covers the bonding interface. The capping layer sidewall portion restricts the flow of debris from the bonding interface.

17 Claims, 48 Drawing Sheets

(56) References Cited

U.S. PATENT DOCUMENTS

| | | |
|---|---|---|
| 6,531,697 B1 | 3/2003 | Nakamura et al. |
| 6,534,382 B1 | 3/2003 | Sakaguchi et al. |
| 6,535,411 B2 | 3/2003 | Jolin et al. |
| 6,600,173 B2 | 7/2003 | Tiwari |
| 6,621,168 B2 | 9/2003 | Sundahl et al. |
| 6,630,713 B2 | 10/2003 | Geusic |
| 6,638,634 B2 | 10/2003 | Miyasaka |
| 6,677,204 B2 | 1/2004 | Cleeves et al. |
| 6,742,067 B2 | 5/2004 | Hsien |
| 6,751,113 B2 | 6/2004 | Bhakta et al. |
| 6,787,920 B2 | 9/2004 | Amir |
| 6,822,233 B2 | 11/2004 | Nakamura et al. |
| 6,854,067 B1 | 2/2005 | Kutz et al. |
| 6,943,067 B2 | 9/2005 | Greenlaw |
| 6,943,407 B2 | 9/2005 | Ouyang et al. |
| 6,995,430 B2 | 2/2006 | Langdo et al. |
| 7,002,152 B2 | 2/2006 | Grunewald |
| 7,052,941 B2 | 5/2006 | Lee |
| 7,078,739 B1 | 7/2006 | Nemati et al. |
| 7,470,142 B2 | 12/2008 | Lee |
| 7,470,598 B2 | 12/2008 | Lee |
| 7,632,738 B2 | 12/2009 | Lee |
| 7,633,162 B2 | 12/2009 | Lee |
| 7,671,371 B2 | 3/2010 | Lee |
| 7,718,508 B2 | 5/2010 | Lee |
| 7,738,702 B2 | 6/2010 | Kanatsu |
| 2002/0024140 A1 | 2/2002 | Nakajima et al. |
| 2002/0025604 A1 | 2/2002 | Tiwari |
| 2002/0125524 A1 | 9/2002 | Okudaira et al. |
| 2002/0141233 A1 | 10/2002 | Hosotani et al. |
| 2002/0153548 A1 | 10/2002 | Mizutani et al. |
| 2003/0067043 A1 | 4/2003 | Zhang |
| 2003/0113963 A1 | 6/2003 | Wurzer |
| 2003/0139011 A1 | 7/2003 | Cleeves et al. |
| 2004/0113207 A1 | 6/2004 | Hsu et al. |
| 2004/0131233 A1 | 7/2004 | Comaniciu et al. |
| 2004/0155301 A1 | 8/2004 | Zhang |
| 2004/0156233 A1 | 8/2004 | Bhattacharyya |
| 2004/0160849 A1 | 8/2004 | Rinerson et al. |
| 2010/0112753 A1* | 5/2010 | Lee .............................. 438/107 |

\* cited by examiner

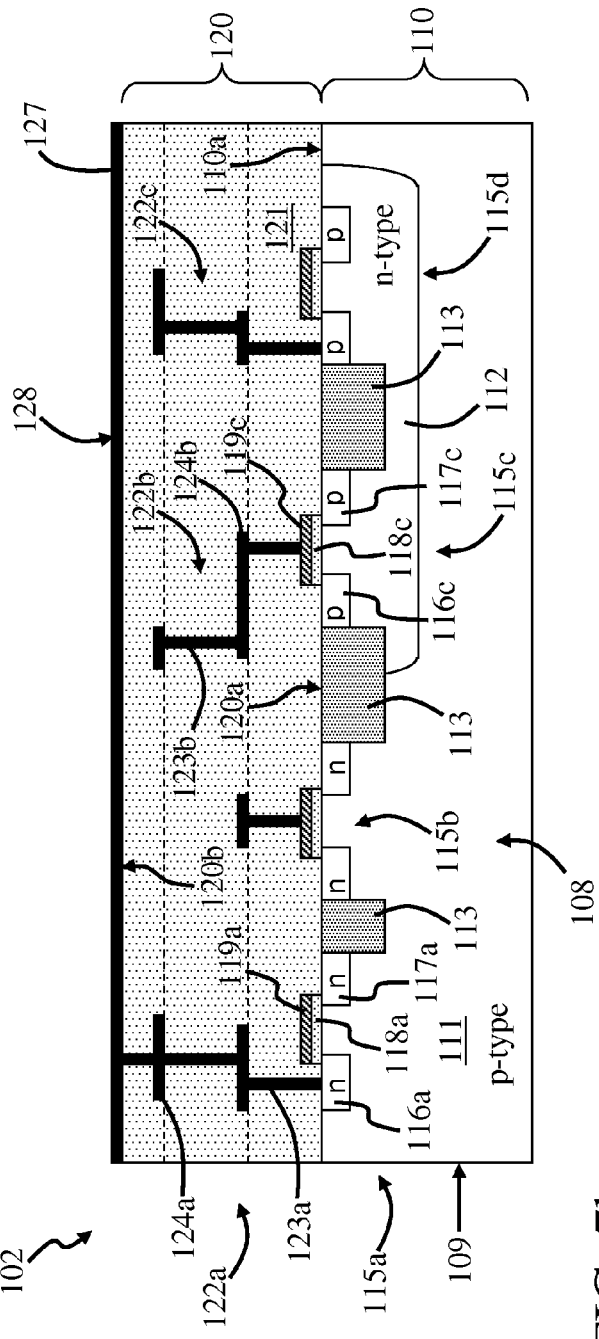

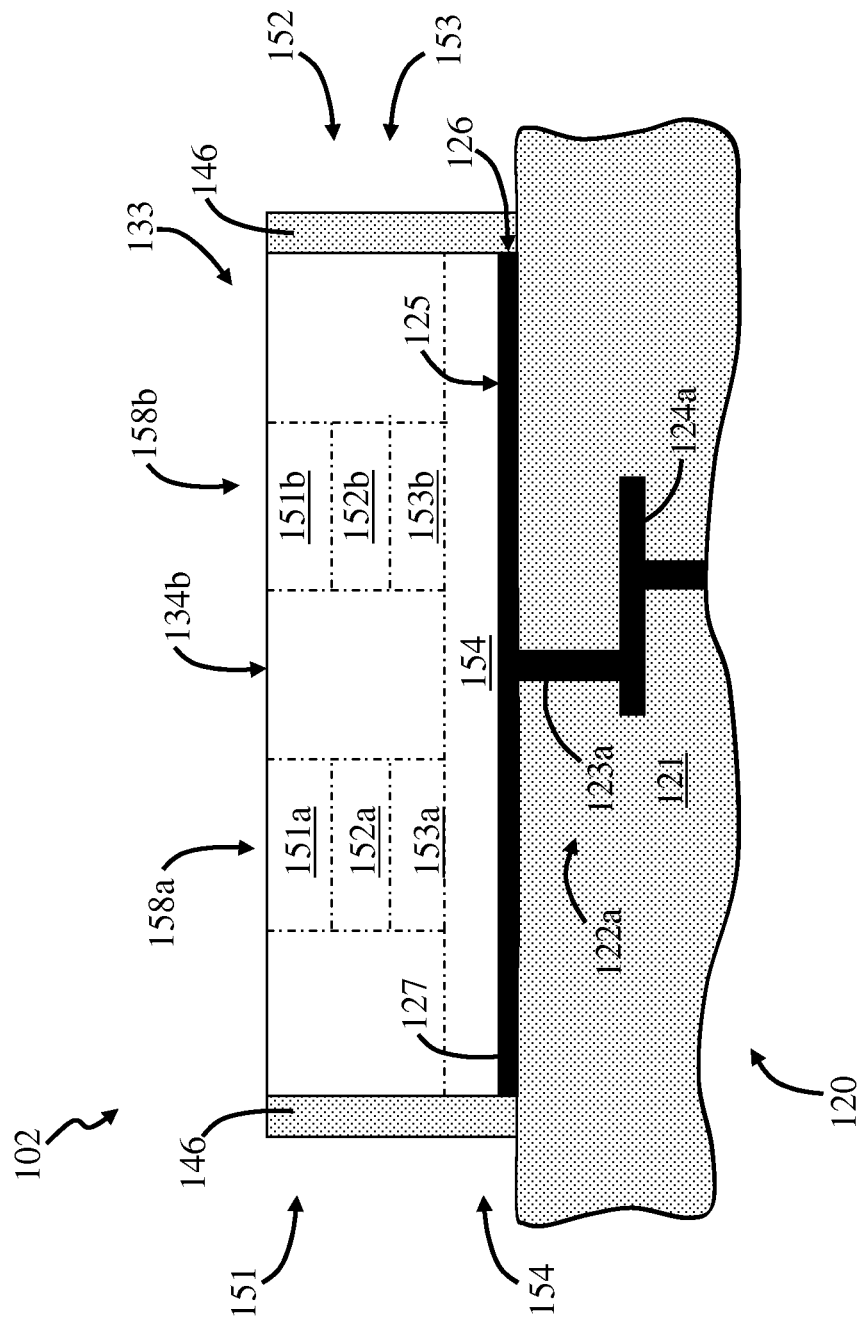

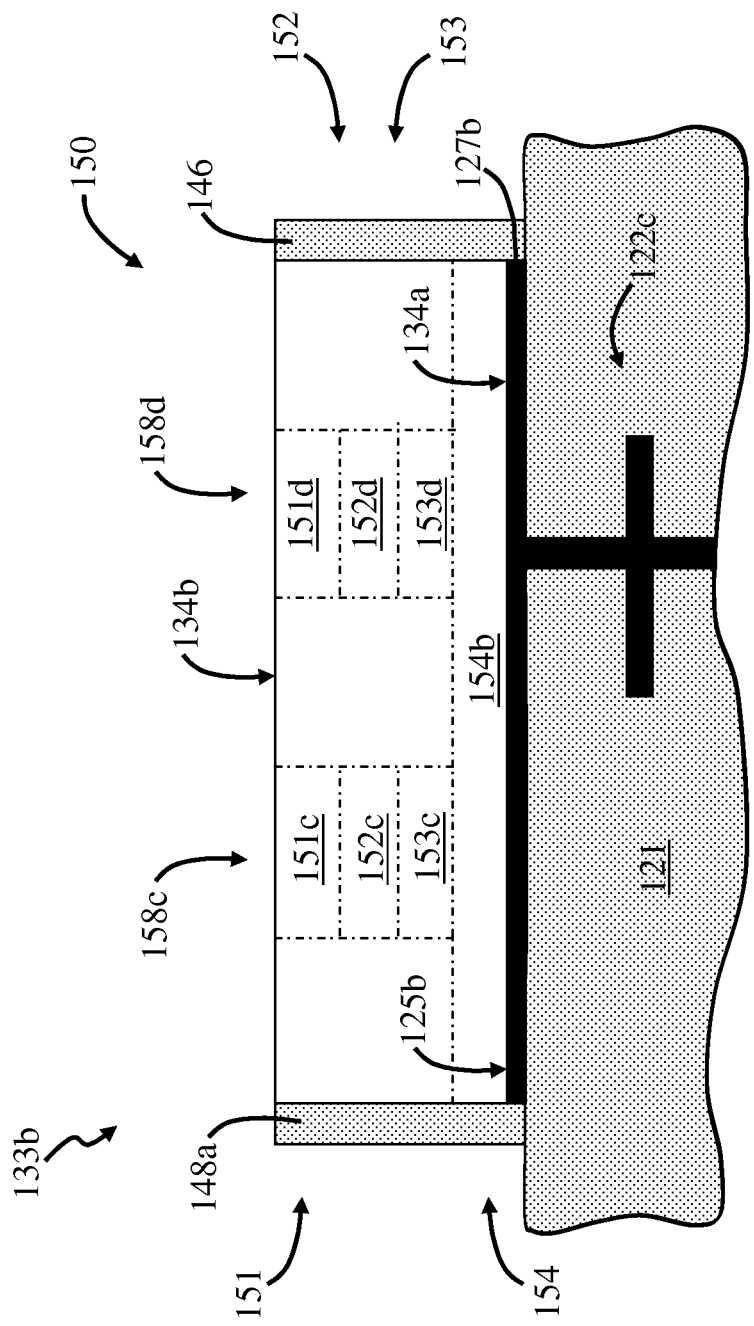

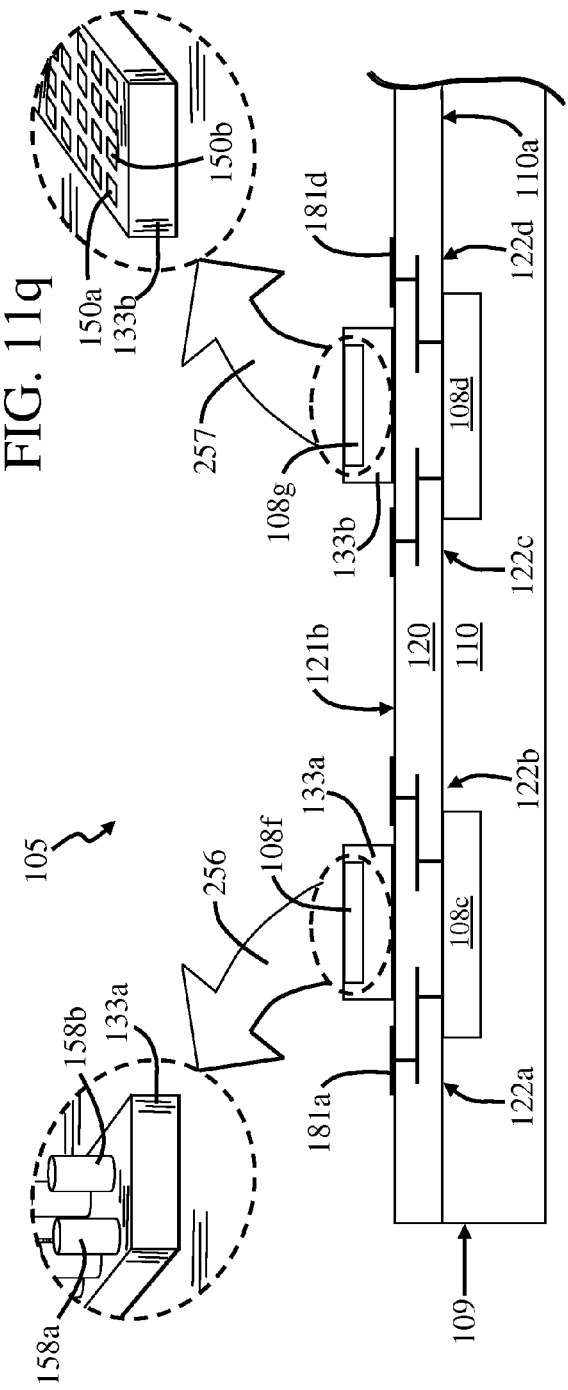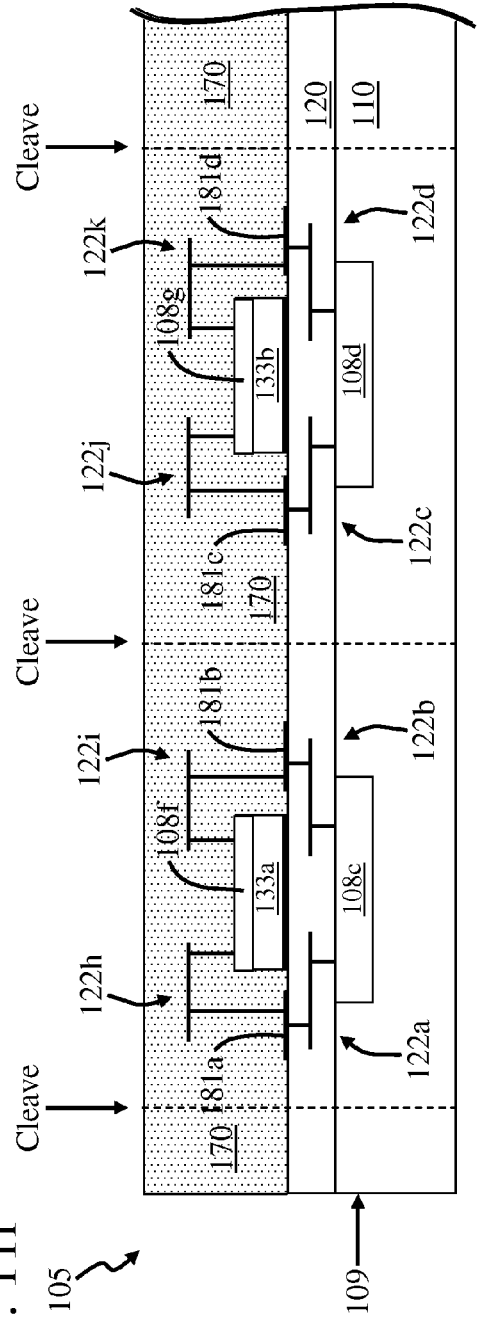

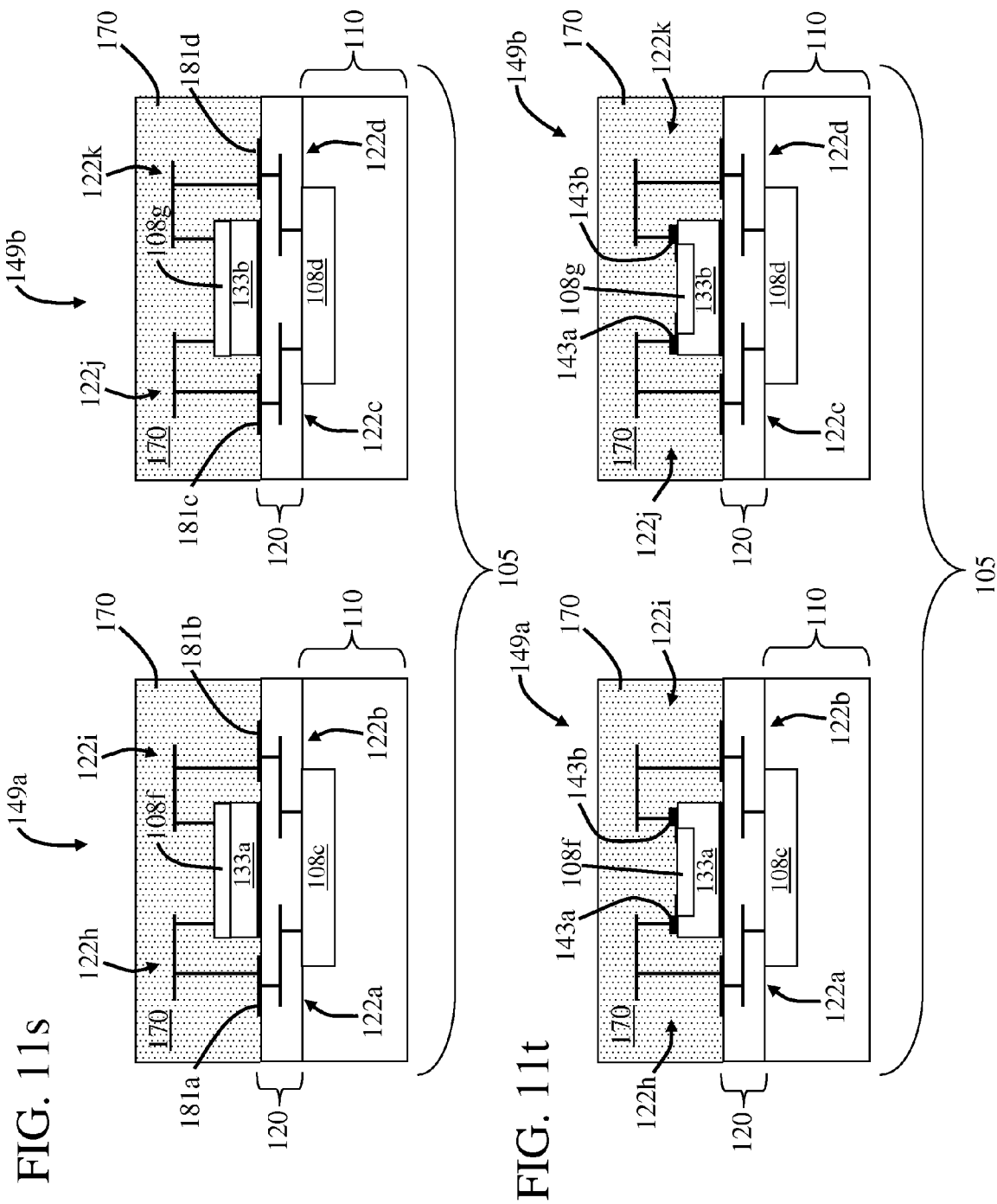

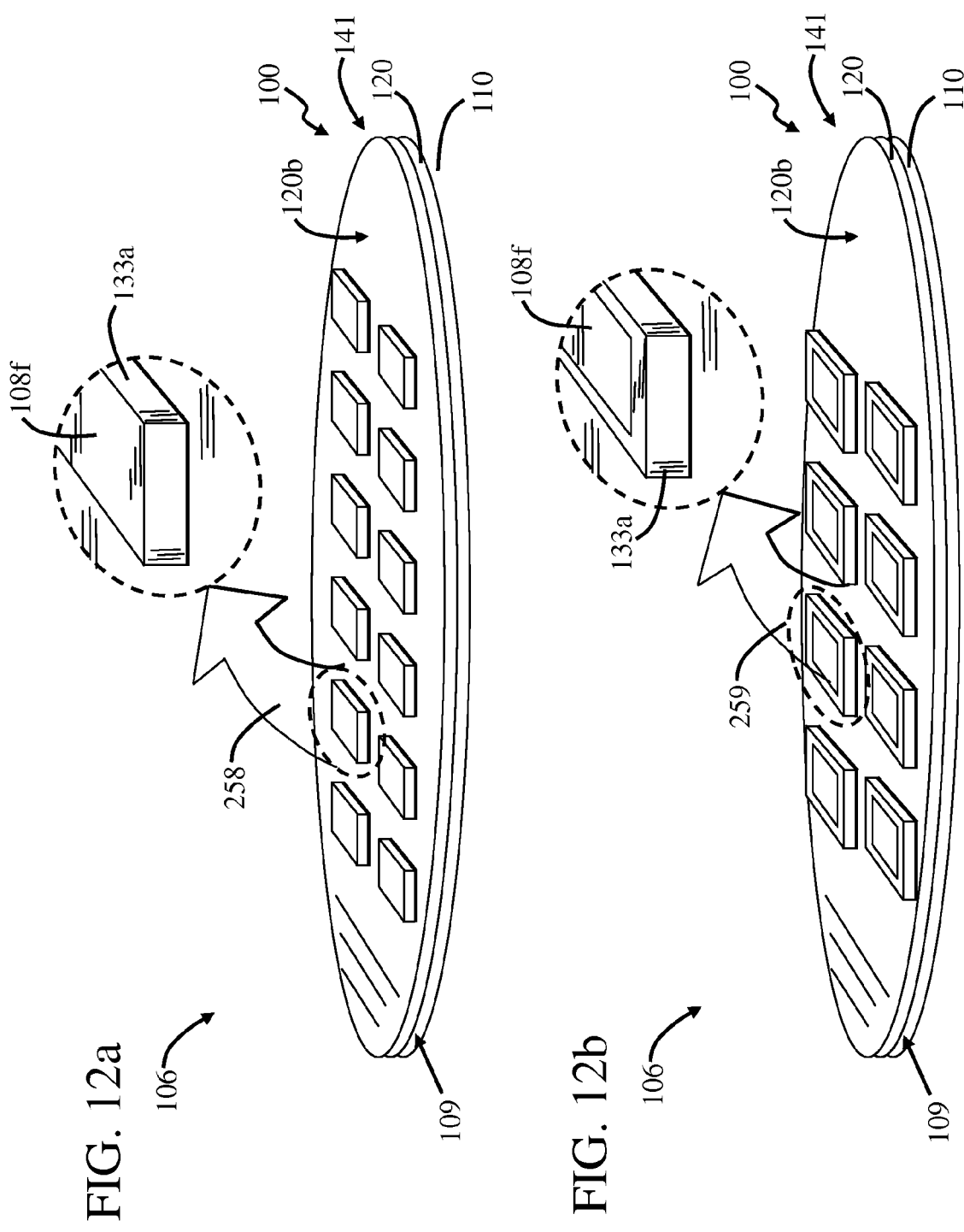

SEMICONDUCTOR CIRCUIT STRUCTURE AND METHOD OF FORMING THE SAME USING A CAPPING LAYER

CROSS-REFERENCE TO RELATED APPLICATIONS

This application claims priority to U.S. Provisional Application No. 61/346,847, filed on May 20, 2010 by the same inventor, the contents of which are incorporated by reference as though fully set forth herein.

BACKGROUND OF THE INVENTION

1. Field of the Invention

The present invention relates generally to a bonded semiconductor structure.

2. Description of the Related Art

During the fabrication of a semiconductor structure, semiconductor and metal material from a first portion of the semiconductor structure can undesirably contaminate a second portion of the semiconductor structure. For example, debris from the first portion of the semiconductor structure can undesirably flow to the second portion of the semiconductor structure during etching. The debris can be of many different types of material, such semiconductor, insulator and/or metal material. The debris can be of many different forms, such as particles.

It is desirable to reduce the amount of debris for many different reasons. For example, the debris can uncontrollably adjust the material quality of layers subsequently formed. Further, debris can uncontrollably adjust the electrical and/or optical properties of layers subsequently formed. Hence, it is desirable to reduce the amount of debris.

BRIEF SUMMARY OF THE INVENTION

The present disclosure is generally directed to a bonded semiconductor structure, and a method of forming the bonded semiconductor structure. The invention will be best understood from the following description when read in conjunction with the accompanying drawings.

BRIEF DESCRIPTION OF THE DRAWINGS

FIG. 1b is a perspective view of a substrate and grown semiconductor layer of the grown semiconductor structure of FIG. 1a.

FIG. 2b is a perspective view of a substrate and grown semiconductor layer of the bonded semiconductor structure of FIG. 2a.

FIGS. 9a-9i are views of steps of manufacturing another embodiment of a bonded semiconductor structure.

FIGS. 12a and 12b are perspective views of different embodiments of a bonded semiconductor structure which includes an electronic circuit carried by a material transfer region.

DETAILED DESCRIPTION OF THE INVENTION

Figure 1A:
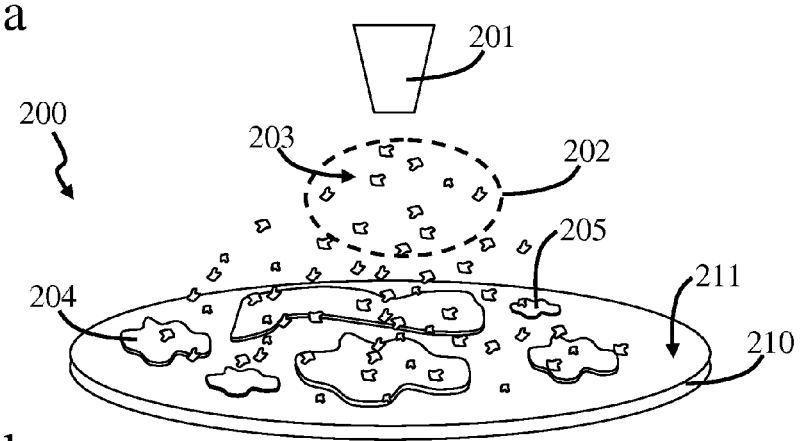
FIG. 1a is a perspective view of a partially fabricated grown semiconductor structure.

Information regarding how to make and use some of the embodiments of this disclosure can be found in several U.S. Patents and Patent Applications by the same inventor as this disclosure. For example, information can be found in U.S. patent application Ser. Nos.:

Ser. No. 11/092,498, filed on Mar. 29, 2005,
Ser. No. 11/092,499, filed on Mar. 29, 2005,
Ser. No. 11/092,500, filed on Mar. 29, 2005,
Ser. No. 11/092,501, filed on Mar. 29, 2005;
Ser. No. 11/092,521, filed on Mar. 29, 2005;
Ser. No. 11/180,286, filed on Jul. 12, 2005;
Ser. No. 11/378,059, filed on Mar. 17, 2006;
Ser. No. 11/606,523, filed on Nov. 30, 2006,
Ser. No. 11/873,719, filed on Oct. 17, 2007; and
Ser. No. 11/873,769, filed on Oct. 17, 2007;
Ser. No. 11/873,851, filed on Oct. 17, 2007,
the contents of all of which are incorporated by reference as though fully set forth herein.

Information regarding how to make and use some of the embodiments of this disclosure can be found in U.S. Pat. Nos. 7,052,941, 7,378,702, 7,470,142, 7,470,598, 7,632,738, 7,633,162, 7,671,371, and 7,718,508, the contents of all of which are incorporated by reference as though fully set forth herein. It should be noted that U.S. Pat. Nos. 7,052,941, 7,378,702, 7,470,142, 7,470,598, 7,632,738, 7,633,162, 7,671,371, and 7,718,508, are by the same inventor as this disclosure. It should also be noted that in the following figures, like reference characters indicate corresponding elements throughout the several views.

As mentioned above, during the fabrication of a semiconductor structure, semiconductor and metal material from a first portion of the semiconductor structure can undesirably flow to a second portion of the semiconductor structure. For example, during etching semiconductor and/or metal debris from the first portion of the semiconductor structure can flow to the second portion of the semiconductor structure. It is desirable to reduce the amount of debris which flows for many different reasons.

For example, the debris can uncontrollably adjust the material quality of layers subsequently formed. The debris can uncontrollably adjust the material quality of a layer by uncontrollably increasing the number of defects therein. Further, debris can uncontrollably adjust the electrical and/or optical properties of layers subsequently formed. Debris can uncontrollably adjust the electrical and/or optical properties of a layer by uncontrollably adjusting the type and/or amount of dopants therein. Hence, it is desirable to reduce the amount of debris.

The amount of debris can be reduced in many different ways. For example, the amount of debris can be reduced by forming a capping layer which restricts the flow of debris between the first and second portions of the semiconductor structure. In some embodiments, the semiconductor structure includes a conductive bonding layer, and the capping layer extends along an exposed portion of the conductive bonding layer to reduce the flow of debris from the conductive bonding layer to other portions of the semiconductor structure. In some embodiments, the semiconductor structure includes a bonding interface, and the capping layer extends along an exposed portion of the bonding interface to reduce the flow of material proximate to the bonding interface to other portions of the semiconductor structure.

FIG. 1a is a perspective view of a partially fabricated grown semiconductor structure 200. In this embodiment, grown semiconductor structure 200 includes a substrate 210. Substrate 210 can be of many different types, such as a semiconductor substrate. A gaseous semiconductor material 203 is provided from a growth material source 201 in a region 202 proximate to a substrate surface 211 of substrate 210. It should be noted that, in general, more than one material sources are used to provide growth material and process gases. However, one material source is shown in FIG. 1a for simplicity and ease of discussion.

The semiconductor material discussed herein can be of many different types, such as silicon, germanium, silicon-germanium, gallium arsenide, gallium nitride, as well as alloys thereof. Further, substrate 210 can include a single layer structure, such as a silicon layer. However, in other embodiments, substrate 210 can include a multiple layer structure, such as a silicon-on-sapphire (SOS) and silicon-on-insulator (SOI) layer structure.

Figure 1B:
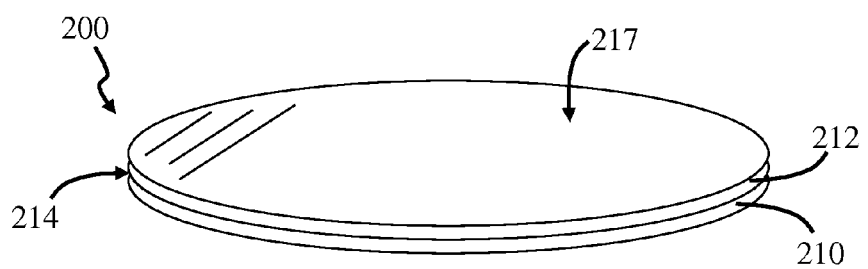
Figure 1C:
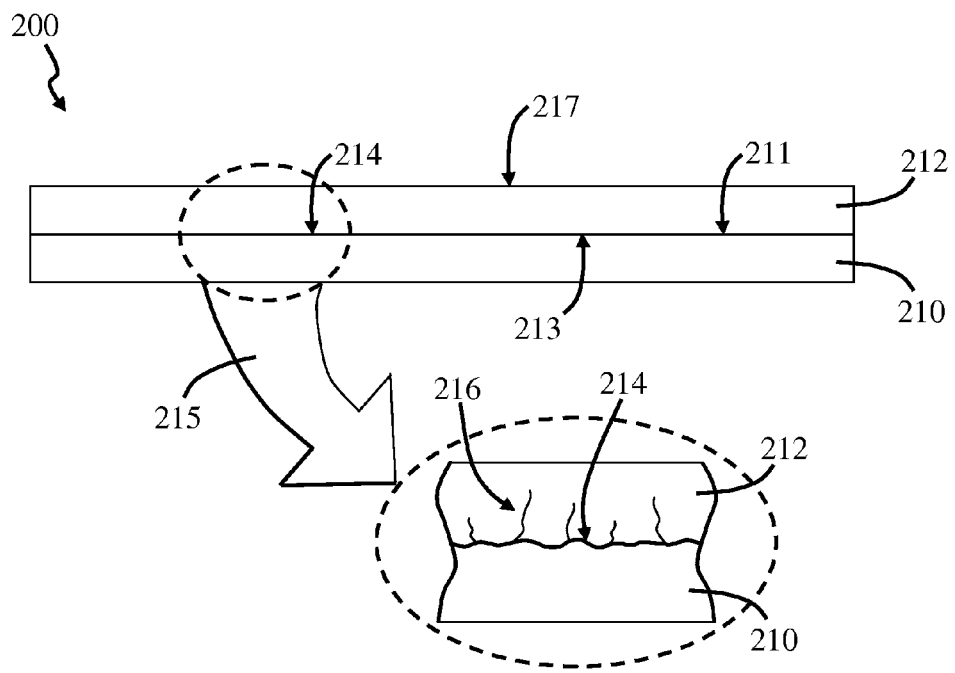
FIG. 1c is a side view of the grown semiconductor structure of FIG. 1b.

Portions of gaseous semiconductor material 203 engage surface 211 to form agglomerated semiconductor material 204 and 205. Portions of gaseous semiconductor material 203 engage surface 211 to form a grown semiconductor layer 212 on surface 211 of substrate 210, as shown in FIG. 1b, and a growth interface 214, as shown in FIG. 1c. FIG. 1b is a perspective view of substrate 210 and grown semiconductor layer 212, and FIG. 1c is a side view of grown semiconductor structure 200, as shown in FIG. 1b. Grown semiconductor layer 212 can be formed on substrate 210 in many different ways, such as by chemical vapor deposition, molecular beam epitaxy and sputtering, among others. It should be noted that, if desired, another semiconductor layer can be grown on a surface 217 of semiconductor layer 212 so that a stack of semiconductor regions is formed. More information regarding forming a stack of semiconductor regions is provided below with FIGS. 3a, 3b and 3c and FIGS. 4a, 4b and 4c.

As shown in FIG. 1c, a surface 213 of grown semiconductor layer 212 faces surface 211 of substrate 210, wherein surface 213 is opposed to surface 217. In particular, surface 213 is formed in response to the agglomeration of growth material on surface 211 so that a growth interface 214 is formed in response. Growth interface 214 is formed in response to gaseous semiconductor material 203 agglomerating on surface 211. In this example, growth interface 214 is formed in response to agglomerated semiconductor material 204 and 205 forming on surface 211, as shown in FIG. 1a. In this way, a grown semiconductor structure is fabricated using growth.

As indicated by an indication arrow 215, a growth defect 216 is formed in response to forming growth interface 214. Growth defect 216 can be of many different types, such as a dislocation. It should be noted that, in general, a number of growth defects 216 are formed in response to forming growth interface 214. The quality of growth interface 216 increases and decreases in response to decreasing and increasing, respectively, the number of growth defects 216.

Figure 2A:
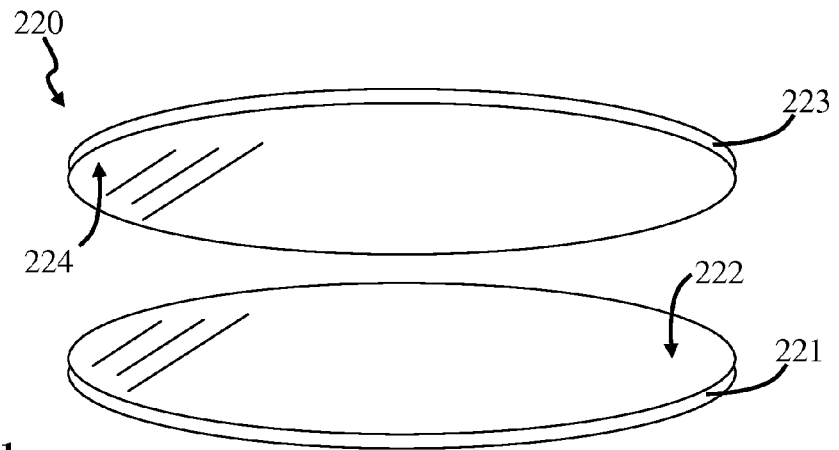
FIG. 2a is a perspective view of a partially fabricated bonded semiconductor structure.

FIG. 2a is a perspective view of a partially fabricated bonded semiconductor structure 220. Bonded semiconductor structure 220 includes substrates 221 and 223. Substrates 221 and 223 can be of many different types, such as semiconductor substrates. Substrates 221 and 223 can include many different layer structures. For example, in some embodiments, substrates 221 and 223 each include conductive bonding layers adjacent to surfaces 222 and 224 of substrates 221 and 223, respectively.

Figure 2B:
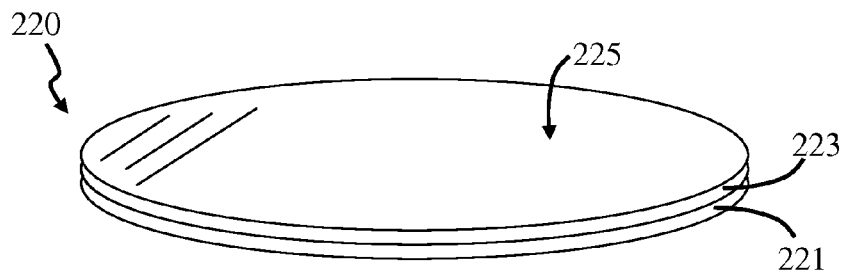
Figure 2C:
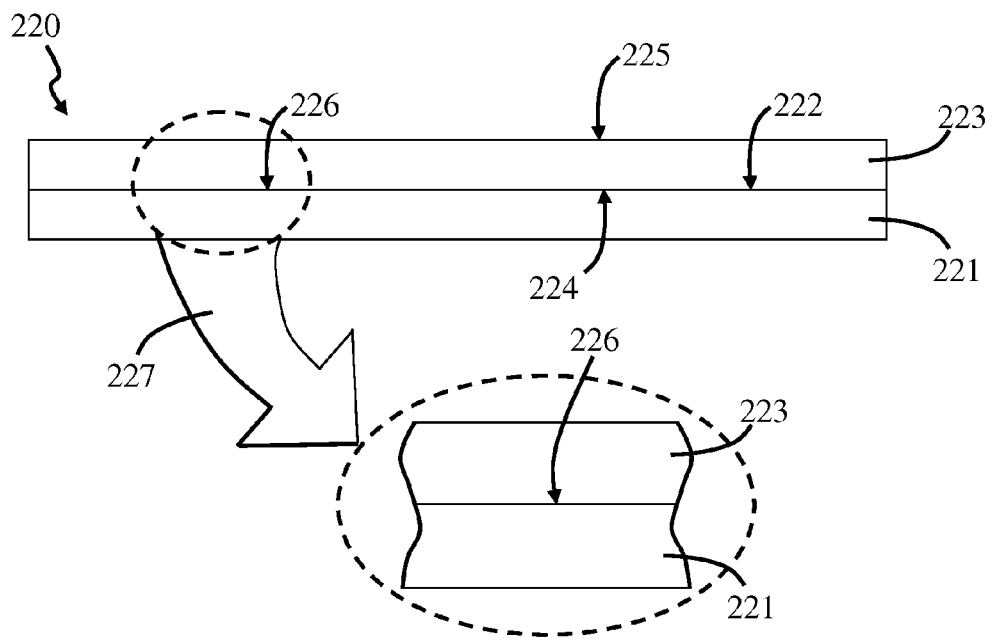
FIG. 2c is a side view of the bonded semiconductor structure of FIG. 2b.

As shown in FIGS. 2b and 2c, substrates 221 and 223 are moved towards each other so that a bonding interface 226 is formed in response. In particular, surfaces 222 and 224 of substrates 221 and 223, respectively, are moved towards each other so that a bonding interface 226 is formed in response to surfaces 222 and 224 being engaged. FIG. 2b is a perspective view of substrates 221 and 223 bonded to each other, and FIG. 2c is a side view of substrates 221 and 223 bonded to each other, as shown in FIG. 2b.

In FIG. 2c, surface 222 of substrate 221 faces surface 224 of substrate 223. In particular, surface 221 engages surface 224 so that bonding interface 226 is formed in response. It should be noted that bonding interface 226 is not formed in response to gaseous semiconductor material engaging surface 222. In particular, bonding interface 226 is not formed in response to the agglomerated semiconductor material on surface 222. In this way, a bonded semiconductor structure is fabricated using bonding. As indicated by an indication arrow 227, a growth defect is not formed in response to forming bonding interface 226. It should be noted that a signal experiences less attenuation in response to flowing through a bonding interface, and the signal experiences more attenuation in response to flowing through a growth interface. For example, a current signal experiences less attenuation in response to flowing through a bonding interface, and the current signal experiences more attenuation in response to flowing through a growth interface. Further, the noise of a signal increases more in response to flowing through a growth interface, and the noise of the signal increases less in response to flowing through a bonding interface.

It should also be noted that portions of the semiconductor structures discussed below are fabricated using growth, and other portions are fabricated using bonding. It should also be noted that, if desired, substrate 223 can include a stack of semiconductor regions. The stack of semiconductor regions of substrate 223 can be formed in many different ways, several of which will be discussed in more detail with FIGS. 3a, 3b and 3c and FIGS. 4a, 4b and 4c.

More information regarding bonding and growth interfaces can be found in related U.S. patent application Ser. No. 11/606,523, which is referenced above. Information regarding bonding and growth interfaces can also be found in U.S. Pat. Nos. 5,152,857, 5,695,557, 5,980,633 and 6,534,382.

A bonding interface is an interface that is formed in response to bonding material layers together. In one example of forming a bonding interface, first and second material layers are formed as separate layers, and moved towards each other so they engage each other and the bonding interface is formed in response. In this way, a bonding interface is established. It should be noted that heat is generally applied to the first and/or second material layers to facilitate the formation of the bonding interface. In a metal-to-metal bonding interface, the first and second material layers that are bonded together are conductive materials, such as metals. In a metal-to-dielectric bonding interface, one of the first and second material layers is a conductive material, and the other one is a dielectric material. In a metal-to-semiconductor bonding interface, one of the first and second material layers is a conductive material, and the other one is a semiconductor material.

A growth interface is an interface that is formed in response to growing a material layer on another material layer. In one example of forming a growth interface, a third material layer is formed, and a fourth material layer is grown on the third material layer so that the growth interface is formed in response. In this way, a growth interface is established. Hence, when forming a growth interface, third and fourth material layers are not formed as separate layers, and moved to engage each other.

In a metal-to-metal growth interface, the third and fourth material layers are conductive materials, such as metals. In a metal-to-dielectric growth interface, one of the third and fourth material layers is a conductive material, and the other one is a dielectric material. In a metal-to-semiconductor growth interface, one of the third and fourth material layers is a conductive material, and the other one is a semiconductor material. In a dielectric-to-dielectric growth interface the third and fourth materials are dielectric materials.

It should be noted that, in general, it is difficult to establish a metal-to-semiconductor growth interface, wherein the semiconductor material is grown on the metal layer. Further, it is difficult to grow a crystalline semiconductor material layer on a metal layer using semiconductor growth techniques, such as chemical vapor deposition. In most instances, the metal layer is formed on the semiconductor material. It is difficult to grow semiconductor material on a metal layer because metal layers do not operate as a very good seed layer for the semiconductor material. Hence, a significant amount of the semiconductor material will not agglomerate on the metal layer.

It is difficult to grow crystalline semiconductor material on the metal layer because metal layers tend to not be crystalline, and semiconductor material tends to have the crystal structure of the material it is formed on. Hence, if a semiconductor material is formed on a metal layer that includes non-crystalline conductive material, then the semiconductor material will also have a non-crystalline crystal structure and poor material quality. Thus, it is useful to bond crystalline semiconductor material to a metal layer to form a metal-to-semiconductor bonding interface.

In general, bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects proximate to the interface. Information regarding TEM can be found in U.S. Pat. Nos. 5,892,225, 6,531,697, 6,822,233 and 7,002,152.

Figure 3A:
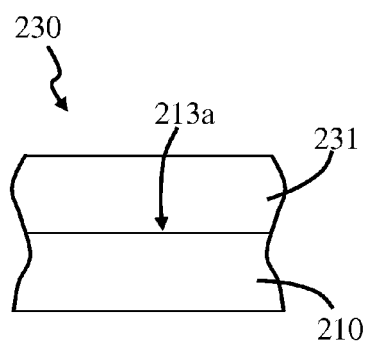
FIGS. 3a, 3b and 3c are side views of steps of fabricating a semiconductor structure, wherein the semiconductor structure includes a stack of device structure layers formed using growth.
Figure 3B:
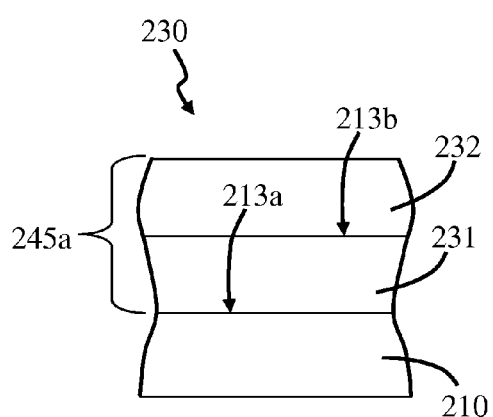
Figure 3C:
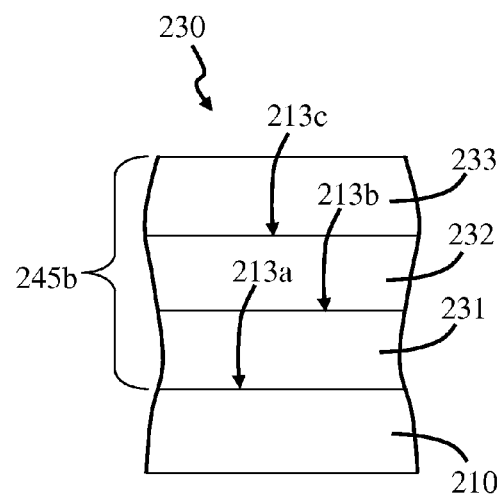

FIGS. 3a, 3b and 3c are side views of steps of fabricating a semiconductor structure 230, wherein structure 230 includes a stack of semiconductor regions formed using growth. It should be noted that, in this example, the stack of semiconductor regions generally includes two or more semiconductor layers. In this example, a semiconductor layer 231 is grown on substrate 210 so that a growth interface 213a is formed therebetween, as shown in FIG. 3a. A semiconductor layer 232 is grown on semiconductor layer 231 so that a growth interface 213b is formed therebetween, as shown in FIG. 3b. In FIG. 3b, a stack 245a includes semiconductor layers 231 and 232, and growth interfaces 213a and 213b. A semiconductor layer 233 is grown on semiconductor layer 232 so that a growth interface 213c is formed therebetween, as shown in FIG. 3c. In FIG. 3c, a stack 245b includes semiconductor layers 231, 232 and 233, and growth interfaces 213a, 213b and 213c. In this way, a stack of semiconductor regions is fabricated using growth. It should be noted that semiconductor layers 231, 232 and 233 can have many different doping types, several of which are discussed in more detail below.

Figure 4A:
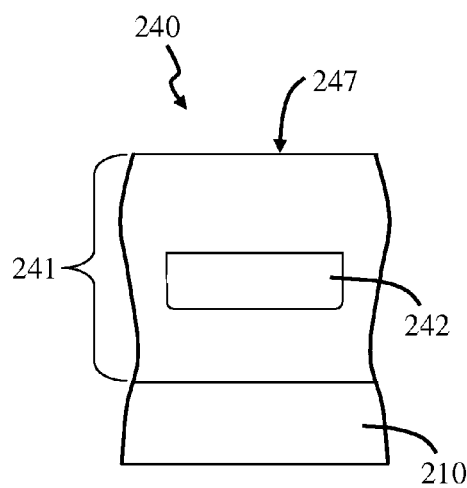
FIGS. 4a, 4b and 4c are side views of steps of fabricating a semiconductor structure, wherein the semiconductor structure includes a stack of device structure layers formed using ion implantation.
Figure 4B:
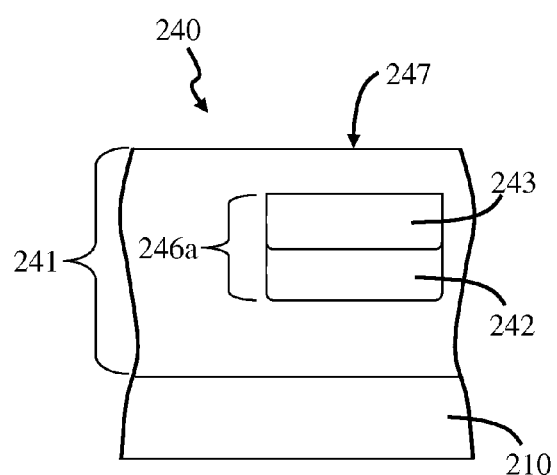
Figure 4C:
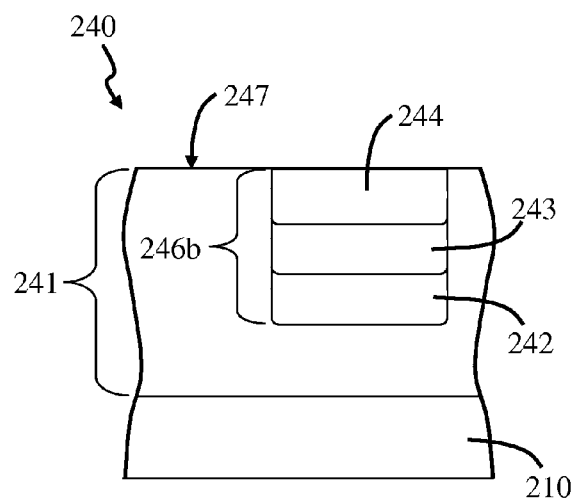

FIGS. 4a, 4b and 4c are side views of steps of fabricating a semiconductor structure 240, wherein structure 240 includes a stack of semiconductor regions formed using ion implantation. It should be noted that, in this example, the stack of semiconductor regions generally includes two or more semiconductor regions formed by ion implantation, wherein the ion implanted semiconductor regions are formed in a semiconductor layer.

In this example, a semiconductor layer 241 is grown on substrate 210, wherein semiconductor layer 241 has a surface 247 positioned away from substrate 210. Implanted regions 242 and 243 are formed in semiconductor layer 241, as shown in FIGS. 4a and 4b. Implanted region 242 is formed in response to introducing a first dopant into semiconductor layer 241 through surface 247. Further, implanted region 243 is formed in response to introducing a second dopant into semiconductor layer 241 through surface 247. In this example, implanted region 242 is positioned between substrate 210 and implanted region 243. Further, implanted region 243 is positioned between surface 247 and implanted region 242. In FIG. 4b, a stack 246a includes semiconductor regions 242 and 243.

An implanted region 244 is formed in semiconductor layer 241, as shown in FIG. 4c. Implanted region 244 is formed in response to introducing a third dopant into semiconductor layer 241 through surface 247. In this example, implanted region 244 is positioned between substrate 210 and implanted regions 242 and 243. Further, implanted region 244 is positioned between surface 247 and implanted regions 242 and 243. In FIG. 4c, a stack 246b includes semiconductor regions 242, 243 and 244. In this way, a stack of semiconductor regions is fabricated using ion implantation. It should be noted that semiconductor regions 242, 243 and 244 can have many different doping types, several of which are discussed in more detail below. It should also be noted that a stack of semiconductor regions can be fabricated using one or more of the growth and implantation steps discussed above. For example, a semiconductor layer with a first conductivity type can be grown and implanted with an implant species to form a semiconductor region with a second conductivity type, wherein the semiconductor layer includes the semiconductor region with the second conductivity type.

Figure 5A:
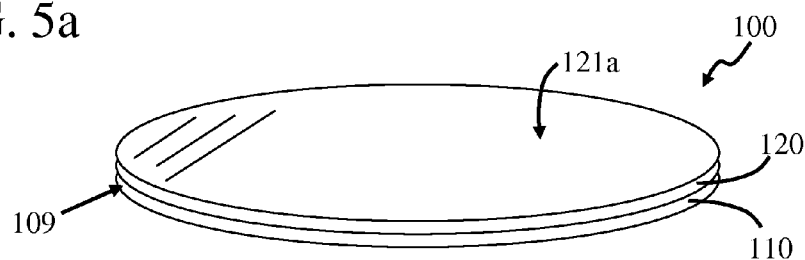
FIGS. 5a-5l are views of steps of manufacturing one embodiment of a bonded semiconductor structure.
Figure 5B:
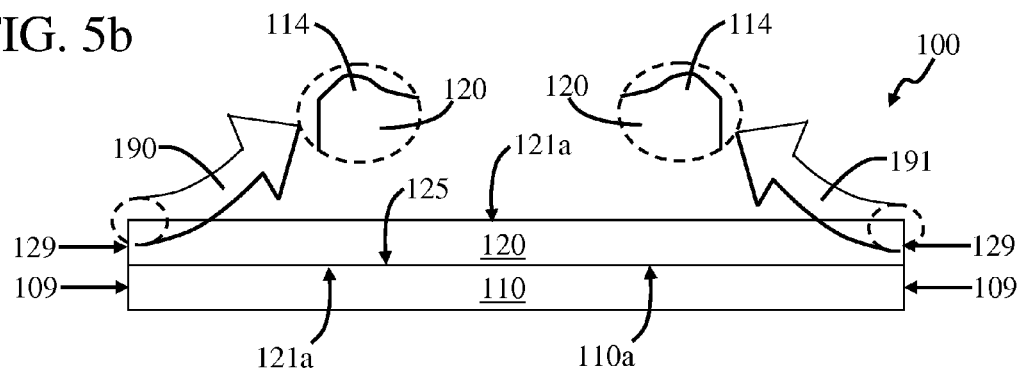

FIGS. 5a-5l are views of steps of manufacturing a bonded semiconductor structure 100. More information regarding manufacturing a bonded semiconductor structure can be found in the above-identified U.S. Patent and Patent Applications, which are incorporated herein by reference. FIGS. 5a and 5b are perspective and side views, respectively, of partially fabricated bonded semiconductor structure 100. In this embodiment, bonded semiconductor structure 100 includes a support substrate 110 which carries an interconnect region 120. Support substrate 110 is bounded by an outer sidewall 109 which extends around its outer periphery. Further, interconnect region 120 is bounded by an outer sidewall 129 which extends around its outer periphery.

Support substrate 110 can be of many different types, such as a semiconductor wafer which carries an electronic circuit. The electronic circuit can be of many different types, such as a complementary metal oxide semiconductor (CMOS) circuit. A CMOS circuit includes PMOS and NMOS devices in communication with each other in a well-known manner. The PMOS and NMOS devices are in communication with each other when a signal is capable of flowing between them. More information regarding the electronic circuit carried by support substrate 110 can be found in the above-identified U.S. Patent and Patent Applications, which are incorporated herein by reference. The electronic circuit carried by support substrate 110 can operate in many different ways. For example, the electronic circuit can operate as a processor and controller. More information regarding the operation of processors and controllers can be found in the above-identified U.S. Patent and Patent Applications, which are incorporated herein by reference.

As will be discussed in more detail below, interconnect region 120 includes a conductive line which extends through a dielectric material region. It should be noted that the conductive line is typically in communication with the electronic circuit carried by support substrate 110. The conductive line is in communication with the electronic circuit carried by support substrate 110 when a signal is capable of flowing therebetween. In some embodiments, the conductive line is in communication with the electronic circuit carried by support substrate 110 because the conductive line is connected to the electronic circuit carried by support substrate 110. The conductive line is connected to the electronic circuit carried by support substrate 110 when it is engaged with the electronic circuit. The dielectric material of interconnect region 120 can be of many different types, such as silicon dioxide and silicon nitride, among others. The dielectric material generally has a non-crystalline atomic structure. For example, the dielectric material can have a polycrystalline and amorphous atomic structure. The dielectric material operates as a polarizable insulator, wherein the flow of a current therethrough is restricted. In some embodiments, the dielectric material of interconnect region 120 has a polarizability that is larger than the polarizability of the semiconductor material of support substrate 110. The dielectric material of interconnect region 120 has a larger polarizability than the semiconductor material of support substrate 110 because it has a larger permittivity.

In this embodiment, interconnect region 120 is formed on a support substrate surface 110a (FIG. 5b), wherein interconnect region 120 includes a surface 120a, which faces support substrate 110, and a surface 120b, which faces away from support substrate 110. In this embodiment, interconnect region 120 is formed using conventional processing techniques, such as photolithography, deposition and etching.

Figure 5C:
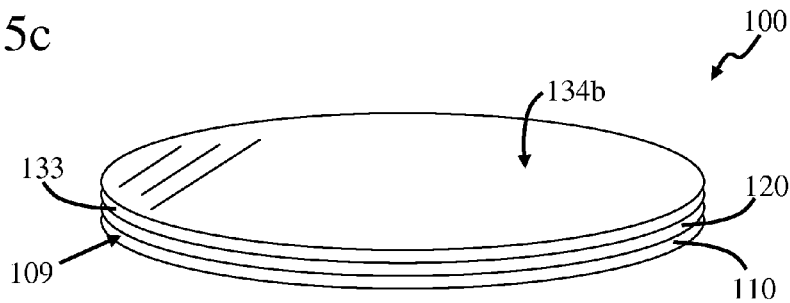
Figure 5D:
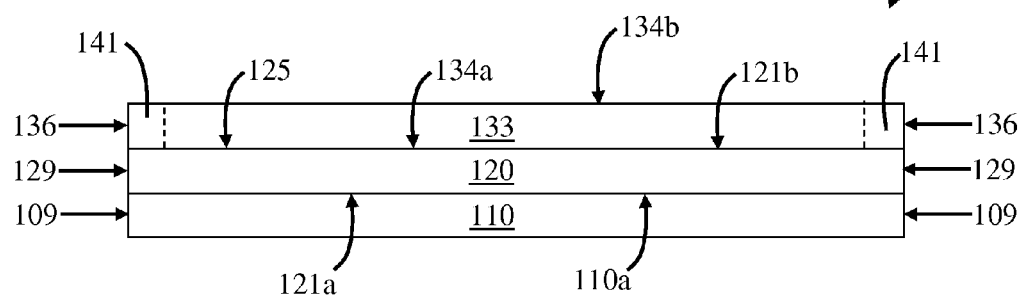

In FIGS. 5c and 5d, a material transfer region 133 is coupled to interconnect region 120 so it is carried by support substrate 110. In this embodiment, material transfer region 133 is positioned so interconnect region 120 extends between support substrate 110 and material transfer region 133. Material transfer region 133 is bounded by an outer sidewall 136 which extends around its outer periphery.

Material transfer region 133 can be coupled to interconnect region 120 in many different ways. In this embodiment, material transfer region 133 is coupled to interconnect region 120 through bonding. Material transfer region 133 is coupled to interconnect region 120 through bonding by forming a bonding interface 125 therebetween. In this way, semiconductor structure 100 is a bonded semiconductor structure. In this embodiment, bonding interface 125 is formed between dielectric material region surface 121a and a material transfer region surface 134a of material transfer region 133. Material transfer region surface 134a faces support substrate 110 and interconnect region 120. Bonding interface 125 can be of many different types, such as those mentioned above. It should be noted that bonding interface 125 is not a growth interface. More information regarding material transfer region 133 and bonding can be found in the above-identified U.S. Patent and Patent Applications, which are incorporated herein by reference.

Material transfer region 133 can include many different types of material. In some embodiments, material transfer region 133 includes a dielectric material. In one embodiment, material transfer region 133 consists of dielectric material. In another embodiment, material transfer region 133 consists essentially of dielectric material. The dielectric material of material transfer region 133 can be used to form a bonded capacitor, if desired.

The dielectric material of material transfer region 133 can be of many different types, such as silicon dioxide and silicon nitride, among others. In some embodiments, the dielectric material of interconnect region 110 is the same as the dielectric material of material transfer region 133.

In another embodiment, material transfer region 133 includes a semiconductor material. In one embodiment, material transfer region 133 consists of semiconductor material. In another embodiment, material transfer region 133 consists essentially of semiconductor material. It should be noted that, in some embodiments, material transfer region 133 includes a single layer of semiconductor material and, in other embodiments, material transfer region 133 includes a stack of semiconductor layers. In this way, material transfer region 133 includes one or more layers of semiconductor material. Layers and stacks of semiconductor material are discussed in more detail with FIGS. 3a-3c and 4a-4c.

The semiconductor material can be of many different types, such as silicon, gallium arsenide and gallium nitride, as well as alloys thereof. A semiconductor material operates as a semiconductor, wherein the conductivity of the semiconductor material is adjustable in response to adjusting the type and amount of impurities therein. The type and amount of impurities of the semiconductor material determine the type of charges that are conducted through it. For example, in some situations, the semiconductor material includes impurities which allow negative charges to flow therethrough (i.e. n-type semiconductor material), and, in other situations, the semiconductor material includes impurities which allow positive charges to flow therethrough (i.e. p-type semiconductor material). The atomic structure of the semiconductor material can be of many different types, such as crystalline, polycrystalline and amorphous.

Figure 5E:
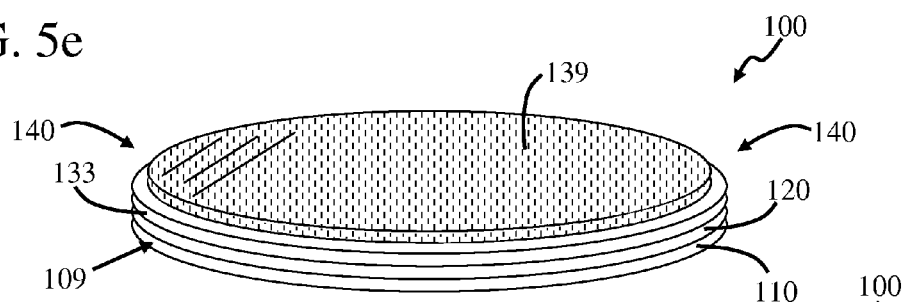
Figure 5F:
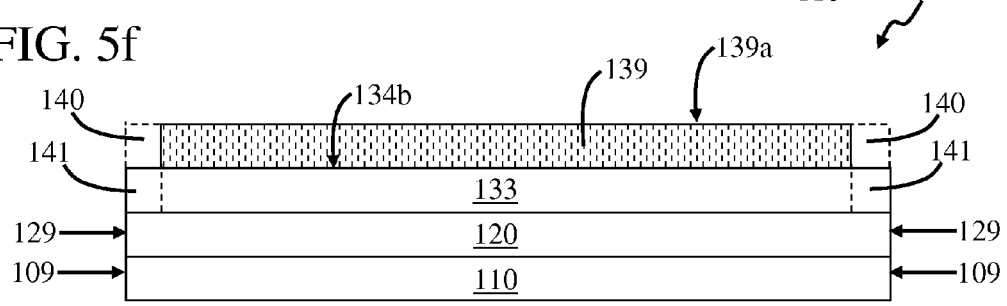

In FIGS. 5e and 5f, a mask region 139 is positioned on material transfer region 133 so it is carried by support substrate 110. Mask region 139 can be positioned on material transfer region 133 in many different ways. In this embodiment, mask region 139 is deposited on material transfer region 133 so that mask region 139 covers material transfer region 133. In this embodiment, mask region 139 is deposited on material transfer region 133 so that material transfer region 133 extends between mask region 139 and bonding interface 125.

In FIGS. 5e and 5f, mask region 139 is processed to remove a portion 140 of it proximate to outer sidewall 129. Portion 140 extends annularly around the outer periphery of mask region 139 proximate to outer sidewall 129. Portion 140 can be removed in many different ways, such as by etching. The etching can be of many different types, such as wet and/or dry etching. In some embodiments, a mask is positioned on a surface 139a of mask region 139, wherein the mask covers some portions of mask region 139 and does not cover other portions of mask region 139. In these embodiments, portion 140 corresponds to the portions of mask region 139 that are not covered by the mask. In this way, portion 140 is etched utilizing a mask.

In one embodiment, mask region 139 includes a photoresist material which is positioned on material transfer region 133 using conventional photoresist deposition techniques, such as spin-on-coating. In these embodiments, portion 140 is removed from material transfer region 133 using conventional photoresist development techniques.

Figure 5G:
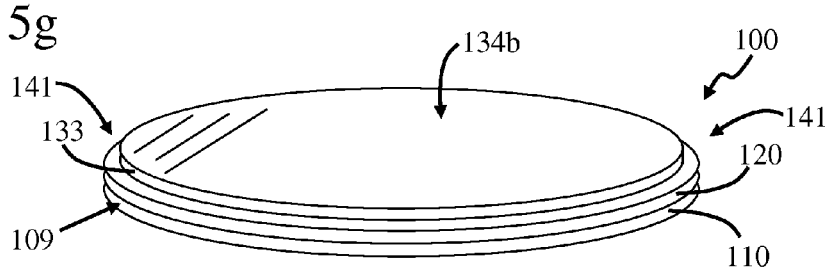
Figure 5H:
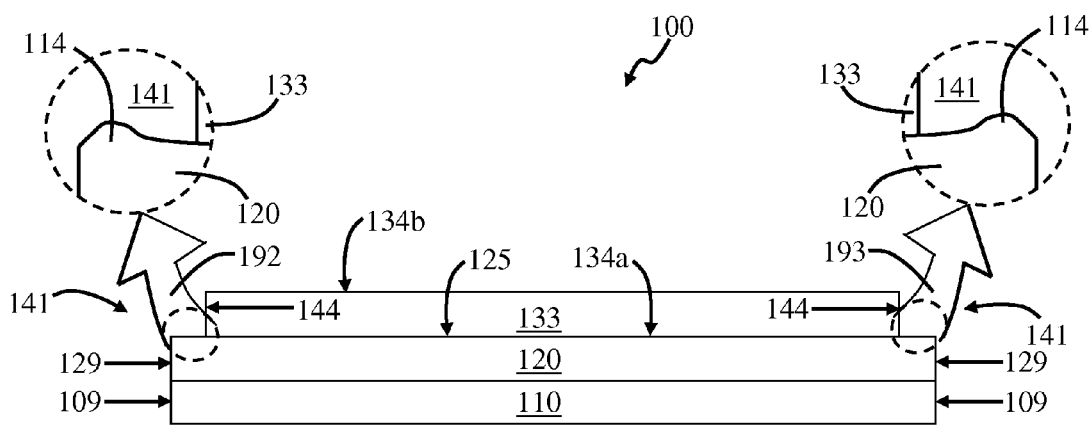

In the embodiment of FIG. 5f, material transfer region 133 is processed to remove a portion 141 (FIGS. 5d and 5f) of material transfer region 133, and mask region 139 is processed to remove it from surface 134b, as shown in FIGS. 5g and 5h. In this embodiment, portion 141 is proximate to outer sidewall 129 and is removed so that a lip 114 is exposed, as indicated by indication arrows 192 and 193. Portion 141 extends annularly around the outer periphery of mask region 139 proximate to outer sidewall 129. It should be noted that a portion of bonding interface 125 is exposed in response to removing portion 141 from material transfer region 133. Portion 141 can be removed in many different ways, such as by etching. The etching can be of many different types, such as wet and/or dry etching. An etched sidewall 144 is formed in response to removing portion 141. In this embodiment, mask region 139 is removed from material transfer region 133 to expose material transfer region surface 134b.

The stress of material transfer region 133 is adjusted in response to removing portion 141 of material transfer region 133 proximate to outer sidewall 129 to expose lip 114. In particular, the stress of material transfer region 133 is reduced in response to removing portion 141 of material transfer region 133 proximate to outer sidewall 129 to expose lip 114. The stress of material transfer region 133 is reduced because material transfer region 133 experiences less bowing in response to removing portion 141 proximate to outer sidewall 129. Material transfer region 133 experiences more bowing when portion 141 is not removed because lip 114 pushes upwardly on material transfer region 133.

Figure 5I:
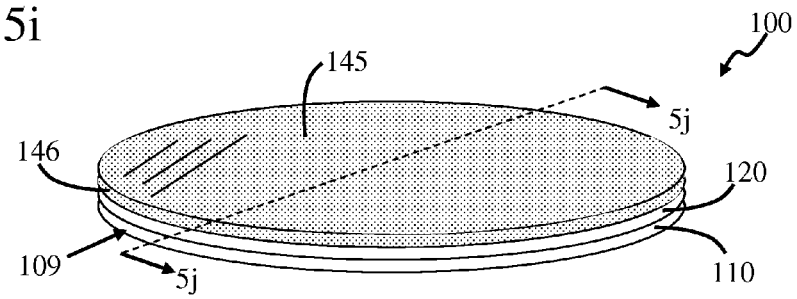
Figure 5J:
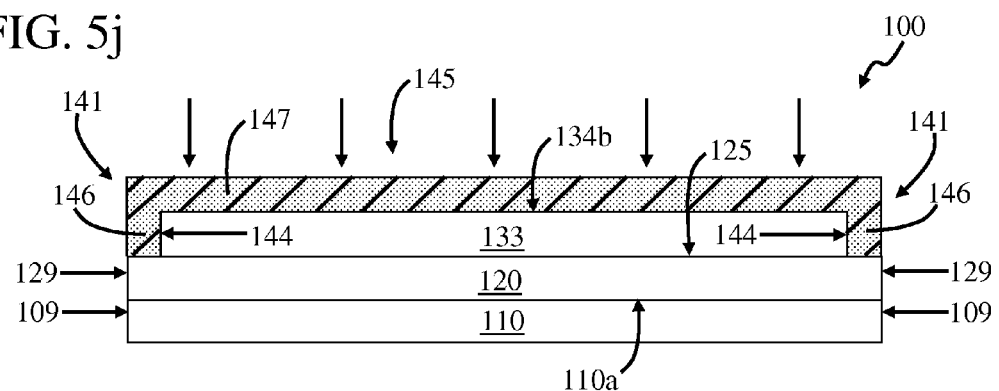

FIG. 5i is a perspective view of bonded semiconductor structure 100 of FIGS. 5g and 5h with a capping layer 145 positioned on material transfer region so it is carried by support substrate 110. FIG. 5j is a cut-away side view of bonded semiconductor structure 100 of FIG. 5i taken along a cut-line 5j-5j of FIG. 5i. Capping layer 145 includes a portion 147 which extends along surface 134b so it covers material transfer region 133. Portion 147 covers surface 134b to restrict the flow of heat between outer surface 134b and bonding interface 125.

Capping layer 145 can include many different types of material. In this embodiment, capping layer 145 includes dielectric material. In some embodiments, capping layer 145 consists of dielectric material. In some embodiments, capping layer 145 consists essentially of dielectric material. The dielectric material of capping layer 145 can be of many different types, such as silicon dioxide and silicon nitride, among others. In some embodiments, the dielectric material of capping layer 145 is the same as the dielectric material of interconnect region and, in other embodiments, the dielectric material of capping layer 145 is different from the dielectric material of interconnect region 110. In one particular embodiment, the dielectric materials of interconnect region 110 and capping layer 145 include silicon dioxide. In another particular embodiment, the dielectric materials of interconnect region 110 and capping layer 145 include silicon dioxide and silicon nitride, respectively.

Capping layer 145 includes a portion 146 which extends between portion 147 and interconnect region 120. In particular, portion 146 extends between portion 147 and lip 114. Portion 146 covers lip 114 and the exposed portion of bonding interface 125. Portion 146 extends along sidewall 144 and covers the exposed portion of bonding interface 125 to restrict the flow of heat between outer sidewall 129 and bonding interface 125. Portion 146 covers the exposed portion of bonding interface 125 to restrict the flow of heat between surface 134b and bonding interface 125.

Figure 5K:
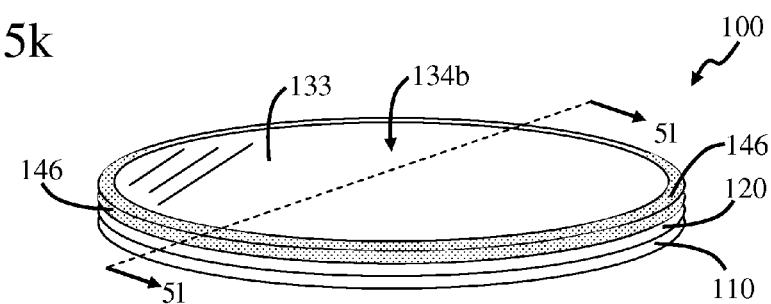
Figure 5L:
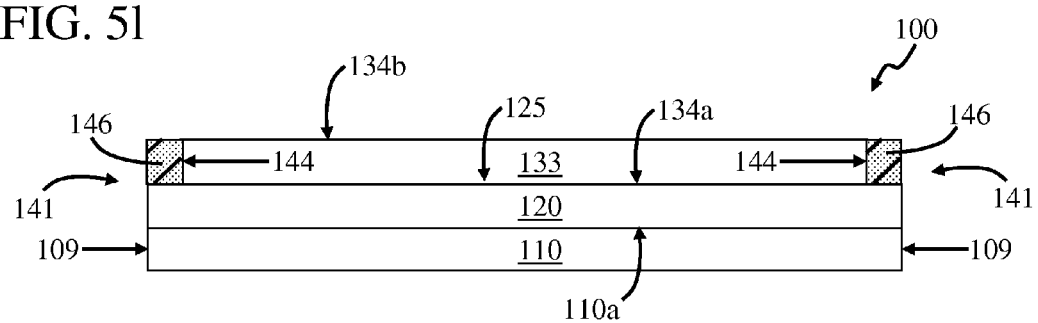

In FIGS. 5k and 5l, portion 147 of capping layer 145 is removed so that surface 134b of material transfer region is exposed. Portion 147 of capping layer 145 is removed so that portion 146 extends annularly around material transfer region 133, as shown in FIG. 5k, and covers lip 114. Portion 146 covers lip 114 and the exposed portion of bonding interface 125, and extends along sidewall 144. Portion 146 covers the exposed portion of bonding interface 125 to restrict the flow of debris between outer sidewall 129 and bonding interface 125. Portion 146 covers the exposed portion of bonding interface 125 to restrict the flow of debris between surface 134b and bonding interface 125.

Figure 6A:
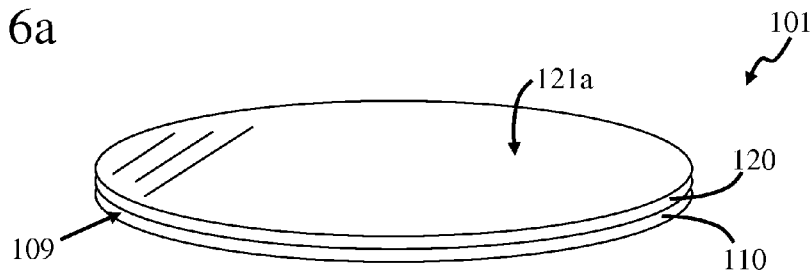
FIGS. 6a-6l are views of steps of manufacturing another embodiment of a bonded semiconductor structure.
Figure 6B:
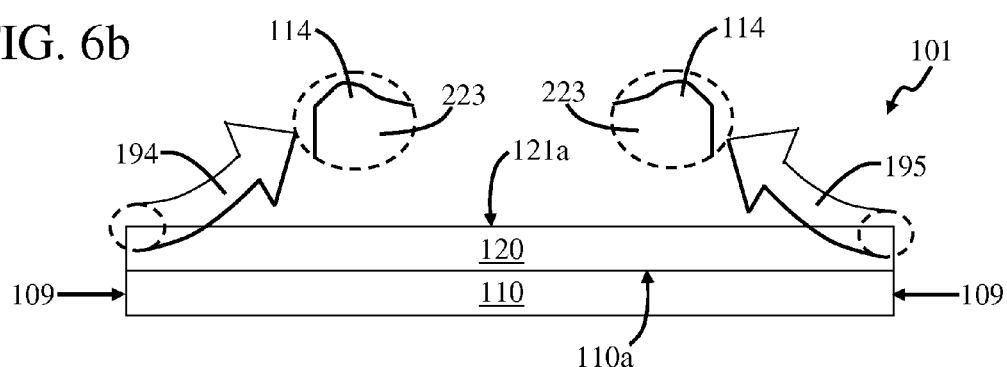

FIGS. 6a-6l are views of steps of manufacturing a bonded semiconductor structure 101. More information regarding manufacturing a bonded semiconductor structure can be found in the above-identified U.S. Patent and Patent Applications, which are incorporated herein by reference. FIGS. 6a and 6b are perspective and side views, respectively, of partially fabricated bonded semiconductor structure 101. In this embodiment, bonded semiconductor structure 101 includes support substrate 110 which carries interconnect region 120. Support substrate 110 is bounded by outer sidewall 109 which extends around its outer periphery. Support substrate 110 can be of many different types, such as a semiconductor wafer which carries an electronic circuit. The electronic circuit can be of many different types, such as a complementary metal oxide semiconductor (CMOS) circuit. A CMOS circuit includes PMOS and NMOS devices in communication with each other in a well-known manner. The PMOS and NMOS devices are in communication with each other when a signal is capable of flowing between them. More information regarding the electronic circuit carried by support substrate 110 can be found in the above-identified U.S. Patent and Patent Applications, which are incorporated herein by reference. The electronic circuit carried by support substrate 110 can operate in many different ways. For example, the electronic circuit can operate as a processor and controller. More information regarding the operation of processors and controllers can be found in the above-identified U.S. Patent and Patent Applications, which are incorporated herein by reference.

As mentioned above, interconnect region 120 includes a conductive line which extends through a dielectric material region. It should be noted that the conductive line is typically in communication with the electronic circuit carried by support substrate 110. In this embodiment, interconnect region 120 is formed on support substrate surface 110a (FIG. 6b), wherein interconnect region 120 includes surface 120a, which faces support substrate 110, and surface 120b, which faces away from support substrate 101. In this embodiment, interconnect region 120 is formed using conventional processing techniques, such as photolithography, deposition and etching.

Figure 6C:
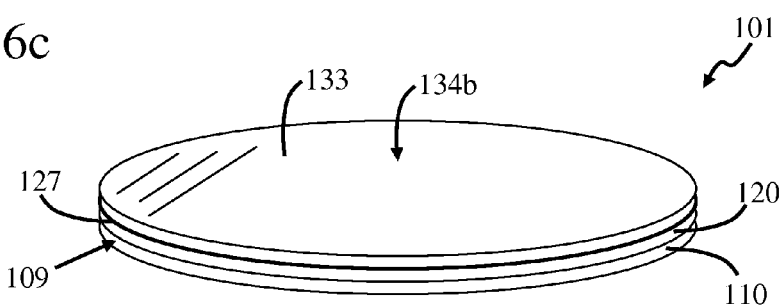
Figure 6D:
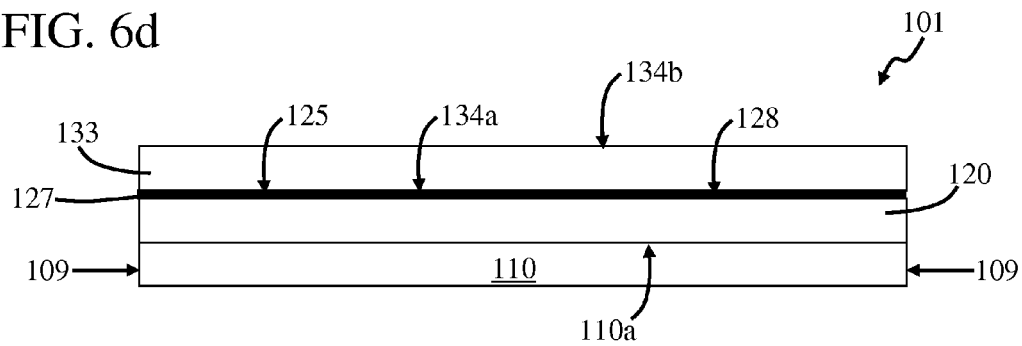

In FIGS. 6c and 6d, material transfer region 133 is coupled to interconnect region 120 so it is carried by support substrate 110. Material transfer region 133 can be coupled to interconnect region 120 in many different ways. In this embodiment, material transfer region 133 is coupled to interconnect region 120 through a conductive bonding layer 127. In this way, semiconductor structure 101 is a bonded semiconductor structure.

Bonding interface 125 is established in response to coupling material transfer region 133 to interconnect region 120 through conductive bonding layer 127. Bonding interface 125 can be established by conductive bonding layer 127 in many different ways. In one embodiment, conductive bonding layer 127 includes a metal and material transfer region 133 includes a dielectric material, and bonding interface 125 is established in response to bonding the metal of conductive bonding layer 127 and the dielectric material of material transfer region 133 together to form a metal-to-dielectric bonding interface. In another embodiment, conductive bonding layer 127 includes a metal and material transfer region 133 includes a semiconductor material, and bonding interface 125 is established in response to bonding the metal of conductive bonding layer 127 and the semiconductor material of material transfer region 133 together to form a metal-to-semiconductor bonding interface. In one embodiment, conductive bonding layer 127 includes a metal and material transfer region 133 includes a metal material proximate to surface 134b, and bonding interface 125 is established in response to bonding the metal of conductive bonding layer 127 and the metal material of material transfer region 133 together to form a metal-to-metal bonding interface. In this way, conductive bonding layer 127 establishes bonding interface 125. More information regarding bonding interfaces, bonding layers and establishing a bonding interface can be found in the above-identified U.S. Patent and Patent Applications, which are incorporated herein by reference.

In this embodiment, bonding interface 125 is formed between dielectric material region surface 121a and material transfer region surface 134a of material transfer region 133. Material transfer region surface 134a faces support substrate 110 and interconnect region 120. Bonding interface 125 can be of many different types, such as those mentioned above. In this embodiment, material transfer region 133 is positioned so interconnect region 120 extends between support substrate 110 and material transfer region 133. More information regarding material transfer region 133 and bonding can be found in the above-identified U.S. Patent and Patent Applications, which are incorporated herein by reference.

As mentioned above, material transfer region 133 can include many different types of material. In some embodiments, material transfer region 133 includes a dielectric material. In one embodiment, material transfer region 133 consists of dielectric material. In another embodiment, material transfer region 133 consists essentially of dielectric material.

As mentioned above, the dielectric material of material transfer region 133 can be of many different types, such as silicon dioxide and silicon nitride, among others. In some embodiments, the dielectric material of interconnect region 110 is the same as the dielectric material of material transfer region 133.

In another embodiment, material transfer region 133 includes a semiconductor material. In one embodiment, material transfer region 133 consists of semiconductor material. In another embodiment, material transfer region 133 consists essentially of semiconductor material. It should be noted that, in some embodiments, material transfer region 133 includes a single layer of semiconductor material and, in other embodiments, material transfer region 133 includes a stack of semiconductor layers. In this way, material transfer region 133 includes one or more layers of semiconductor material. Layers and stacks of semiconductor material are discussed in more detail with FIGS. 3a-3c and 4a-4c.

As mentioned above, the semiconductor material can be of many different types, such as silicon, gallium arsenide and gallium nitride, as well as alloys thereof. A semiconductor material operates as a semiconductor, wherein the conductivity of the semiconductor material is adjustable in response to adjusting the type and amount of impurities therein. The type and amount of impurities of the semiconductor material determine the type of charges that are conducted through it. For example, in some situations, the semiconductor material includes impurities which allow negative charges to flow therethrough (i.e. n-type semiconductor material), and, in other situations, the semiconductor material includes impurities which allow positive charges to flow therethrough (i.e. p-type semiconductor material). The atomic structure of the semiconductor material can be of many different types, such as crystalline, polycrystalline and amorphous.

Figure 6E:
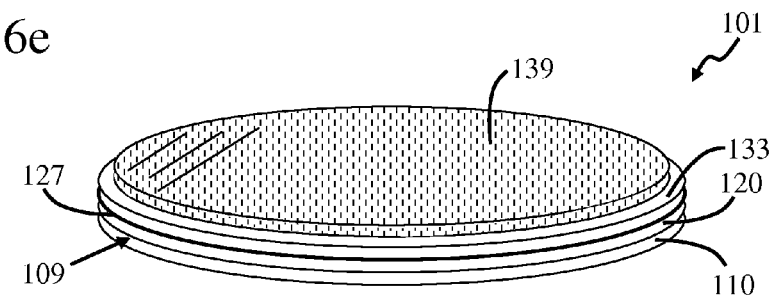
Figure 6F:
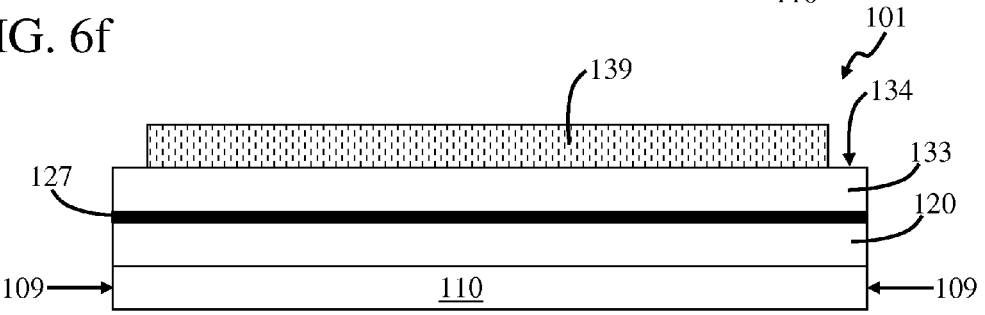

In FIGS. 6e and 6f, mask region 139 is positioned on material transfer region 133 so it is carried by support substrate 110. Mask region 139 can be positioned on material transfer region 133 in many different ways. In this embodiment, mask region 139 is deposited on material transfer region 133 so that mask region 139 covers material transfer region 133. In this embodiment, mask region 139 is deposited on material transfer region 133 so that material transfer region 133 extends between mask region 139 and conductive bonding layer 127.

In FIGS. 6e and 6f, mask region 139 is processed to remove portion 140 of it proximate to outer sidewall 129. Portion 140 extends annularly around the outer periphery of mask region 139 proximate to outer sidewall 129. As mentioned above, portion 140 can be removed in many different ways, such as by etching. The etching can be of many different types, such as wet and/or dry etching. In some embodiments, the portion of mask region 139 that is removed is chosen in response to positioning a mask on surface 134b. In this way, portion 140 is etched utilizing a mask.

In one embodiment, mask region 139 includes a photoresist material which is positioned on material transfer region 133 using conventional photoresist deposition techniques, such as spin on coating. In this embodiment, portion 140 is removed from material transfer region 133 using conventional photoresist development techniques.

Figure 6G:
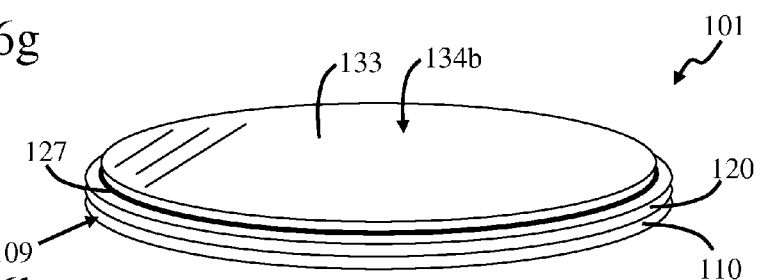
Figure 6H:
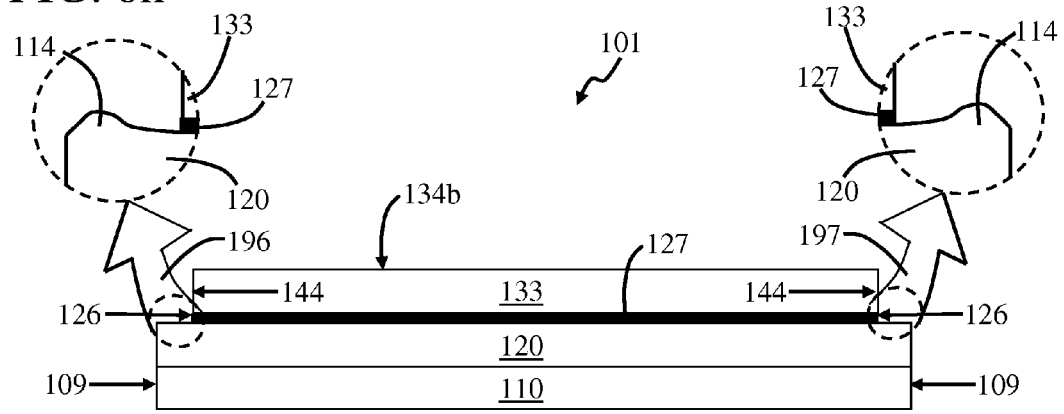

In this embodiment, material transfer region 133 is processed to remove portion 141 (FIGS. 6d and 6f) of material transfer region 133, and mask region 139 is processed to remove it from surface 134b, as shown in FIGS. 6g and 6h. In this embodiment, portion 141 is proximate to outer sidewall 129 and is removed so that lip 114 is exposed, as indicated by indication arrows 192 and 193. It should be noted that a portion of bonding interface 125 is exposed in response to removing portion 141 from material transfer region 133. Portion 141 extends annularly around the outer periphery of mask region 139 proximate to outer sidewall 129. As mentioned above, portion 141 can be removed in many different ways, such as by etching. The etching can be of many different types, such as wet and/or dry etching. In this embodiment, mask region 139 is removed from material transfer region 133 to expose material transfer region surface 134b.

As mentioned above, etched sidewall 144 is formed in response to removing portion 141. In this embodiment, an etched sidewall 126 is formed in response to removing portion 141, wherein etched sidewall 126 is a sidewall portion of conductive bonding layer 127. In this embodiment, etched sidewall 126 faces lip 114.

The stress of material transfer region 133 is adjusted in response to removing portion 141 of material transfer region 133 proximate to outer sidewall 129 to expose lip 114. In particular, the stress of material transfer region 133 is reduced in response to removing portion 141 of material transfer region 133 proximate to outer sidewall 129 to expose lip 114. The stress of material transfer region 133 is reduced because material transfer region 133 experiences less bowing in response to removing portion 141 proximate to outer sidewall 129. As mentioned above, material transfer region 133 experiences more bowing when portion 141 is not removed because lip 114 pushes upwardly on material transfer region 133.

Figure 6I:
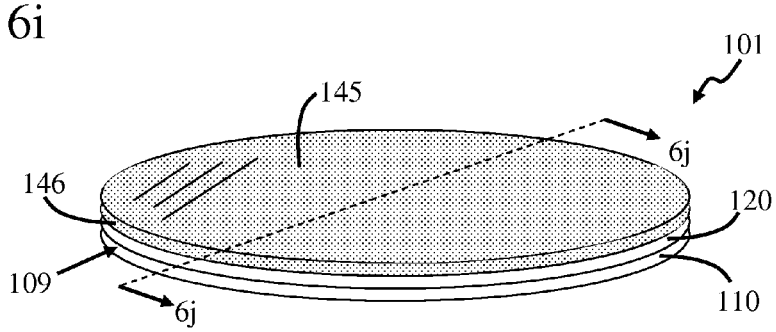
Figure 6J:
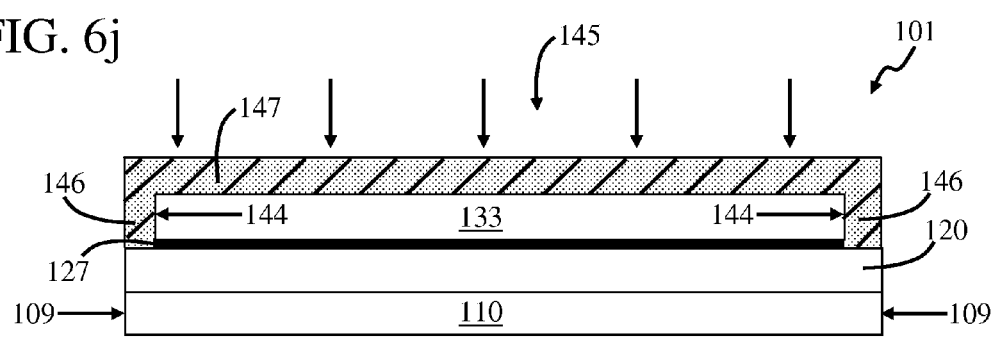

FIG. 6i is a perspective view of bonded semiconductor structure 101 of FIGS. 6g and 6h with capping layer 145 positioned on material transfer region so it is carried by support substrate 110. FIG. 6j is a cut-away side view of bonded semiconductor structure 101 of FIG. 6i taken along a cut-line 6j-6j of FIG. 6i. Capping layer 145 includes portion 147 which extends along surface 134b so it covers material transfer region 133. Portion 147 covers surface 134b to restrict the flow of heat between outer surface 134b and bonding interface 125.

As mentioned above, capping layer 145 can include many different types of material. In this embodiment, capping layer 145 includes dielectric material. In some embodiments, capping layer 145 consists of dielectric material. In some embodiments, capping layer 145 consists essentially of dielectric material. The dielectric material of capping layer 145 can be of many different types, such as silicon dioxide and silicon nitride, among others. In some embodiments, the dielectric material of capping layer 145 is the same as the dielectric material of interconnect region and, in other embodiments, the dielectric material of capping layer 145 is different from the dielectric material of interconnect region 110. In one particular embodiment, the dielectric materials of interconnect region 110 and capping layer 145 include silicon dioxide. In another particular embodiment, the dielectric materials of interconnect region 110 and capping layer 145 include silicon dioxide and silicon nitride, respectively.

As mentioned above, capping layer 145 includes portion 146 which extends between portion 147 and interconnect region 120. In particular, portion 146 extends between portion 147 and lip 114. Portion 146 covers lip 114 and the exposed portion of bonding interface 125. Portion 146 covers the exposed portion of bonding interface 125 to restrict the flow of heat between outer sidewall 129 and bonding interface 125. Portion 146 covers the exposed portion of bonding interface 125 to restrict the flow of heat between surface 134b and bonding interface 125. Portion 146 extends along sidewall 144 of material transfer region 133. Further, portion 146 extends along etched sidewall 126 of conductive bonding layer 127.

Figure 6K:
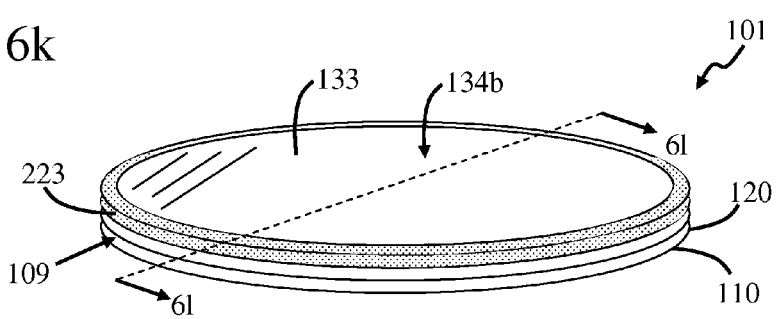
Figure 6L:
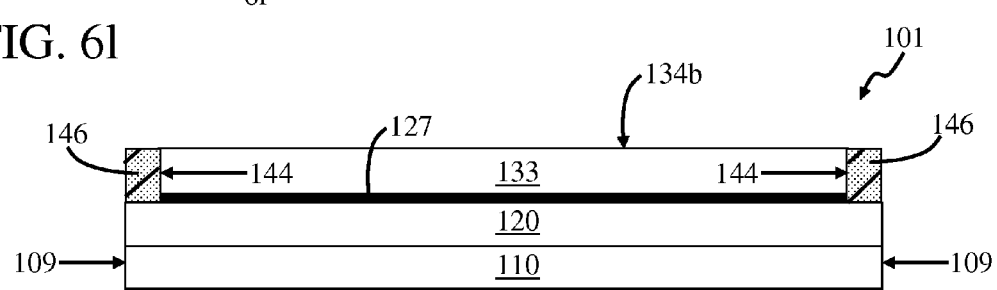

In FIGS. 6k and 6l, portion 147 of capping layer 145 is removed so that surface 134b of material transfer region is exposed. Portion 147 of capping layer 145 is removed so that portion 146 extends annularly around material transfer region 133, as shown in FIG. 6k, and covers lip 114. Portion 146 covers lip 114 and the exposed portion of bonding interface 125, and extends along sidewall 144. Portion 146 covers the exposed portion of bonding interface 125 to restrict the flow of heat between outer sidewall 129 and bonding interface 125. Portion 146 covers the exposed portion of bonding interface 125 to restrict the flow of heat between surface 134b and bonding interface 125. Portion 146 covers etched sidewall 126 of conductive bonding layer 127 to restrict the flow of the material of conductive bonding layer 127 from bonding interface 125. In this way, the material of conductive bonding layer 127 is less likely to contaminate material transfer region 133.

Figure 7C:
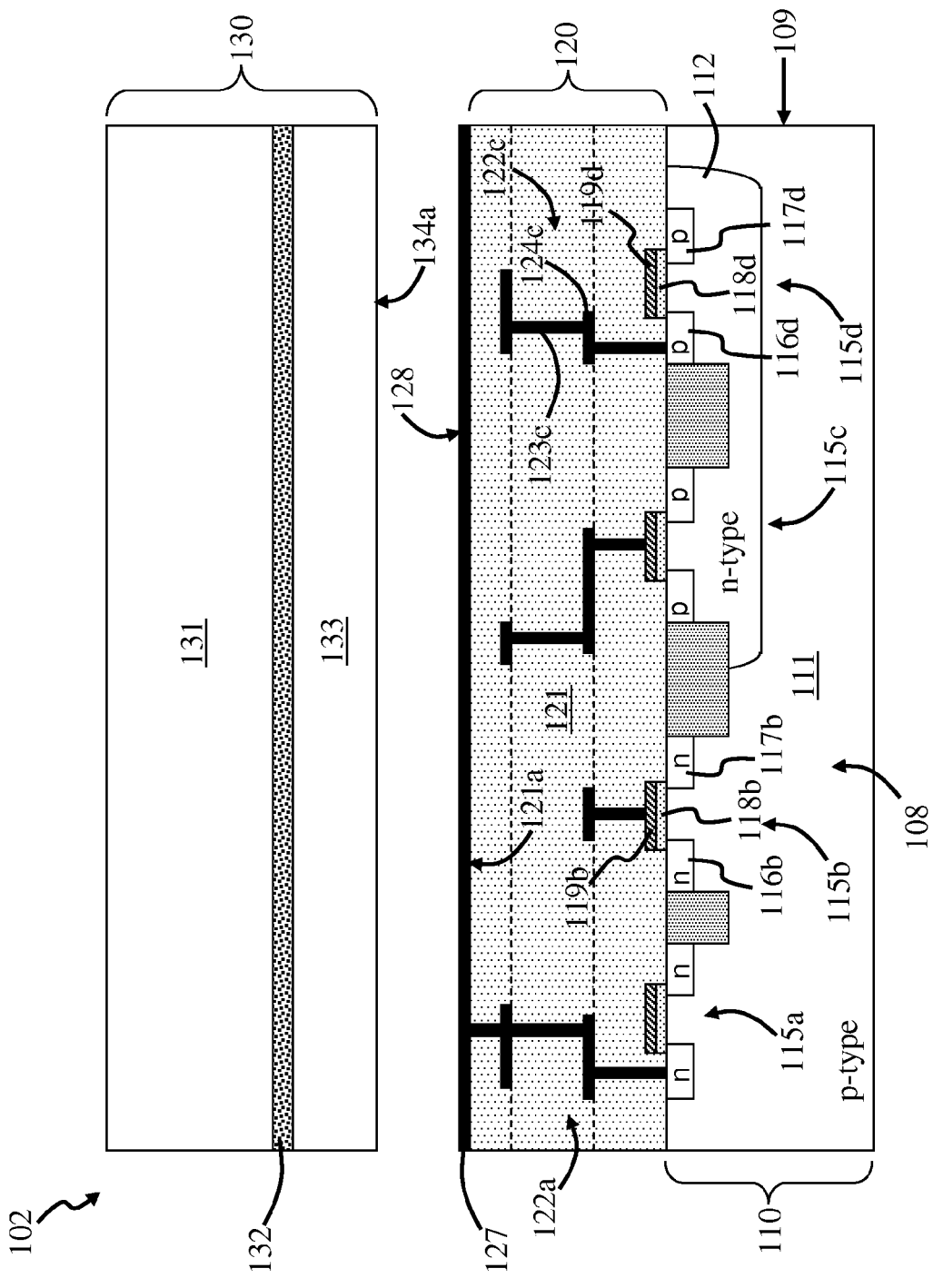
FIGS. 7a-7o are views of steps of manufacturing another embodiment of a bonded semiconductor structure.
Figure 7D:
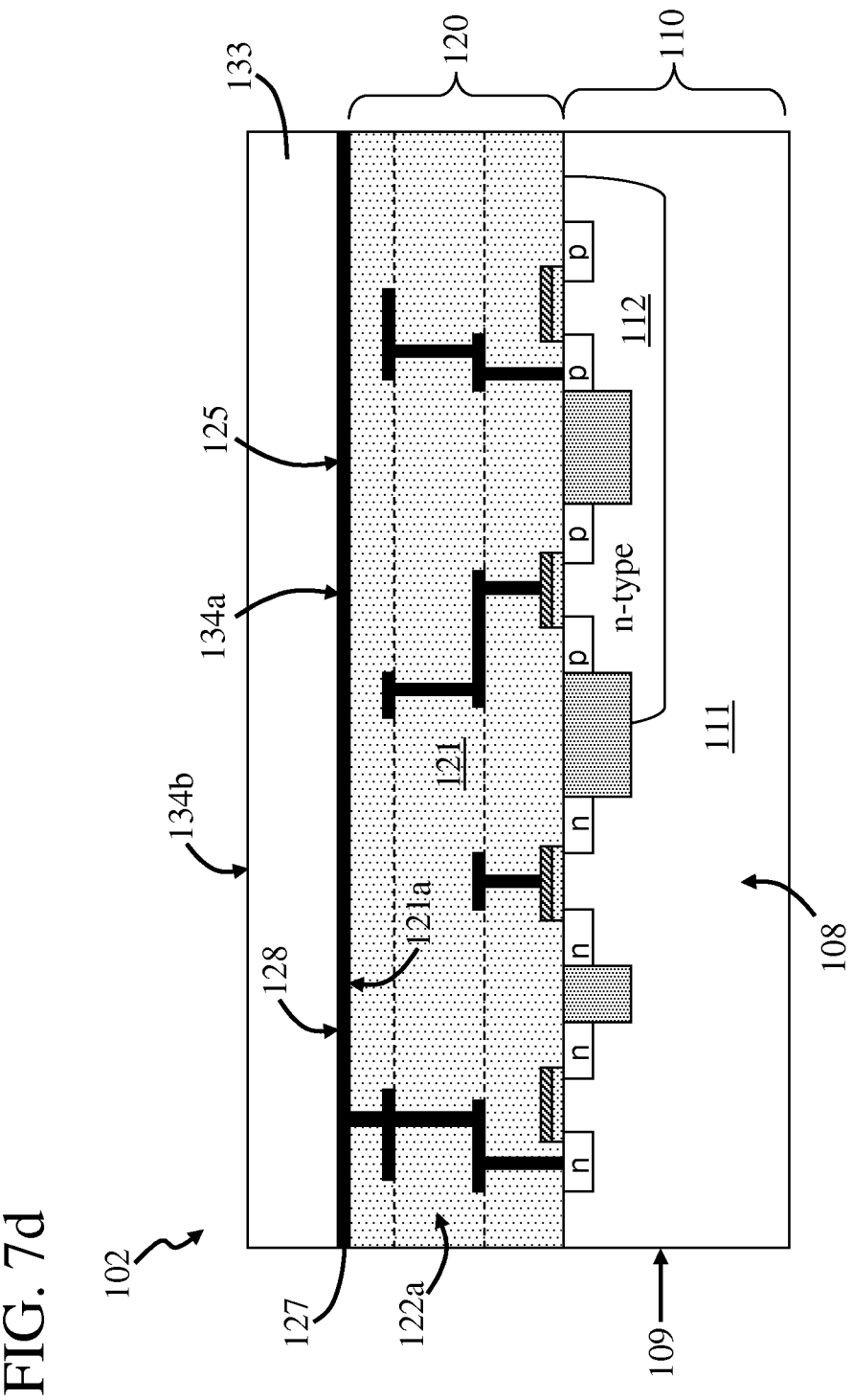
Figure 7E:
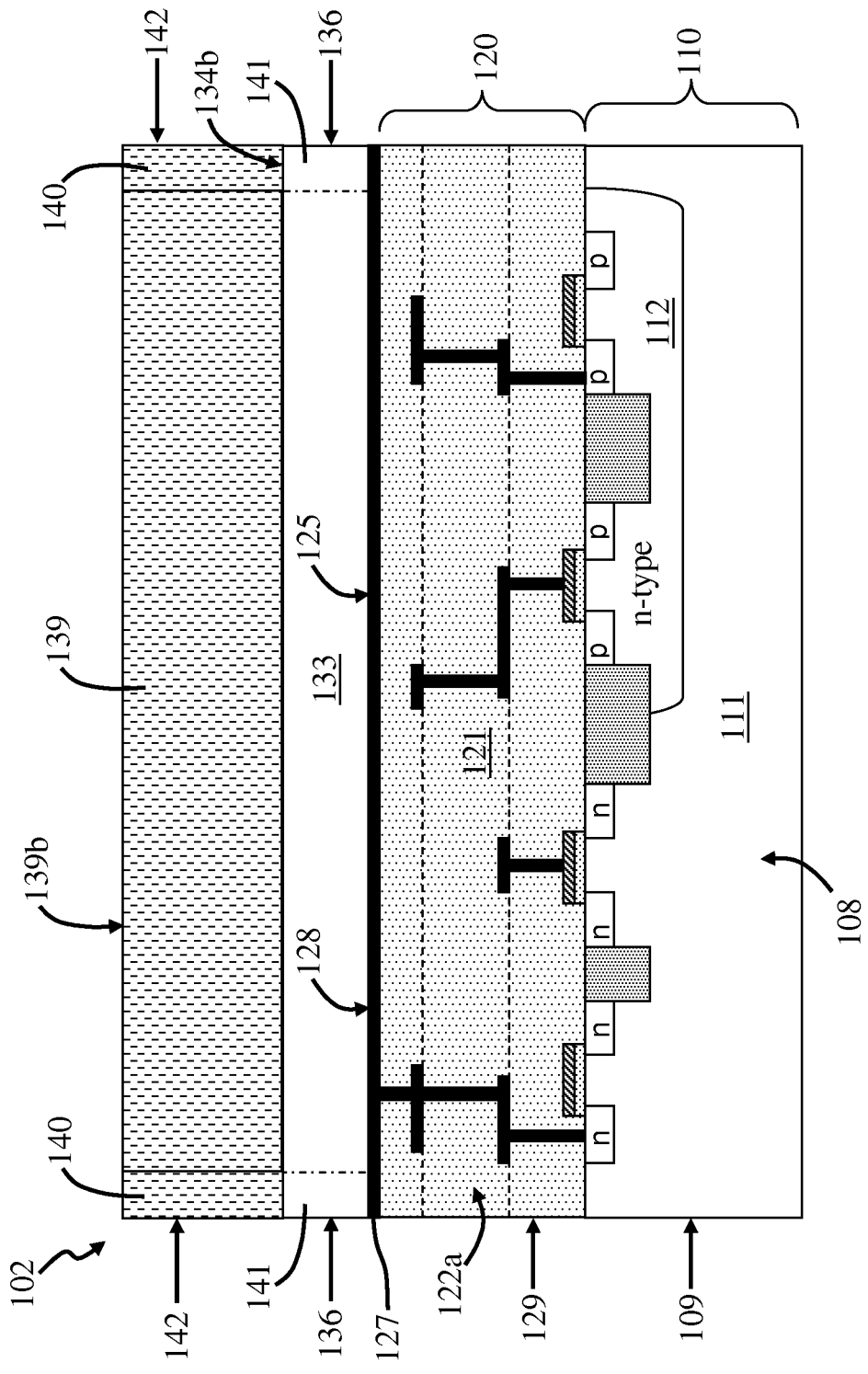
Figure 7F:
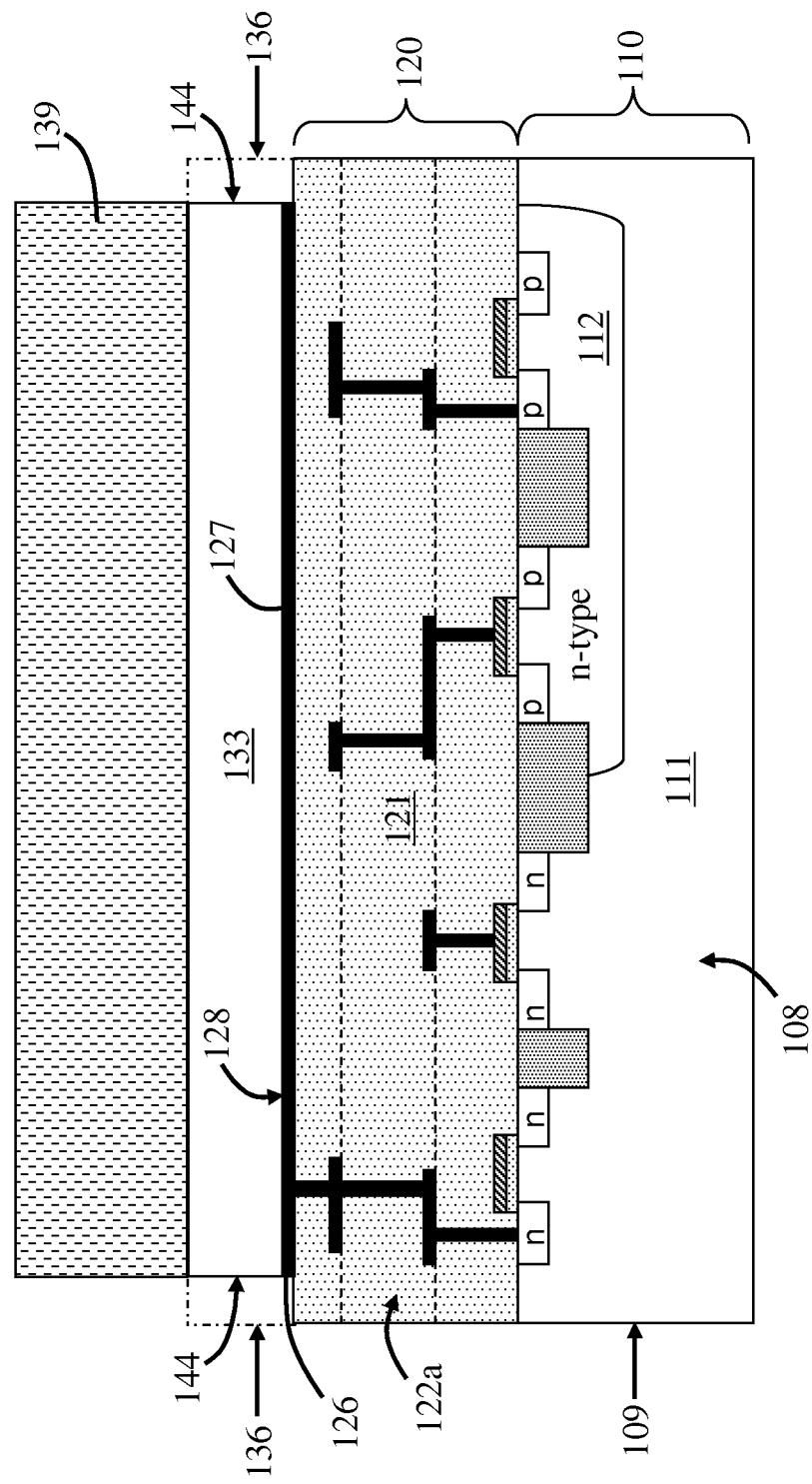
Figure 7G:
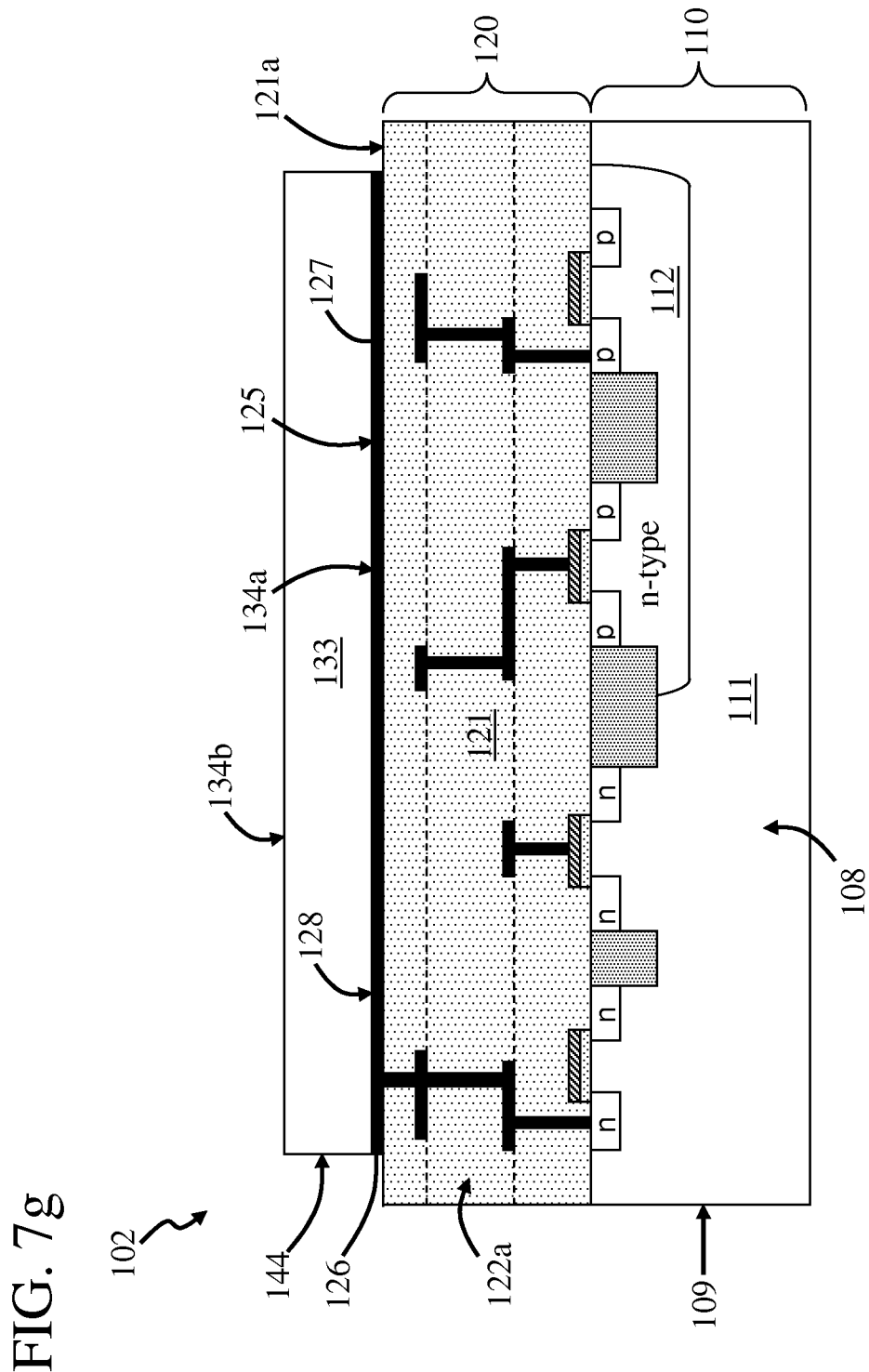
Figure 7H:
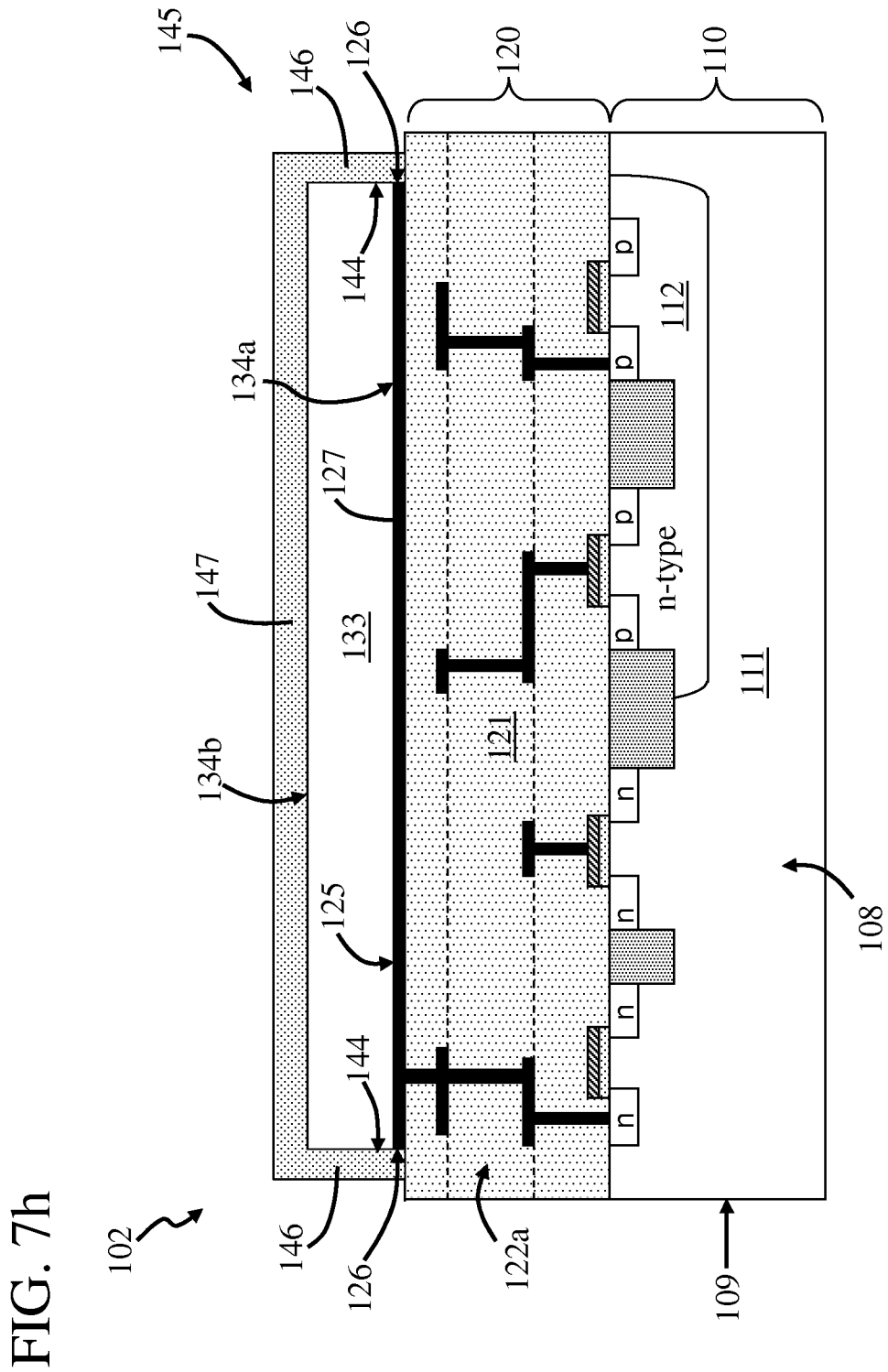
Figure 7I:
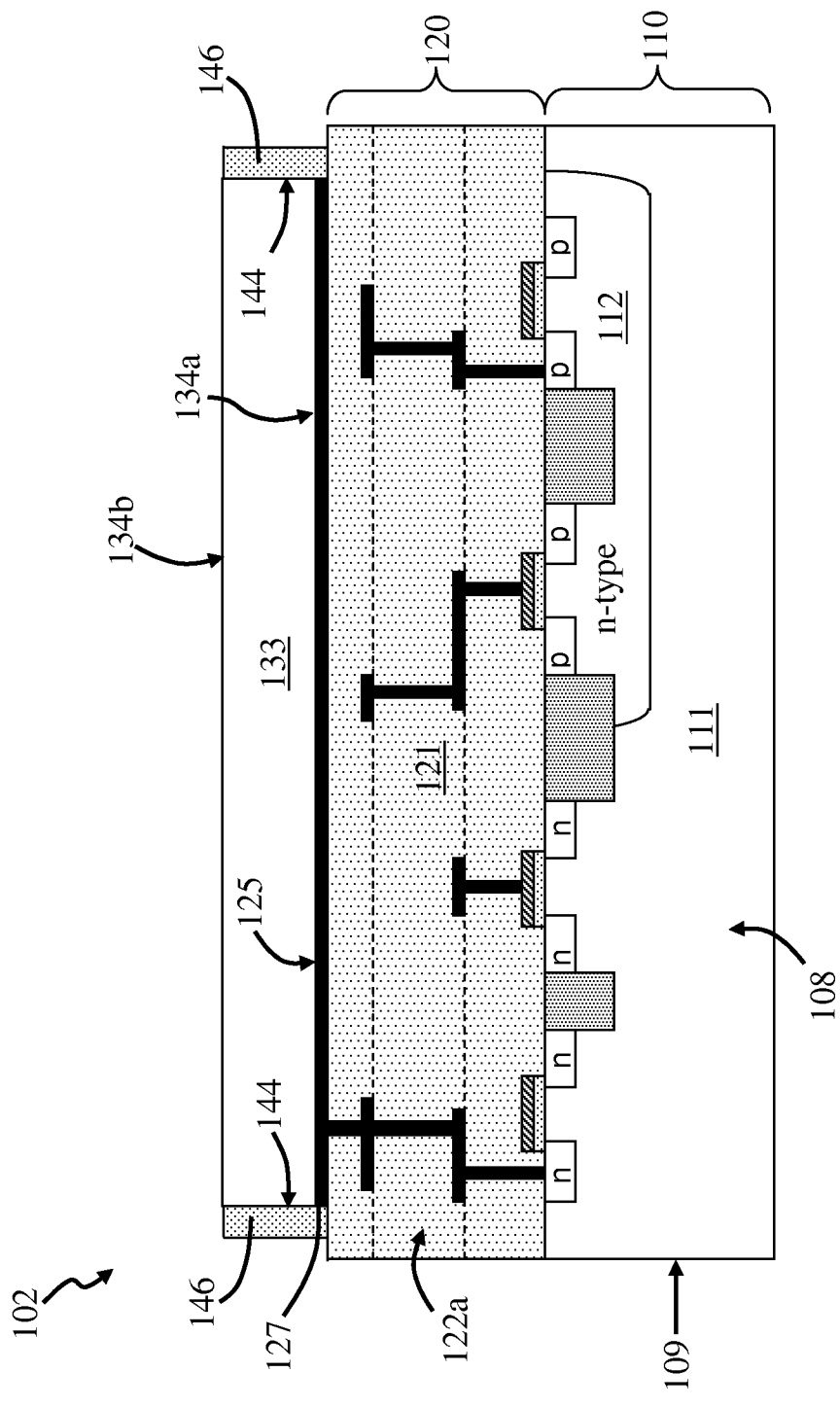
Figure 7J:
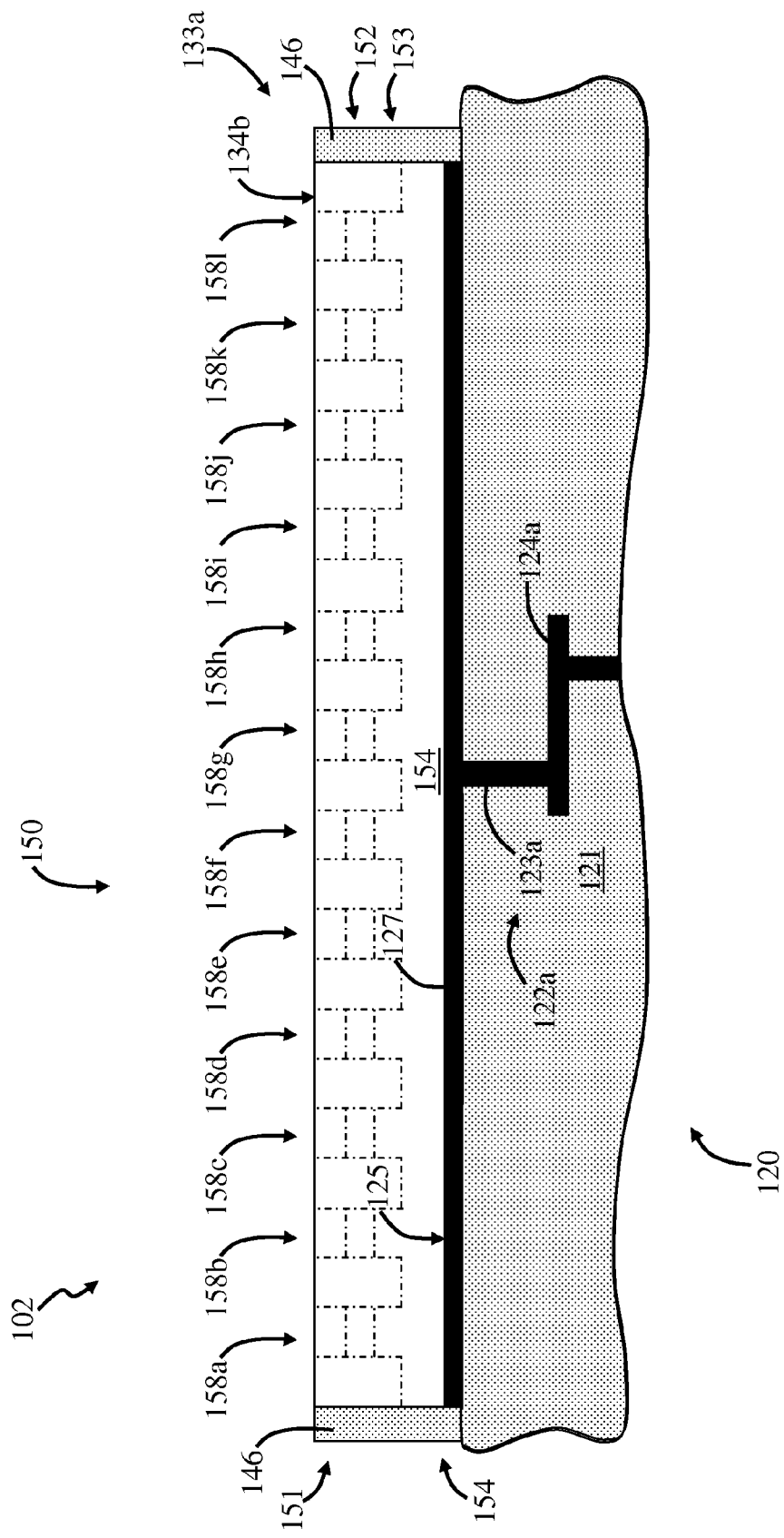
Figure 71:
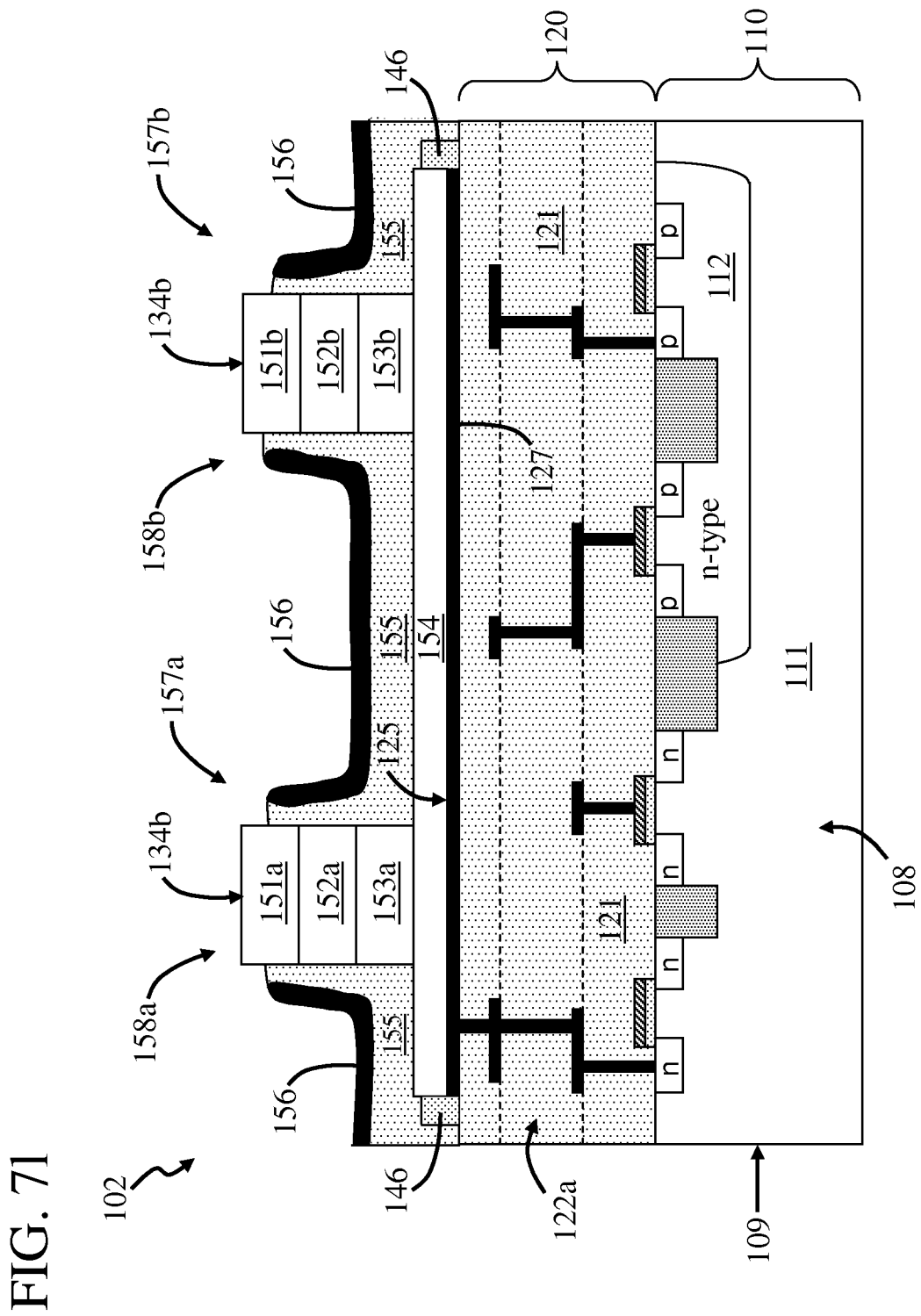
Figure 7M:
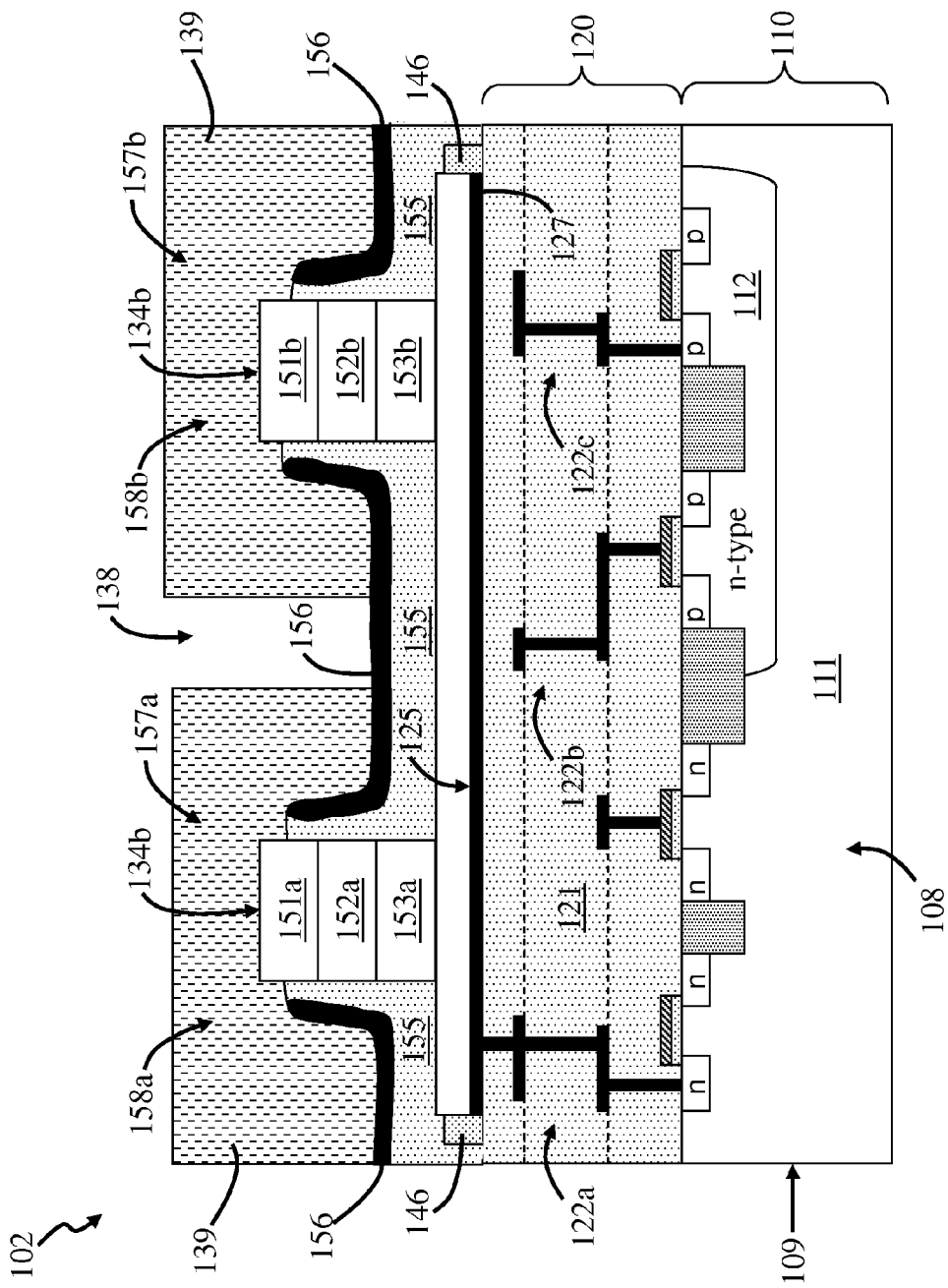
Figure 7N:
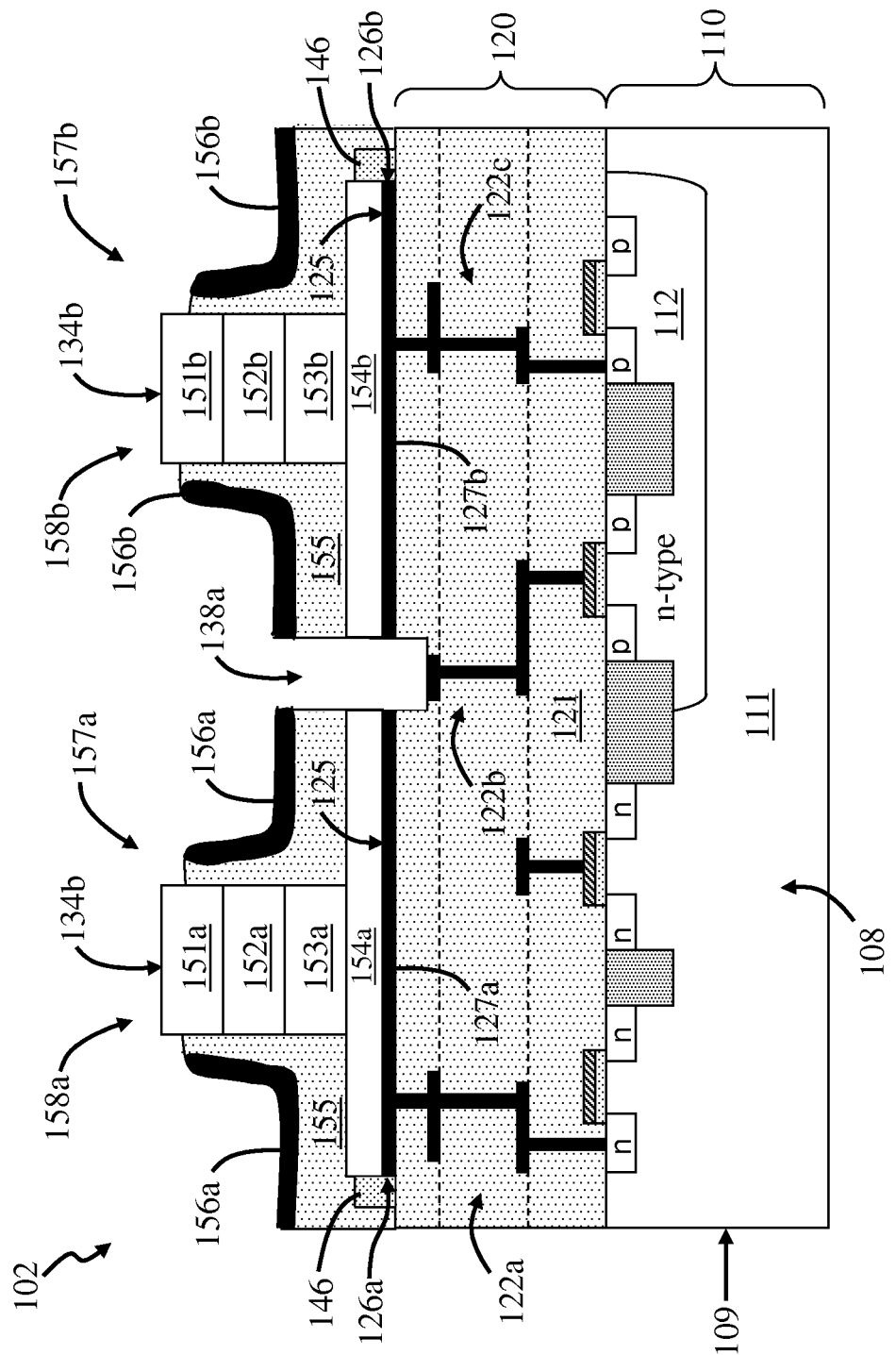
Figure 7O:
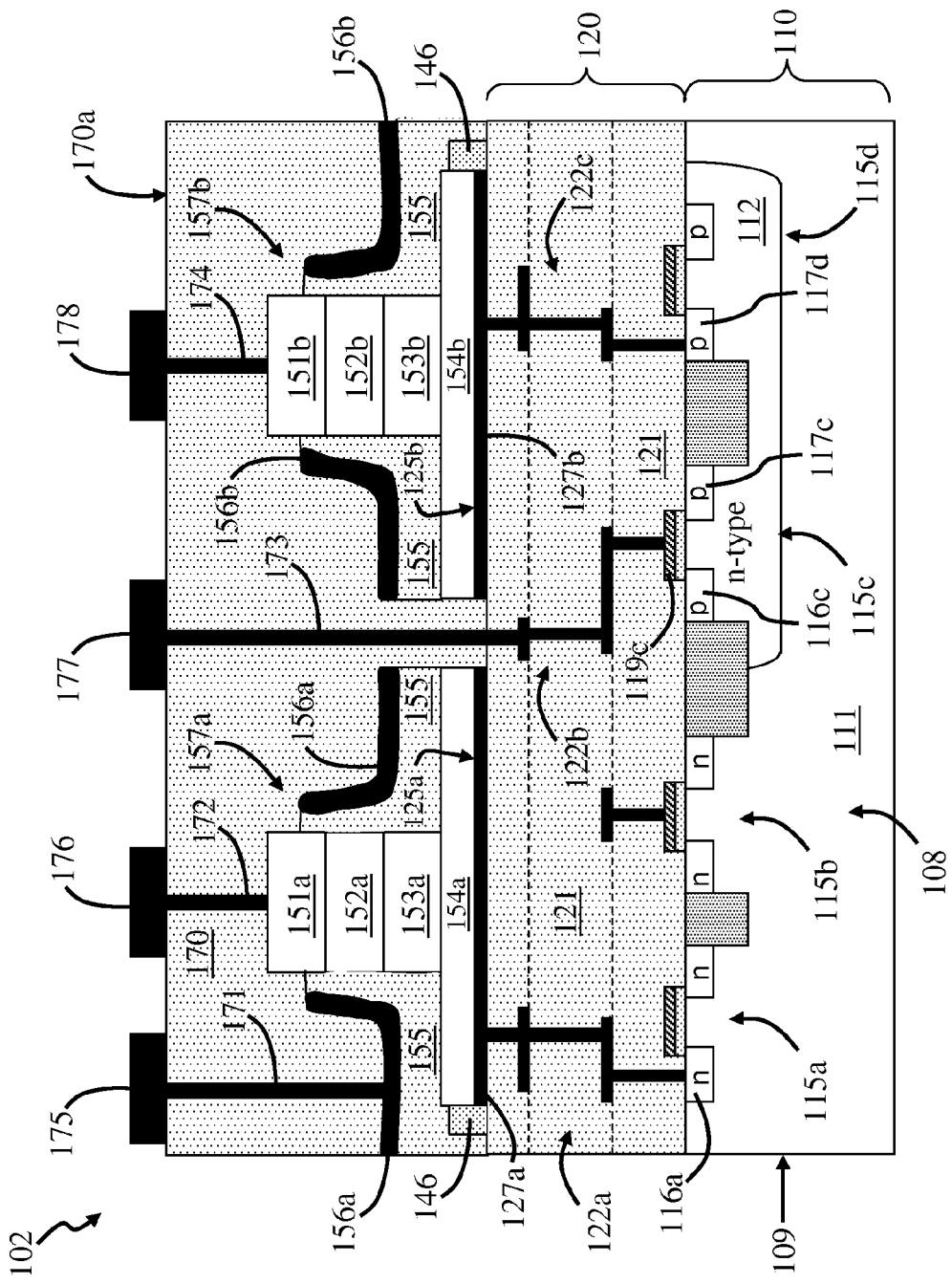

FIGS. 7a-7o are views of steps of manufacturing a bonded semiconductor structure 102. More information regarding manufacturing a bonded semiconductor structure can be found in the above-identified U.S. Patent and Patent Applications, which are incorporated herein by reference. FIGS. 7a and 7b are perspective and side views, respectively, of partially fabricated bonded semiconductor structure 102. In this embodiment, bonded semiconductor structure 102 includes support substrate 110 which includes a support substrate body 111. As mentioned above, support substrate 110 is bounded by outer sidewall 109 which extends around its outer periphery. Support substrate 110 can be of many different types. In this embodiment, support substrate 110 is a semiconductor wafer because support substrate body 111 includes semiconductor material.

In some embodiments, support substrate body 111 consists of semiconductor material. In some embodiments, support substrate body 111 consists essentially of semiconductor material. In some embodiments, support substrate body 111 consists of crystalline semiconductor material. In some embodiments, support substrate body 111 consists essentially of crystalline semiconductor material. In some embodiments, support substrate body 111 consists of single crystalline semiconductor material. In some embodiments, support substrate body 111 consists essentially of single crystalline semiconductor material.

In this embodiment, support substrate 110 carries an electronic circuit 108 proximate to surface 110a. Support substrate 110 can carry electronic circuit 108 in many different ways. In this embodiment, electronic circuit 108 includes a portion of support substrate body 111, and is positioned proximate to surface 110a. Electronic circuit 108 can be of many different types, such as those mentioned above. In this embodiment, electronic circuit 108 is a complementary metal oxide semiconductor (CMOS) circuit. Electronic circuit 108 is formed using conventional CMOS processing techniques, such as photolithography, deposition, ion implantation, annealing and etching.

In this embodiment, electronic circuit 108 includes a transistor 115a (FIG. 7a) having a source 116a and drain 117a, wherein source 116a and drain 117a include portions of support substrate body 111 proximate to surface 110a. Further, transistor 115a includes a control dielectric 118a which extends along surface 110a proximate to source 116a and drain 117a. In this embodiment, transistor 115a includes a control terminal 119a which is electrically coupled to support substrate body 111 through control dielectric 118a so that transistor 115a operates as a metal oxide semiconductor field effect transistor. In particular, control terminal 119a is electrically coupled to a portion of support substrate body 111 between source 116a and drain 117a through control dielectric 118a. The conductivity of the portion of support substrate body 111 between source 116a and drain 117a is adjustable in response to a signal provided to control terminal 119a. In this way, control terminal 119a is electrically coupled to a portion of support substrate body 111 between source 116a and drain 117a. It should be noted that control terminal 119a can include a metal and doped semiconductor material, such as doped polycrystalline semiconductor material.

In this embodiment, electronic circuit 108 includes a transistor 115b (FIG. 7c) having a source 116a and drain 117a, wherein source 116b and drain 117b include portions of support substrate body 111 proximate to surface 110a. Further, transistor 115b includes a control dielectric 118b which extends along surface 110a proximate to source 116b and drain 117b. In this embodiment, transistor 115b includes a control terminal 119b which is electrically coupled to support substrate body 111 through control dielectric 118b so that transistor 115b operates as a metal oxide semiconductor field effect transistor. In particular, control terminal 119b is electrically coupled to a portion of support substrate body 111 between source 116b and drain 117b through control dielectric 118b. It should be noted that control terminal 119b can include a metal and doped semiconductor material, such as doped polycrystalline semiconductor material. The conductivity of the portion of support substrate body 111 between source 116b and drain 117b is adjustable in response to a signal provided to control terminal 119b. In this way, control terminal 119b is electrically coupled to a portion of support substrate body 111 between source 116b and drain 117b. It should be noted that control terminal 119b can include a metal and doped semiconductor material, such as doped polycrystalline semiconductor material.

In this embodiment, electronic circuit 108 includes a transistor 115c (FIG. 7a) having a source 116c and drain 117c, wherein source 116c and drain 117c include portions of support substrate body 111 proximate to surface 110a. Further, transistor 115c includes a control dielectric 118c which extends along surface 110a proximate to source 116c and drain 117c. In this embodiment, transistor 115c includes a control terminal 119c which is electrically coupled to support substrate body 111 through control dielectric 118c so that transistor 115c operates as a metal oxide semiconductor field effect transistor. In particular, control terminal 119c is electrically coupled to a portion of support substrate body 111 between source 116c and drain 117c through control dielectric 118c. It should be noted that control terminal 119c can include a metal and doped semiconductor material, such as doped polycrystalline semiconductor material. The conductivity of the portion of support substrate body 111 between source 116c and drain 117c is adjustable in response to a signal provided to control terminal 119c. In this way, control terminal 119c is electrically coupled to a portion of support substrate body 111 between source 116c and drain 117c. It should be noted that control terminal 119c can include a metal and doped semiconductor material, such as doped polycrystalline semiconductor material.

In this embodiment, electronic circuit 108 includes a transistor 115d (FIG. 7a) having a source 116d and drain 117da, wherein source 116d and drain 117d include portions of support substrate body 111 proximate to surface 110a. Further, transistor 115d includes a control dielectric 118d which extends along surface 110a proximate to source 116d and drain 117d. In this embodiment, transistor 115d includes a control terminal 119d which is electrically coupled to support substrate body 111 through control dielectric 118d so that transistor 115d operates as a metal oxide semiconductor field effect transistor. In particular, control terminal 119d is electrically coupled to a portion of support substrate body 111 between source 116d and drain 117d through control dielectric 118d. It should be noted that control terminal 119d can include a metal and doped semiconductor material, such as doped polycrystalline semiconductor material. The conductivity of the portion of support substrate body 111 between source 116d and drain 117d is adjustable in response to a signal provided to control terminal 119d. In this way, control terminal 119d is electrically coupled to a portion of support substrate body 111 between source 116d and drain 117d. It should be noted that control terminal 119d can include a metal and doped semiconductor material, such as doped polycrystalline semiconductor material.

It should be noted that transistors 115c and 115d extend through a well region 112 of support substrate body 111. Hence, transistors 115a and 115b are different types of transistors from transistors 115c and 115d.

In this particular embodiment, transistor 115a is an NMOS transistor because the portion of support substrate body 111 between source 116a and drain 117a is doped p-type. Further, transistor 115b is an NMOS transistor because the portion of support substrate body 111 between source 116b and drain 117b is doped p-type. Transistor 115c is a PMOS transistor because well region 112 is doped n-type so that the portion of support substrate body 111 between source 116c and drain 117c is doped n-type. Further, transistor 115d is a PMOS transistor because well region 112 is doped n-type so that the portion of support substrate body 111 between source 116d and drain 117d is doped n-type. It should also be noted that transistors 115a, 115b, 115c and 115d are separated from each other by an isolation region 113. Well region 112 and isolation region 113 are proximate to surface 110a of support substrate 110.

As will be discussed in more detail below, interconnect region 120 includes a conductive line which extends through a dielectric material region 121. It should be noted that the conductive line of interconnect region 120 is typically in communication with the electronic circuit carried by support substrate 110. The dielectric material of interconnect region 120 can be of many different types, such as silicon dioxide and silicon nitride, among others. A dielectric material operates as a polarizable insulator, wherein the flow of a current therethrough is restricted. The dielectric material generally has a non-crystalline atomic structure. For example, the dielectric material can have a polycrystalline and amorphous atomic structure. It should be noted that interconnect region 120 is formed using conventional processing techniques, such as photolithography, deposition and etching.

In this embodiment, interconnect region 120 is formed on support substrate surface 110a, wherein interconnect region 120 includes a surface 120a, which faces support substrate 110, and a surface 120b, which faces away from support substrate 110. In this embodiment, interconnect region 120 is formed using conventional processing techniques, such as photolithography, material deposition and material etching. It should be noted that portions of surface 120b are conductive and other portions of surface 120b are insulative. The portions of surface 120b that are conductive correspond to portions of the conductive line(s) of interconnect region 120 that are adjacent to surface 120b. The portions of surface 120b that are insulative correspond to portions of dielectric material region 121 that are adjacent to surface 120b.

In this embodiment, interconnect region 120 includes a conductive line 122a (FIG. 7a), which includes a conductive via and conductive interconnect in communication with each other. For example, in this embodiment, conductive line 122a includes a conductive via 123a in communication with a conductive interconnect 124a. Conductive via 123a is in communication with conductive interconnect 124a when a signal is capable of flowing between conductive via 123a and conductive interconnect 124a. In this particular embodiment, conductive via 123a is connected to conductive interconnect 124a. Conductive via 123a is connected to conductive interconnect 124a when conductive via 123a is engaged with conductive interconnect 124a. Conductive line 122a is in communication with electronic circuit 108. In this embodiment, conductive line 122a is in communication with transistor 115a. In particular, conductive line 122a is in communication with source 116a of transistor 115a.

It should be noted, however, that conductive line 122a can be in communication with other portions of transistor 115a, if desired. For example, in some embodiments, conductive line 122a is in communication with drain 117a and, in other embodiments, conductive line 122a is in communication with control terminal 119a. In this way, interconnect region 120 includes a conductive line in communication with an electronic circuit carried by support substrate 110.

In this embodiment, interconnect region 120 includes a conductive line 122b (FIG. 7a), which includes a conductive via and conductive interconnect in communication with each other. For example, in this embodiment, conductive line 122b includes a conductive via 123b in communication with a conductive interconnect 124b. Conductive via 123b is in communication with conductive interconnect 124b when a signal is capable of flowing between conductive via 123b and conductive interconnect 124b. In this particular embodiment, conductive via 123b is connected to conductive interconnect 124b. Conductive via 123b is connected to conductive interconnect 124b when conductive via 123b is engaged with conductive interconnect 124b. Conductive line 122b is in communication with electronic circuit 108. In particular, conductive line 122b is in communication with transistor 115c. Conductive line 122b is in communication with control terminal 119c of transistor 115c.

It should be noted, however, that conductive line 122b can be in communication with other portions of transistor 115c, if desired. For example, in some embodiments, conductive line 122b is in communication with source 116c and, in other embodiments, conductive line 122a is in communication with drain 117c. In this way, interconnect region 120 includes a conductive line in communication with an electronic circuit carried by support substrate 110.

In this embodiment, interconnect region 120 includes a conductive line 122c (FIG. 7a), which includes a conductive via and conductive interconnect in communication with each other. For example, in this embodiment, conductive line 122c includes a conductive via 123c in communication with a conductive interconnect 124c. Conductive via 123c is in communication with conductive interconnect 124c when a signal is capable of flowing between conductive via 123c and conductive interconnect 124c. In this particular embodiment, conductive via 123c is connected to conductive interconnect 124c. Conductive via 123c is connected to conductive interconnect 124c when conductive via 123c is engaged with conductive interconnect 124c. Conductive line 122c is in communication with electronic circuit 108. In this embodiment, conductive line 122c is in communication with transistor 115c. Conductive line 122c is in communication with source 116d of transistor 115d.

It should be noted, however, that conductive line 122c can be in communication with other portions of transistor 115d, if desired. For example, in some embodiments, conductive line 122c is in communication with drain 117d and, in other embodiments, conductive line 122c is in communication with control terminal 119d. In this way, interconnect region 120 includes a conductive line in communication with an electronic circuit carried by support substrate 110.

In this way, interconnect region 120 includes a conductive line which extends through a dielectric material. It should be noted that the conductive lines of interconnect region 120 can include many different types of conductive material, such as aluminum and tungsten, among others. The material of the conductive line is more conductive than dielectric material 121. Further, dielectric material 121 is more insulative than the material of the conductive line. More information regarding interconnect regions and the formation of interconnect regions can be found in the above-identified U.S. Patents and Patent Applications, which are incorporated herein by reference.

In this embodiment, bonded semiconductor structure 102 includes a conductive bonding layer 127. In this embodiment, and as will be discussed in more detail below, conductive bonding layer 127 operates as a bit line. More information regarding bit lines can be found in the above-identified U.S. Patents and Patent Applications, which are incorporated herein by reference.

In this embodiment, conductive bonding layer 127 is coupled to interconnect region 120. Conductive bonding layer 127 can be coupled to interconnect region 120 in many different ways. In this embodiment, conductive bonding layer 127 is deposited on surface 120b of interconnect region 120. Conductive bonding layer 127 is deposited so it extends along surface 120b of interconnect region 120. In this way, conductive bonding layer 127 is coupled to interconnect region 120.

In this embodiment, conductive bonding layer 127 is carried by interconnect region 120. Conductive bonding layer 127 can be carried by interconnect region 120 in many different ways. In this embodiment, conductive bonding layer 127 is deposited on surface 120b of interconnect region 120. As mentioned above, conductive bonding layer 127 is deposited so it extends along surface 120b of interconnect region 120. In this way, conductive bonding layer 127 is carried by interconnect region 120.

In some embodiments, conductive bonding layer 127 is in communication with a conductive line of interconnect region 120. For example, in some embodiments, conductive bonding layer 127 is in communication with conductive line 122a of interconnect region 120. In some embodiments, conductive bonding layer 127 is in communication with conductive line 122b of interconnect region 120. In some embodiments, conductive bonding layer 127 is in communication with conductive line 122c of interconnect region 120.

In the embodiment of FIGS. 7a and 7c, conductive bonding layer 127 is in communication with conductive line 122a. In particular, conductive bonding layer 127 is in communication with a conductive via of conductive line 122a. It should be noted that, in FIGS. 7a and 7c, conductive bonding layer 127 is in communication with transistor 115a through conductive line 122a. More information regarding conductive bonding regions and the formation of conductive bonding regions can be found in the above-identified U.S. Patents and Patent Applications, which are incorporated herein by reference.

FIG. 7b is a side view of a material transfer structure 130. As discussed in more detail below, material transfer structure 130 will be coupled to support substrate 110 through interconnect region 120. In this embodiment, material transfer structure 130 includes a support substrate 131 which carries material transfer region 133. In this embodiment, material transfer structure 130 includes a detach region 132 positioned to allow material transfer region 133 to be detached from support substrate 131. In this embodiment, detach region 132 extends between support substrate 131 and material transfer region 133. Material transfer region 133 includes surface 134b which faces detach region 132, and surface 134a which faces away from detach region 132.

Detach region 132 can include many different types of material, such as porous silicon. In this embodiment, detach region 132 includes a material with a weaker mechanical strength than the material of support substrate 131. More information regarding detach region 132 can be found in the above-identified U.S. Patent and Patent Applications, which are incorporated herein by reference. More information regarding porous silicon can be found in the above-identified U.S. Patent and Patent Applications, which are incorporated herein by reference. More information regarding porous silicon can be found in U.S. Pat. No. 5,439,843, the contents of which is incorporated by reference as though fully set forth herein.

As mentioned above, the material transfer region 133 can include many different types of material. In some embodiments, material transfer region 133 includes a dielectric material. In one embodiment, material transfer region 133 consists of dielectric material. In another embodiment, material transfer region 133 consists essentially of dielectric material.

As mentioned above, the dielectric material of material transfer region 133 can be of many different types, such as silicon dioxide and silicon nitride, among others. In some embodiments, the dielectric material of interconnect region 110 is the same as the dielectric material of material transfer region 133. The dielectric material of material transfer region 133 can be used to form a bonded capacitor, if desired.

In another embodiment, material transfer region 133 includes a semiconductor material. In some embodiments, material transfer region 133 consists of semiconductor material. In some embodiments, material transfer region 133 consists essentially of semiconductor material. In some embodiments, material transfer region 133 consists of crystalline semiconductor material. In some embodiments, material transfer region 133 consists essentially of crystalline semiconductor material. In some embodiments, material transfer region 133 consists of single crystalline semiconductor material. In some embodiments, material transfer region 133 consists essentially of single crystalline semiconductor material. It should be noted that, in some embodiments, material transfer region 133 includes a single layer of semiconductor material and, in other embodiments, material transfer region 133 includes a stack of semiconductor layers. In general, material transfer region 133 can include one or more layers of semiconductor material. Layers and stacks of semiconductor material are discussed in more detail with FIGS. 3a-3c and 4a-4c.

FIG. 7b shows one embodiment of a stack 150, which is indicated by an indication arrow 198. In this embodiment, stack 150 includes a semiconductor layer 151 adjacent to detach region 132, a semiconductor layer 152 adjacent to layer 151 and a semiconductor layer 153 adjacent to layer 152. In this way, material transfer region 133 includes three layers of semiconductor material. It should be noted that semiconductor layer 153 is adjacent to surface 134a. In general, stack 150 includes a plurality of layers of semiconductor material. The layers of stack 150 can be formed in many different ways, such as those discussed above with FIGS. 3a-3c and 4a-4c.

As mentioned above, the semiconductor material can be of many different types, such as silicon, gallium arsenide and gallium nitride, as well as alloys thereof. A semiconductor material operates as a semiconductor, wherein the conductivity of the semiconductor material is adjustable in response to adjusting the type and amount of impurities therein. The type and amount of impurities of the semiconductor material determine the type of charges that are conducted through it. For example, in some situations, the semiconductor material includes impurities which allow negative charges to flow therethrough (i.e. n-type semiconductor material), and, in other situations, the semiconductor material includes impurities which allow positive charges to flow therethrough (i.e. p-type semiconductor material). The atomic structure of the semiconductor material can be of many different types, such as crystalline, polycrystalline and amorphous.

In FIGS. 7c and 7d, material transfer region 133 is coupled to support substrate 110 through interconnect region 120. Material transfer region 133 can be coupled to support substrate 110 through interconnect region 120 in many different ways. In this embodiment, material transfer region 133 is coupled to support substrate 110 in response to coupling material transfer region 133 to interconnect region 120 through conductive bonding layer 127. Material transfer region 133 can be coupled to interconnect region 120 through conductive bonding layer 127 in many different ways. In this embodiment, a bonding interface 125 (FIG. 7d) is formed in response to surface 134a of material transfer region 133 being bonded to a bonding region surface 128 of conductive bonding layer 127. Bonding region surface 128 faces away from interconnect region 120. In this way, material transfer region 133 is coupled to interconnect region 120 using bonding, and semiconductor structure 102 is a bonded semiconductor structure.

Bonding interface 125 is established in response to coupling material transfer region 133 to interconnect region 120 through conductive bonding layer 127, as shown in FIG. 7d. Material transfer region 133 can be coupled to interconnect region 120 through conductive bonding layer 127 in many different ways. In one embodiment, conductive bonding layer 127 includes a metal and material transfer region 133 includes a dielectric material proximate to surface 134a, and bonding interface 125 is established in response to bonding the metal of conductive bonding layer 127 and the dielectric material of material transfer region 133 together to form a metal-to-dielectric bonding interface. In this way, conductive bonding layer 127 establishes a metal-to-dielectric bonding interface, and bonding interface 125 is a metal-to-dielectric bonding interface.

In another embodiment, conductive bonding layer 127 includes a metal and material transfer region 133 includes a metal material proximate to surface 134a, and bonding interface 125 is established in response to bonding the metal of conductive bonding layer 127 and the metal material of material transfer region 133 together to form a metal-to-metal bonding interface. In this way, conductive bonding layer 127 establishes a metal-to-metal bonding interface, and bonding interface 125 is a metal-to-metal bonding interface.

In the embodiment of FIGS. 7c and 7d, conductive bonding layer 127 includes a metal and material transfer region 133 includes a semiconductor material proximate to surface 134a, and bonding interface 125 is established in response to bonding the metal of conductive bonding layer 127 and the semiconductor material of material transfer region 133 together to form a metal-to-semiconductor bonding interface. In this way, conductive bonding layer 127 establishes a metal-to-semiconductor bonding interface, and bonding interface 125 is a metal-to-semiconductor bonding interface. As mentioned above, material transfer region surface 134a faces support substrate 110 and interconnect region 120. More information regarding bonding interfaces, bonding layers and establishing a bonding interface can be found in the above-identified U.S. Patent and Patent Applications, which are incorporated herein by reference.

It should be noted that bonding interface 125 is not formed in response to a gaseous semiconductor material engaging surface 128. In particular, bonding interface 125 is not formed in response to agglomerating semiconductor material on surface 128. Hence, bonding interface 125 is not a growth interface because, as discussed in more detail above, a bonding interface is not a growth interface. In this way, a bonded semiconductor structure is fabricated using bonding.

In this embodiment, material transfer region 133 includes single crystalline semiconductor material, and it is difficult to deposit single crystalline semiconductor material on a non-semiconductor material, such as a metal. In some embodiments, material transfer region 133 includes crystalline semiconductor material, and it is difficult to deposit crystalline semiconductor material on a non-semiconductor material, such as a metal. Hence, it is useful to form a bonding interface between material transfer region 133 and conductive bonding layer 127 instead of a growth interface.

It is undesirable to form a growth interface between material transfer region 133 and conductive bonding layer 127 because growth interfaces generally have more growth defects than bonding interfaces. It is undesirable to have growth defects between material transfer region 133 and conductive bonding layer 127 because a signal will experience more attenuation in response to flowing between material transfer region 133 and conductive bonding layer 127. Growth defects are discussed in more detail above with in FIG. 1c.

In FIGS. 7e and 7f, mask region 139 is positioned on material transfer region 133 so it is carried by support substrate 110 and interconnect region 120. Mask region 139 is bounded by an outer sidewall 142 which extends around its outer periphery. Mask region 139 can be positioned on material transfer region 133 in many different ways. In this embodiment, mask region 139 is deposited on material transfer region 133 so that mask region 139 covers material transfer region 133. In this embodiment, mask region 139 is deposited on material transfer region 133 so that material transfer region 133 extends between mask region 139 and conductive bonding layer 127. In this embodiment, outer sidewall 142 is proximate to outer sidewall 136.

In FIGS. 7e and 7f, mask region 139 is processed to remove portion 140 of it proximate to outer sidewall 142. As mentioned above, portion 140 extends annularly around the outer periphery of mask region 139 proximate to outer sidewall 142. Portion 140 can be removed in many different ways, such as by etching. The etching can be of many different types, such as wet and/or dry etching. In some embodiments, the portion of mask region 139 that is removed is chosen in response to positioning a hard mask on a surface 139b, wherein surface 139b is away from material transfer region 133. In this way, portion 140 is etched utilizing a hard mask.

In one embodiment, mask region 139 includes a photoresist material which is positioned on material transfer region 133 using conventional photoresist deposition techniques, such as spin-on-coating. In this embodiment, portion 140 is removed from material transfer region 133 using conventional photoresist development techniques.

In this embodiment, material transfer region 133 is processed to remove portion 141 (FIGS. 7e and 7f) of material transfer region 133, and mask region 139 is processed to remove it from surface 134b, as shown in FIG. 7g. As discussed in more detail above, portion 141 is proximate to outer sidewall 136 and is removed so that lip 114 is exposed, as indicated by indication arrows 192 and 193 (FIG. 5h). It should be noted that a portion of bonding interface 125 is exposed in response to removing portion 141 from material transfer region 133.

As mentioned above, portion 141 can be removed in many different ways, such as by etching. The etching can be of many different types, such as wet and/or dry etching. In this embodiment, mask region 139 is removed from material transfer region 133 to expose material transfer region surface 134b.

As mentioned above, etched sidewall 144 is formed in response to removing portion 141. In this embodiment, etched sidewall 126 is formed in response to removing portion 141, wherein etched sidewall 126 is a sidewall portion of conductive bonding layer 127. Etched sidewall 126 is shown and discussed in more detail above with FIG. 6h.

The stress of material transfer region 133 is adjusted in response to removing portion 141 of material transfer region 133 proximate to outer sidewall 129 so that lip 114 is exposed. In particular, the stress of material transfer region 133 is reduced in response to removing portion 141 of material transfer region 133 proximate to outer sidewall 129 so that lip 114 is exposed. The stress of material transfer region 133 is reduced because material transfer region 133 experiences less bowing in response to removing portion 141 proximate to outer sidewall 129. As mentioned above, material transfer region 133 experiences more bowing when portion 141 is not removed because lip 114 pushes upwardly on material transfer region 133.

FIG. 7h is a side view of bonded semiconductor structure 102 of FIG. 7g with capping layer 145 positioned on material transfer region 133 so it is carried by support substrate 110 and interconnect region 120. Capping layer is shown and discussed above with FIGS. 5i-5l and FIGS. 6i-6l.

In this embodiment, capping layer 145 includes portion 147 which extends along surface 134b so it covers material transfer region 133. Portion 147 covers surface 134b to restrict the flow of heat between outer surface 134b and bonding interface 125. Further, capping layer 145 includes portion 146 which extends between portion 147 and interconnect region 120. In particular, portion 146 extends between portion 147 and lip 114. Portion 146 covers lip 114 and the exposed portion of bonding interface 125, which includes etched sidewall 126. Portion 146 covers etched sidewall 126 of conductive bonding layer 127 to restrict the flow of debris therefrom. Portion 146 extends along sidewall 144 of material transfer region 133. Further, portion 146 extends along etched sidewall 126 of conductive bonding layer 127.

As mentioned above, capping layer 145 can include many different types of material. In this embodiment, capping layer 145 includes dielectric material. In some embodiments, capping layer 145 consists of dielectric material. In some embodiments, capping layer 145 consists essentially of dielectric material. The dielectric material of capping layer 145 can be of many different types, such as silicon dioxide and silicon nitride, among others. In some embodiments, the dielectric material of capping layer 145 is the same as the dielectric material of interconnect region and, in other embodiments, the dielectric material of capping layer 145 is different from the dielectric material of interconnect region 110. In one particular embodiment, the dielectric materials of interconnect region 110 and capping layer 145 include silicon dioxide. In another particular embodiment, the dielectric materials of interconnect region 110 and capping layer 145 include silicon dioxide and silicon nitride, respectively.

FIG. 7i is a side view of bonded semiconductor structure 102 of FIG. 7h with portion 147 removed from surface 134b. Portion 147 can be removed from surface 134b in many different ways, such as by using wet and/or dry etching. Portion 147 is removed from material transfer region 133 so that surface 134b is exposed.

In some embodiments, material transfer region 133 is processed to form a semiconductor device. The semiconductor device can be of many different types, such as a horizontally oriented semiconductor device and vertically oriented semiconductor device. In some embodiments, material transfer region 133 includes a stack of two semiconductor layers and the semiconductor device is a diode. In some embodiments, material transfer region 133 includes a stack of three semiconductor layers and the semiconductor device is a transistor. In some embodiments, material transfer region 133 includes a stack of four semiconductor layers and the semiconductor device is a transistor having a base support structure. In some embodiments, material transfer region 133 includes a stack of four semiconductor layers and the semiconductor device is a thyristor. More information regarding stacks of semiconductor layers and semiconductor devices can be found in the above-identified U.S. Patent and Patent Applications, which are incorporated herein by reference.

In this embodiment, material transfer region 133 is processed to form a vertically oriented semiconductor device having a base support structure. In this embodiment, material transfer region 133 includes a stack of four semiconductor layers. Material transfer region 133 is processed to form the vertically oriented semiconductor device by forming a mesa structure which is carried by a base support structure. In general, material transfer region 133 is processed to form one or more vertically oriented semiconductor structures, and the number of mesa structures corresponds to the number of vertically oriented semiconductor structures. It should be noted that the mesa structures and base support structure include portions of material transfer region 133. More information regarding vertically oriented semiconductor devices having a base support structure can be found in the above referenced U.S. patent application Ser. No. 11/180,286.

FIG. 7j is a side view of a portion of bonded semiconductor structure 102 of FIG. 7i illustrating an embodiment in which material transfer region 133 is processed to form twelve mesa structures which are carried by a base support structure. In this embodiment, material transfer region 133 includes stack 150, wherein stack 150 includes four semiconductor layers 151, 152, 153 and 154. Semiconductor layers 151, 152, 153 are shown in more detail in FIG. 7b, and semiconductor layer 154 is adjacent to semiconductor layer 153 so that semiconductor layer 153 is between semiconductor layers 152 and 154.

In this embodiment, the mesa structures are denoted as mesa structures 158a, 158b, 158c, 158d, 158e, 158f, 158g, 158h, 158i, 158j, 158k and 158l, and the base support structure is denoted as a base support structure 154. It should be noted that the mesa structures and base support structure of FIG. 7j are shown in phantom. In this embodiment, base support structure 154 is coupled to interconnect region 120 through conductive bonding layer 127 and bonding interface 125. In this embodiment, mesa structures 158a, 158b, 158c, 158d, 158e, 158f, 158g, 158h, 158i, 158j, 158k and 158l extend away from conductive bonding layer 127 and bonding interface 125. In this embodiment, interconnect region 120 includes conductive line 122a which is in communication with conductive bonding layer 127.

FIG. 7k is a side view of a portion of bonded semiconductor structure 102 of FIG. 7i illustrating an embodiment in which material transfer region 133 is processed to form two mesa structures which are carried by a base support structure. In this embodiment, material transfer region 133 includes stack 150, wherein stack 150 includes four semiconductor layers 151, 152, 153 and 154. Semiconductor layers 151, 152, 153 are shown in more detail in FIG. 7b, and semiconductor layer 154 is adjacent to semiconductor layer 153 so that semiconductor layer 153 is between semiconductor layers 152 and 154.

In this embodiment, the mesa structures are denoted as mesa structures 158a and 158b, and the base support structure is denoted as base support structure 154. It should be noted that the mesa structures and base support structure of FIG. 7k are shown in phantom. In this embodiment, base support structure 154 is coupled to interconnect region 120 through conductive bonding layer 127 and bonding interface 125. In this embodiment, mesa structures 158a and 158b extend away from conductive bonding layer 127 and bonding interface 125. In this embodiment, interconnect region 120 includes conductive line 122a which is in communication with conductive bonding layer 127.

FIG. 7l is a side view of bonded semiconductor structure 102 of FIG. 7i, wherein material transfer region 133 has been processed to form mesa structures 158a and 158b carried by base support structure 154, as shown in FIG. 7k. In this embodiment, bonded semiconductor structure 102 is processed to form vertically oriented semiconductor devices 157a and 157b.

In this embodiment, vertically oriented semiconductor devices 157a and 157b include a dielectric material region 155 formed on mesa structures 158a and 158b and base support structure 154 (FIG. 7k). Dielectric material region 155 is processed so it surrounds mesa structures 158a and 158b. Portions of dielectric material region 155 proximate to mesa structures 158a and 158b operate as control dielectrics for vertically oriented semiconductor devices 157a and 157b, as will be discussed in more detail below.

It should be noted that mesa structure 158a includes semiconductor layers 151a, 152a and 153a, wherein semiconductor layers 151a, 152a and 153a are corresponding portions of semiconductor layers 151, 152 and 153 that are not etched away. Further, it should be noted that mesa structure 158b includes semiconductor layers 151b, 152b and 153ba, wherein semiconductor layers 151b, 152b and 153b are corresponding portions of semiconductor layers 151, 152 and 153 that are not etched away.

In this embodiment, vertically oriented semiconductor devices 157a and 157b include a control terminal 156 formed on dielectric material region 155. Control terminal 156 is processed so it surrounds mesa structures 158a and 158b and is spaced apart from mesa structures 158a and 158b. Portions of control terminal 156 proximate to mesa structures 158a and 158b operate as control terminals for vertically oriented semiconductor devices 157a and 157b, as will be discussed in more detail below. It should be noted that, in some embodiments, control terminal 156 operates as a word line. Further, in some embodiments, control terminal 156 is in communication with electronic circuit 108, wherein electronic circuit 108 provides a control signal thereto.

FIG. 7m is a side view of bonded semiconductor structure 102 of FIG. 7l, wherein a mask region 139 is formed on vertically oriented semiconductor devices 157a and 157b. Mask region 139 can include many different types of materials, such as a photoresist. In this embodiment, mask region 139 is processed to form a trench 138, wherein trench 138 extends between mesa structures 158a and 158b. Trench 138 can be formed in many different ways, such as by using wet and/or dry etching. In this embodiment trench 138 is positioned so that a connection can be made to conductive line 122b, as will be discussed in more detail presently.

In this embodiment, portions of control terminal 156, dielectric material region 155, base support structure 154, conductive bonding layer 127 and dielectric material region 121 between trench 138 and conductive line 122b are etched to form a trench 138a, as shown in FIG. 7n, and mask region 139 is removed.

In this embodiment, control terminals 156a and 156b are formed in response to forming trench 138a through control terminal 156, wherein control terminals 156a and 156b are portions of control terminal 156 that are not etched away. In this embodiment, trench 138a extends between control terminals 156a and 156b and conductive line 122b.

In this embodiment, vertically oriented semiconductor device 157a includes control terminal 156a. Control terminal 156a is electrically coupled to mesa structure 158a. In particular, control terminal 156a is electrically coupled to device structure layer 152a.

In this embodiment, vertically oriented semiconductor device 157b includes control terminal 156b. Control terminal 156b is electrically coupled to mesa structure 158b. In particular, control terminal 156b is electrically coupled to device structure layer 152b.

It should be noted that, in some embodiments, control terminals 156a and/or 156b operate as word lines. Further, in some embodiments, control terminal 156a is in communication with electronic circuit 108, wherein electronic circuit 108 provides a first control signal thereto. In some embodiments, control terminal 156b is in communication with electronic circuit 108, wherein electronic circuit 108 provides a second control signal thereto.

In this embodiment, conductive bonding layers 127a and 127b are formed in response to forming trench 138a through conductive bonding layers 127, wherein conductive bonding layers 127a and 127b are portions of conductive bonding layers 127 that are not etched away. In this embodiment, trench 138a extends between conductive bonding layers 127a and 127b. In this embodiment, conductive bonding layer 127a extends between base support structure 154a and interconnect region 120. Further, conductive bonding layer 127b extends between base support structure 154b and interconnect region 120. It should be noted that capping layer sidewall portion 146 covers etched sidewalls 126a and 126b of conductive bonding layers 127a and 127b, respectively, wherein etched sidewalls 126a and 126b are portions of etched sidewall 126. Capping layer sidewall portion 146 covers etched sidewalls 126a and 126b to restrict the flow of debris therefrom.

In this embodiment, bonding interfaces 125a and 125b are formed in response to forming trench 138a through bonding interface 125, wherein bonding interfaces 125a and 125b are portions of bonding interface 125 that are not etched away. In this embodiment, trench 138a extends between bonding interfaces 125a and 125b. In this embodiment, bonding interface 125a extends between base support structure 154a and interconnect region 120. Further, bonding interfaces 125b extends between base support structure 154b and interconnect region 120.

FIG. 7o is a side view of bonded semiconductor structure 102 of FIG. 7n, wherein a dielectric material region 170 is formed on vertically oriented semiconductor devices 157a and 157b. In this embodiment, a portion of dielectric material region 170 extends through trench 138a and covers conductive line 122b.

In this embodiment, bonded semiconductor structure 102 is processed to form a conductive via 171 which extends through dielectric material region 170 between control terminal 156a and a surface 170a of dielectric material region 170. Conductive via 171 is formed by etching through dielectric material region 170 and depositing the material of conductive via 171 therein.

In this embodiment, bonded semiconductor structure 102 is processed to form a conductive via 172 which extends through dielectric material region 170 between mesa structure 158a and surface 170a of dielectric material region 170. In particular, conductive via 172 extends through dielectric material region 170 between device structure layer 151a and surface 170a of dielectric material region 170. Conductive via 172 is formed by etching through dielectric material region 170 and depositing the material of conductive via 172 therein.

In this embodiment, bonded semiconductor structure 102 is processed to form a conductive via 173 which extends through dielectric material regions 121 and 170 between conductive line 122b and surface 170a of dielectric material region 170. Conductive via 173 is formed by etching through dielectric material regions 121 and 170 and depositing the material of conductive via 173 therein.

In this embodiment, bonded semiconductor structure 102 is processed to form a conductive via 174 which extends through dielectric material region 170 between mesa structure 158b and surface 170a of dielectric material region 170. In particular, conductive via 174 extends through dielectric material region 170 between device structure layer 151b and surface 170a of dielectric material region 170. Conductive via 174 is formed by etching through dielectric material region 170 and depositing the material of conductive via 174 therein.

In this embodiment, bonded semiconductor structure 102 is processed to form a conductive contact 175, which is in communication with conductive via 171. In this embodiment, conductive contact 175 is formed on surface 170a of interconnect region 170. Conductive contact 175 is in communication with control terminal 156a through conductive via 171. It should be noted that, in some embodiments, conductive contact 175 is in communication with electronic circuit 108 through dielectric material regions 121 and 170.

In this embodiment, the conductivity of mesa structure 158a is adjustable in response to adjusting a signal provided to conductive contact 175. In particular, the conductivity of device structure layer 152a is adjustable in response to adjusting the signal provided to conductive contact 175.

In this embodiment, a current flow through mesa structure 158a is adjustable in response to adjusting the signal provided to conductive contact 175. In particular, the current flow through device structure layers 151a, 152a and 153a is adjustable in response to adjusting the signal provided to conductive contact 175.

In this embodiment, a current flow through base support structure 154a is adjustable in response to adjusting the signal provided to conductive contact 175. Further, the current flow through device structure layers 151a, 152a and 153a and base support structure 154a is adjustable in response to adjusting the signal provided to conductive contact 175.

In this embodiment, a current flow through base support structure 154a is adjustable in response to adjusting the signal provided to conductive contact 175. Further, the current flow through device structure layers 151a, 152a and 153a and base support structure 154a is adjustable in response to adjusting the signal provided to conductive contact 175.

In this embodiment, a current flow through conductive bonding layer 127a is adjustable in response to adjusting the signal provided to conductive contact 175. Further, the current flow through conductive bonding layer 127a and bonding interface 125a is adjustable in response to adjusting the signal provided to conductive contact 175.

In this embodiment, a current flow through bonding interface 125a and conductive line 122a is adjustable in response to adjusting the signal provided to conductive contact 175. In this embodiment, a current flow through bonding interface 125a and transistor 115a is adjustable in response to adjusting the signal provided to conductive contact 175.

In this embodiment, bonded semiconductor structure 102 is processed to form a conductive contact 176, which is in communication with conductive via 172. In this embodiment, conductive contact 176 is formed on surface 170a of interconnect region 170. Conductive contact 176 is in communication with mesa structure 158a through conductive via 172. In particular, conductive contact 176 is in communication with device structure layer 151a through conductive via 172.

In this embodiment, conductive contact 176 is in communication with conductive bonding layer 127a through mesa structure 158a. In this embodiment, conductive contact 176 is in communication with conductive bonding layer 127a through mesa structure 158a and base support structure 154a. In this embodiment, conductive contact 176 is in communication with conductive bonding layer 127a through mesa structure 158a, base support structure 154a and bonding interface 125a.

In this embodiment, conductive contact 176 is in communication with conductive line 122a through mesa structure 158a. In this embodiment, conductive contact 176 is in communication with conductive line 122a through mesa structure 158a and base support structure 154a. In this embodiment, conductive contact 176 is in communication with conductive line 122a through mesa structure 158a, base support structure 154a and bonding interface 125a. In this embodiment, conductive contact 176 is in communication with conductive line 122a through mesa structure 158a, base support structure 154a, bonding interface 125a and conductive bonding layer 127a.

In this embodiment, conductive contact 176 is in communication with transistor 115a through mesa structure 158a. In this embodiment, conductive contact 176 is in communication with transistor 115a through mesa structure 158a and base support structure 154a. In this embodiment, conductive contact 176 is in communication with transistor 115a through mesa structure 158a, base support structure 154a and bonding interface 125a. In this embodiment, conductive contact 176 is in communication with transistor 115a through mesa structure 158a, base support structure 154a, bonding interface 125a and conductive bonding layer 127a. In this embodiment, conductive contact 176 is in communication with transistor 115a through mesa structure 158a, base support structure 154a, bonding interface 125a, conductive bonding layer 127a and conductive line 122a. In this embodiment, conductive contact 176 is in communication with source 116a through mesa structure 158a and base support structure 154a. In this embodiment, conductive contact 176 is in communication with source 116a through mesa structure 158a, base support structure 154a and bonding interface 125a. In this embodiment, conductive contact 176 is in communication with source 116a through mesa structure 158a, base support structure 154a, bonding interface 125a and conductive bonding layer 127a. In this embodiment, conductive contact 176 is in communication with source 116a through mesa structure 158a, base support structure 154a, bonding interface 125a, conductive bonding layer 127a and conductive line 122a.

In this embodiment, bonded semiconductor structure 102 is processed to form a conductive contact 177, which is in communication with conductive via 173. In this embodiment, conductive contact 177 is formed on surface 170a of interconnect region 170. Conductive contact 177 is in communication with transistor 115c through conductive via 173 and conductive line 122b. In particular, conductive contact 177 is in communication with control terminal 119c through conductive via 173 and conductive line 122b. In this embodiment, the conductivity of well region 112 between source 116c and drain 117c is adjustable in response to adjusting a signal provided to conductive contact 177.

In this embodiment, bonded semiconductor structure 102 is processed to form a conductive contact 178, which is in communication with conductive via 174. In this embodiment, conductive contact 178 is formed on surface 170a of interconnect region 170. Conductive contact 178 is in communication with mesa structure 158b through conductive via 174. In particular, conductive contact 178 is in communication with device structure layer 151b through conductive via 174.

In this embodiment, conductive contact 178 is in communication with conductive bonding layer 127b through mesa structure 158b. In this embodiment, conductive contact 178 is in communication with conductive bonding layer 127b through mesa structure 158b and base support structure 154b. In this embodiment, conductive contact 178 is in communication with conductive bonding layer 127b through mesa structure 158b, base support structure 154b and bonding interface 125b. In this embodiment, conductive contact 178 is in communication with conductive line 122b through mesa structure 158b. In this embodiment, conductive contact 178 is in communication with conductive line 122b through mesa structure 158b and base support structure 154b. In this embodiment, conductive contact 178 is in communication with conductive line 122b through mesa structure 158b, base support structure 154b and bonding interface 125b. In this embodiment, conductive contact 178 is in communication with conductive line 122b through mesa structure 158b, base support structure 154a, bonding interface 125b and conductive bonding layer 127b.

In this embodiment, conductive contact 178 is in communication with transistor 115b through mesa structure 158b. In this embodiment, conductive contact 178 is in communication with transistor 115b through mesa structure 158b and base support structure 154a. In this embodiment, conductive contact 178 is in communication with transistor 115b through mesa structure 158b, base support structure 154b and bonding interface 125b. In this embodiment, conductive contact 178 is in communication with transistor 115b through mesa structure 158b, base support structure 154b, bonding interface 125ba and conductive bonding layer 127b. In this embodiment, conductive contact 178 is in communication with transistor 115b through mesa structure 158b, base support structure 154b, bonding interface 125b, conductive bonding layer 127b and conductive line 122b. In this embodiment, conductive contact 178 is in communication with source 116b through mesa structure 158b and base support structure 154b. In this embodiment, conductive contact 178 is in communication with source 116b through mesa structure 158b, base support structure 154b and bonding interface 125b. In this embodiment, conductive contact 178 is in communication with source 116b through mesa structure 158b, base support structure 154b, bonding interface 125b and conductive bonding layer 127b. In this embodiment, conductive contact 178 is in communication with source 116b through mesa structure 158b, base support structure 154b, bonding interface 125b, conductive bonding layer 127b and conductive line 122b.

Figure 8B:
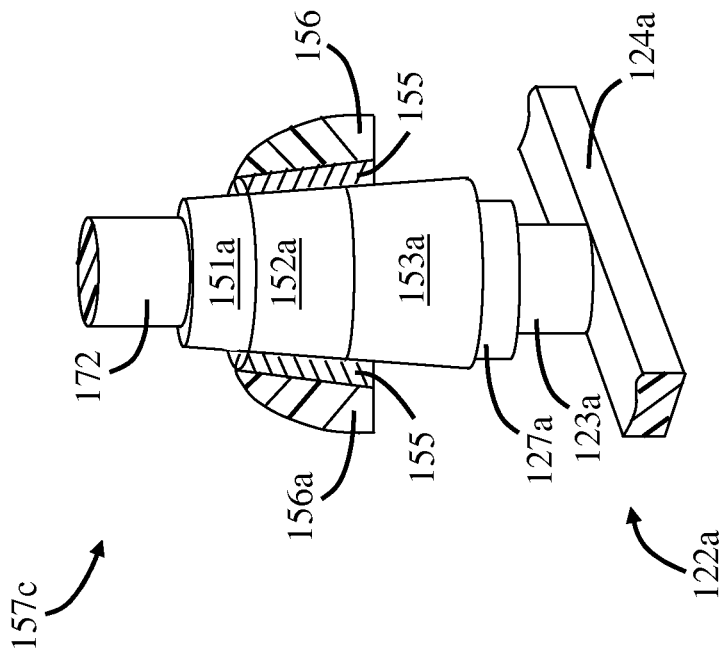
FIGS. 8a and 8b are views of one embodiment of a vertically oriented semiconductor device which can be included with the bonded semiconductor structures disclosed herein.
Figure 8A:
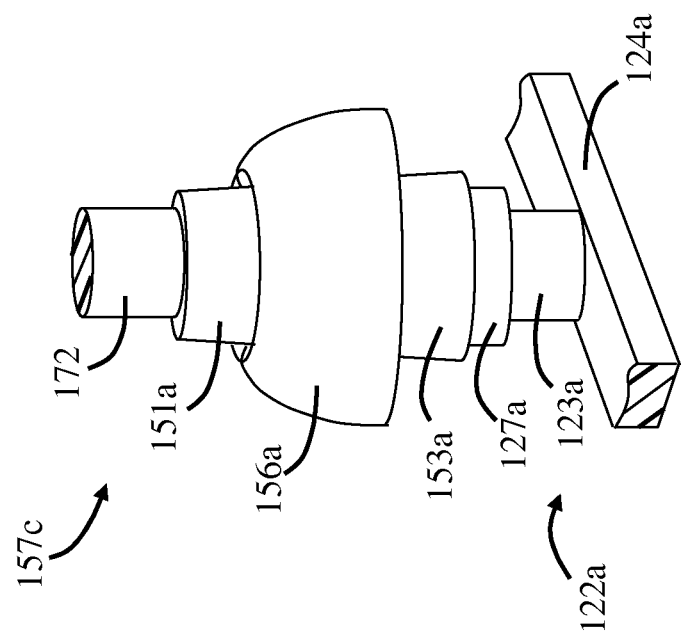

FIGS. 8a and 8b are views of another embodiment of a vertically oriented semiconductor device, which is denoted as vertically oriented semiconductor device 157c. It should be noted that vertically oriented semiconductor device 157c can be included with the bonded semiconductor structures disclosed herein.

In the embodiment of FIGS. 8a and 8b, vertically oriented semiconductor device 157c is the same as that show in FIG. 7n without base support structure 154a. In this embodiment, vertically oriented semiconductor device 157c operates as a metal oxide semiconductor field effect transistor (MOSFET). More information regarding manufacturing vertically oriented semiconductor device 154*c* can be found in the above-identified U.S. Patent and Patent Applications, which are incorporated herein by reference.

FIGS. 9*a*-9*h* are views of steps of manufacturing a bonded semiconductor structure 103. More information regarding manufacturing bonded semiconductor structures can be found in the above-identified U.S. Patent and Patent Applications, which are incorporated herein by reference.

Figure 9A:
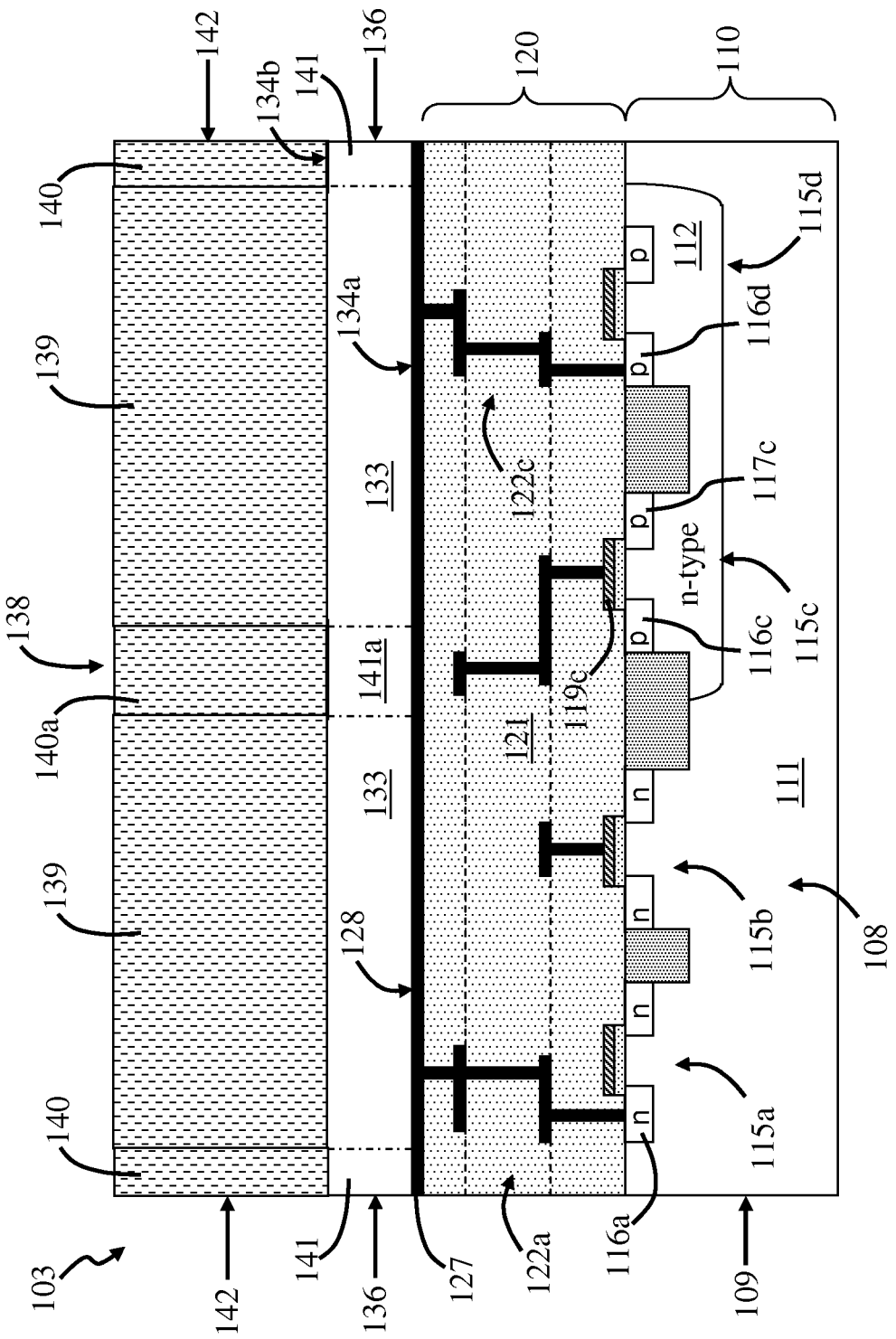

As shown in FIG. 9*a*, bonded semiconductor structure 103 includes interconnect region 120 carried by support substrate 110. In this embodiment, bonded semiconductor structure 103 includes conductive bonding layer 127 carried by interconnect region 120. Information regarding support substrate 110, interconnect region 120 and conductive bonding layer 127 is provided in more detail above.

In this embodiment, material transfer region 133 is coupled to interconnect region 120 so it is carried by support substrate 110. Material transfer region 133 can be coupled to interconnect region 120 in many different ways. In this embodiment, material transfer region 133 is coupled to interconnect region 120 through bonding. In this way, semiconductor structure 103 is a bonded semiconductor structure. More information regarding coupling material transfer region 133 to interconnect region 120 is discussed in more detail above with FIGS. 7*c* and 7*d*.

Bonding interface 125 is formed in response to coupling material transfer region 133 to interconnect region 120 through bonding. In this embodiment, bonding interface 125 is formed between dielectric material region surface 121*a* and a material transfer region surface 134*a* of material transfer region 133. Material transfer region surface 134*a* faces support substrate 110 and interconnect region 120. Bonding interface 125 can be of many different types, such as those mentioned above. It should be noted that bonding interface 125 is not a growth interface.

In this embodiment, material transfer region 133 is positioned so interconnect region 120 extends between support substrate 110 and material transfer region 133. It should be noted that material transfer region 133 can include many different types of materials, such as those discussed in more detail above. In this embodiment, material transfer region 133 includes stack 150 of semiconductor material layers, as will be discussed in more detail below. More information regarding material transfer region 133 and bonding can be found in the above-identified U.S. Patent and Patent Applications, which are incorporated herein by reference.

In this embodiment, mask region 139 is positioned on material transfer region 133 so it is carried by support substrate 110 and interconnect region 120. Mask region 139 can be positioned on material transfer region 133 in many different ways. In this embodiment, mask region 139 is deposited on material transfer region 133 so that mask region 139 covers material transfer region 133. In this embodiment, mask region 139 is deposited on material transfer region 133 so that material transfer region 133 extends between mask region 139 and conductive bonding layer 127.

Figure 9B:
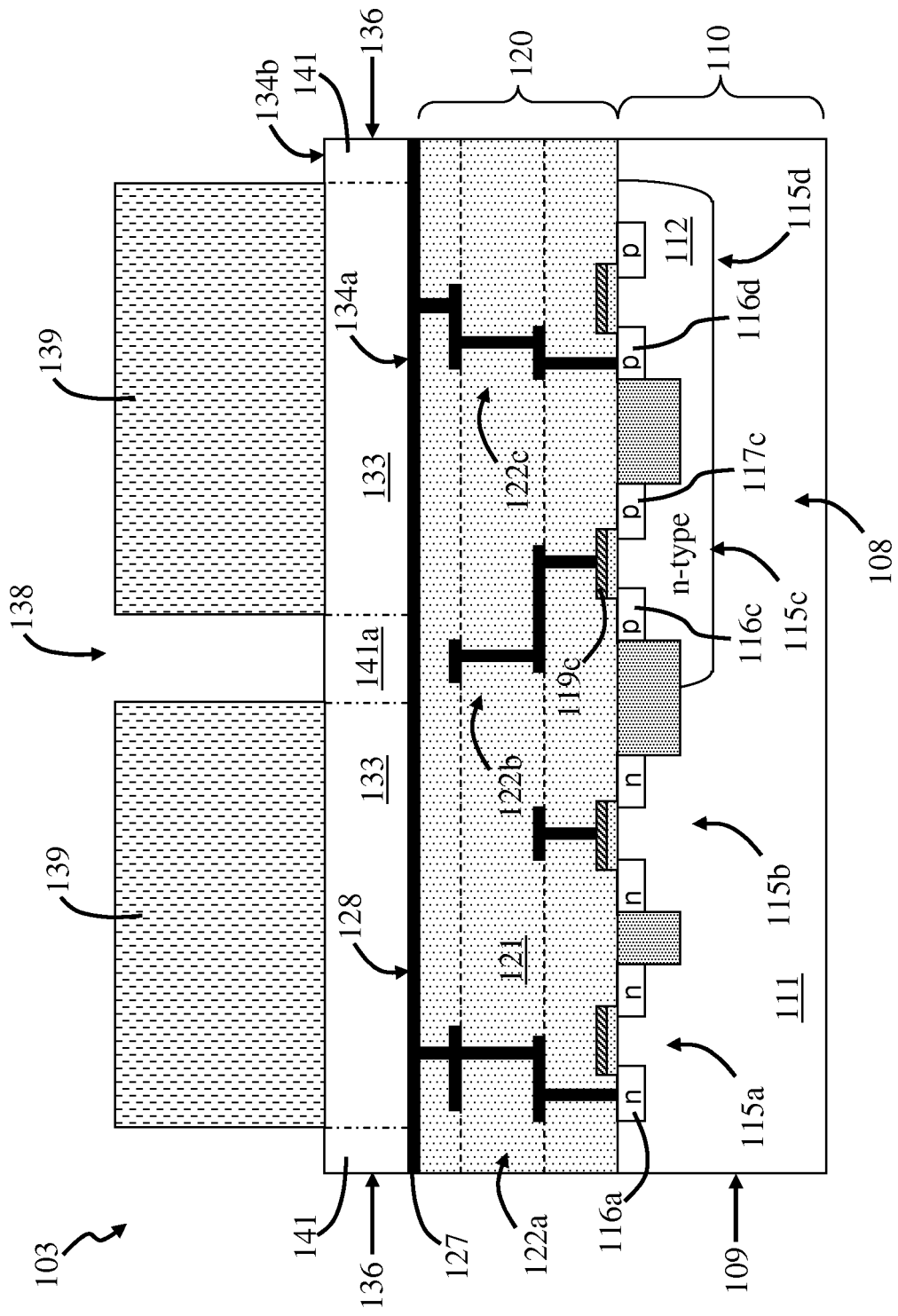

As shown in FIGS. 9*a* and 9*b*, mask region 139 is processed to remove portion 140 of it proximate to outer sidewall 142. As mentioned above, portion 140 extends annularly around the outer periphery of mask region 139 proximate to outer sidewall 142. Further, portion 140 extends to surface 134*b* of material transfer region 133. Portion 140 can be removed in many different ways, such as by etching. The etching can be of many different types, such as wet and/or dry etching. In some embodiments, the portion of mask region 139 that is removed is chosen in response to positioning a mask on a surface 139*b*, wherein surface 139*b* is away from material transfer region 133. In this way, portion 140 is etched utilizing a mask.

As shown in FIGS. 9*a* and 9*b*, mask region 139 is processed to remove portion 140*a* of it to form trench 138. Portion 140*a* extends to surface 134*b* of material transfer region 133. In this embodiment, trench 138 is aligned with conductive line 122*b* so that a connection can be made to it, as discussed above with FIGS. 7*l*-7*o*.

In one embodiment, mask region 139 includes a photoresist material which is positioned on material transfer region 133 using conventional photoresist deposition techniques, such as spin-on-coating. In this embodiment, portions 140 and 140*a* are removed from material transfer region 133 using conventional photoresist development techniques.

Figure 9C:
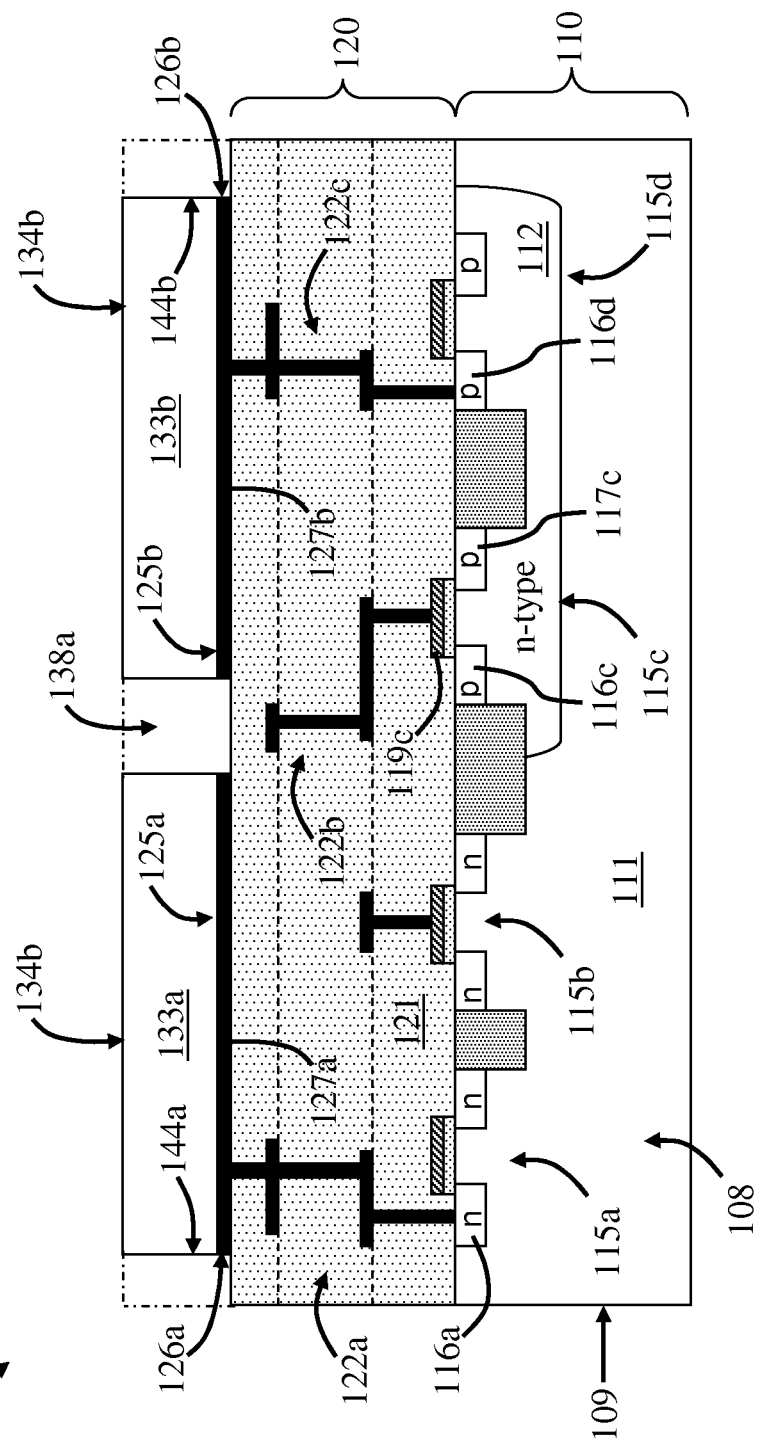

As shown in FIGS. 9*b* and 9*c*, mask region 139 is used to selectively etch through material transfer region 133. In this embodiment, material transfer region 133 is processed to remove portions 141 and 141*a* of material transfer region 133, and mask region 139 is processed to remove it from surface 134*b*. As discussed in more detail above, portion 141 is proximate to outer sidewall 136 and is removed so that lip 114 is exposed, as indicated by indication arrows 192 and 193 (FIG. 5*h*). Portion 141*a* is between trench 138*a* and conductive bonding layer 127. It should be noted that a portion of bonding interface 125 is exposed in response to removing portions 141 and 141*a* from material transfer region 133.

In this embodiment, material transfer regions 133*a* and 133*b* are formed in response to removing portions 141 and 141*a* from material transfer region 133, wherein material transfer regions 133*a* and 133*b* are portions of material transfer regions 133 that are not etched away. It should be noted that material transfer regions 133*a* and 133*b* include portions of stack 150 of semiconductor material layers. Hence, material transfer regions 133*a* and 133*b* include portions of device structure layers, such as device structure layers 151, 152, 153, 154, etc.

Further, conductive bonding layers 127*a* and 127*b* are formed in response to forming trench 138*a* through conductive bonding layer 127. Conductive bonding layers 127*a* and 127*b* are portions of conductive bonding layer 127 that are not etched away. In this embodiment, trench 138*a* extends between material transfer regions 133*a* and 133*b*. Further, trench 138*a* extends between conductive bonding layers 127*a* and 127*b*. In this embodiment, conductive bonding layer 127*a* extends between material transfer region 133*a* and interconnect region 120. Further, conductive bonding layer 127*b* extends between material transfer regions 133*b* and interconnect region 120.

In this embodiment, bonding interfaces 125*a* and 125*b* are formed in response to forming trench 138*a* through bonding interface 125, wherein bonding interfaces 125*a* and 125*b* are portions of bonding interface 125 that are not etched away. In this embodiment, trench 138*a* extends between bonding interfaces 125*a* and 125*b*. In this embodiment, bonding interface 125*a* extends between base support structure 154*a* and interconnect region 120. Further, bonding interfaces 125*b* extends between base support structure 154*b* and interconnect region 120.

Portions 141 and 141*a* can be removed in many different ways, such as by etching. The etching can be of many different types, such as wet and/or dry etching. In this embodiment, mask region 139 is removed from material transfer region 133 to expose material transfer region surface 134*b*.

In this embodiment, an etched sidewall 144*a* is formed in response to removing portions 141 and 141*a*, wherein etched sidewall 144a extends around material transfer region 133a. Further, an etched sidewall 126a is formed in response to removing portions 141 and 141a, wherein etched sidewall 126a is a sidewall portion of conductive bonding layer 127a and extends around conductive bonding layer 127a.

In this embodiment, an etched sidewall 144b is formed in response to removing portions 141 and 141a, wherein etched sidewall 144b extends around material transfer region 133b. Further, an etched sidewall 126b is formed in response to removing portions 141 and 141a, wherein etched sidewall 126b is a sidewall portion of conductive bonding layer 127b and extends around conductive bonding layer 127b.

The stress of material transfer regions 133a and 133b is adjusted in response to removing portion 141 of material transfer region 133 proximate to outer sidewall 129 so that lip 114 is exposed. In particular, the stress of material transfer regions 133a and 133b is reduced in response to removing portion 141 of material transfer region 133 proximate to outer sidewall 129 so that lip 114 is exposed. The stress of material transfer regions 133a and 133b is reduced because they experience less bowing in response to removing portion 141 proximate to outer sidewall 129. As mentioned above, material transfer regions 133a and 133b experience more bowing when portion 141 is not removed because lip 114 pushes upwardly on material transfer regions 133a and 133b.

Figure 9D:
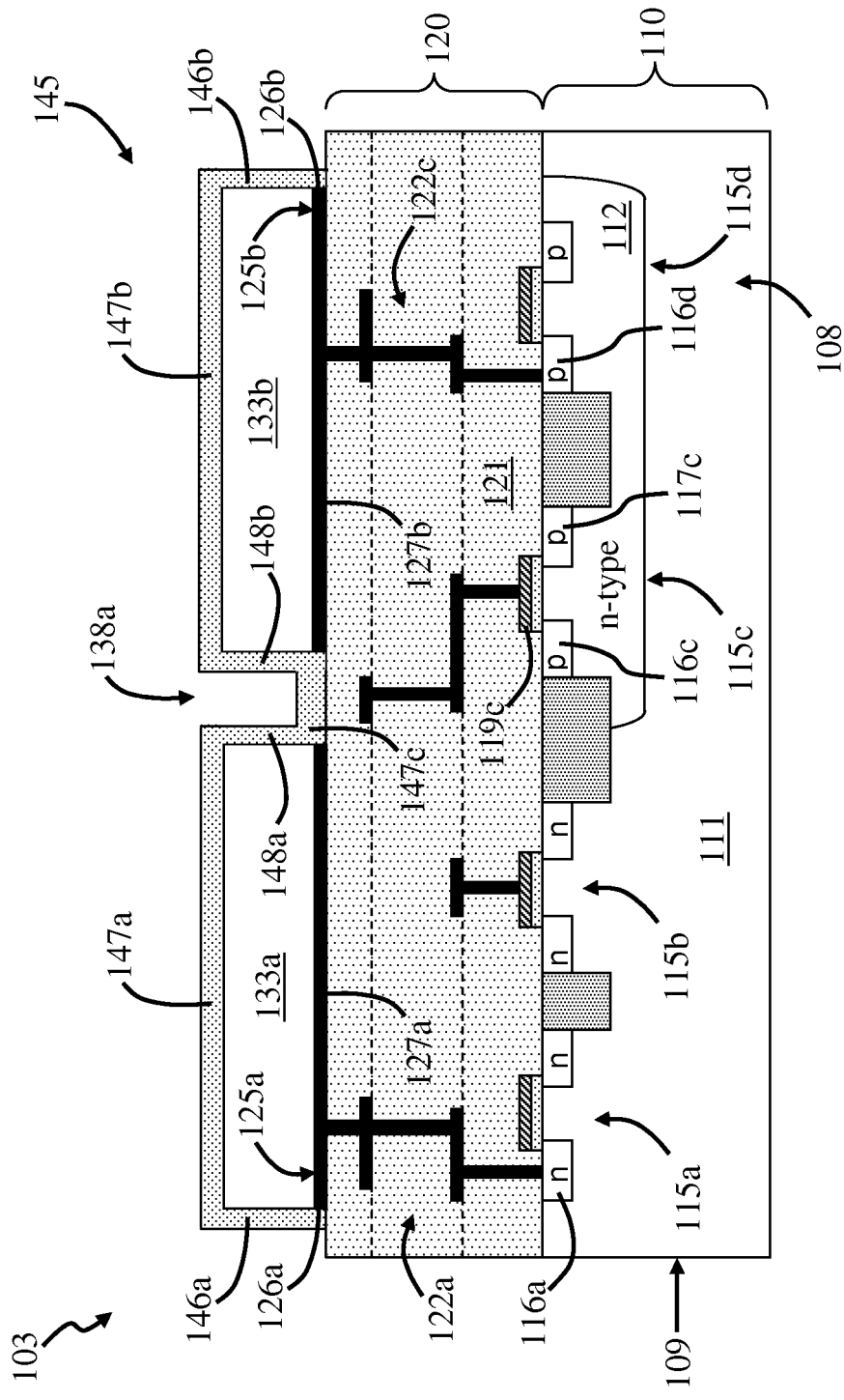

FIG. 9d is a side view of bonded semiconductor structure 103 of FIG. 9c with capping layer 145 positioned on material transfer region 133 so it is carried by support substrate 110 and interconnect region 120. In this embodiment, capping layer 145 includes portions 147a, 147b and 147c, wherein portion 147a extends along surface 134b of material transfer region 133a, portion 147b extends along surface 134b of material transfer region 133b and portion 147c extends through trench 138a and along surface 120b of interconnect region 120. It should be noted that portion 147c extends between conductive contact regions 127a and 127b and covers sidewalls 126a and 126b. In this way, portion 147c restricts the flow of debris from bonding layers 127a and 127b.

In this embodiment, capping layer 145 includes a portion 146a which extends between portion 147a and interconnect region 120, wherein portion 146a does not extend through trench 138a. It should be noted that portion 146a extends along sidewalls 144a and 126a. In this way, portion 146a restricts the flow of debris from bonding layer 127a.

In this embodiment, capping layer 145 includes a portion 146b which extends between portion 147b and interconnect region 120, wherein portion 146b does not extend through trench 138a. It should be noted that portion 146b extends along sidewalls 144b and 126b. In this way, portion 146a restricts the flow of debris from bonding layer 127b.

In this embodiment, capping layer 145 includes a portion 148a which extends between portion 147a and portion 147c, wherein portion 148a extends through trench 138a. It should be noted that portion 148a extends along sidewalls 144a and 126a.

In this embodiment, capping layer 145 includes a portion 148b which extends between portion 147b and portion 147c, wherein portion 148b extends through trench 138a. It should be noted that portion 148b extends along sidewalls 144b and 126b.

It should also be noted that portions 146a, 147c and 148a extend around conductive bonding region 127a, and restrict the flow of debris therefrom. Further, portions 146b, 147c and 148b extend around conductive bonding region 127b, and restrict the flow of debris therefrom.

As mentioned above, capping layer 145 can include many different types of material. In this embodiment, capping layer 145 includes dielectric material. In some embodiments, capping layer 145 consists of dielectric material. In some embodiments, capping layer 145 consists essentially of dielectric material. The dielectric material of capping layer 145 can be of many different types, such as silicon dioxide and silicon nitride, among others. In some embodiments, the dielectric material of capping layer 145 is the same as the dielectric material of interconnect region and, in other embodiments, the dielectric material of capping layer 145 is different from the dielectric material of interconnect region 110. In one particular embodiment, the dielectric materials of interconnect region 110 and capping layer 145 include silicon dioxide. In another particular embodiment, the dielectric materials of interconnect region 110 and capping layer 145 include silicon dioxide and silicon nitride, respectively.

Figure 9E:
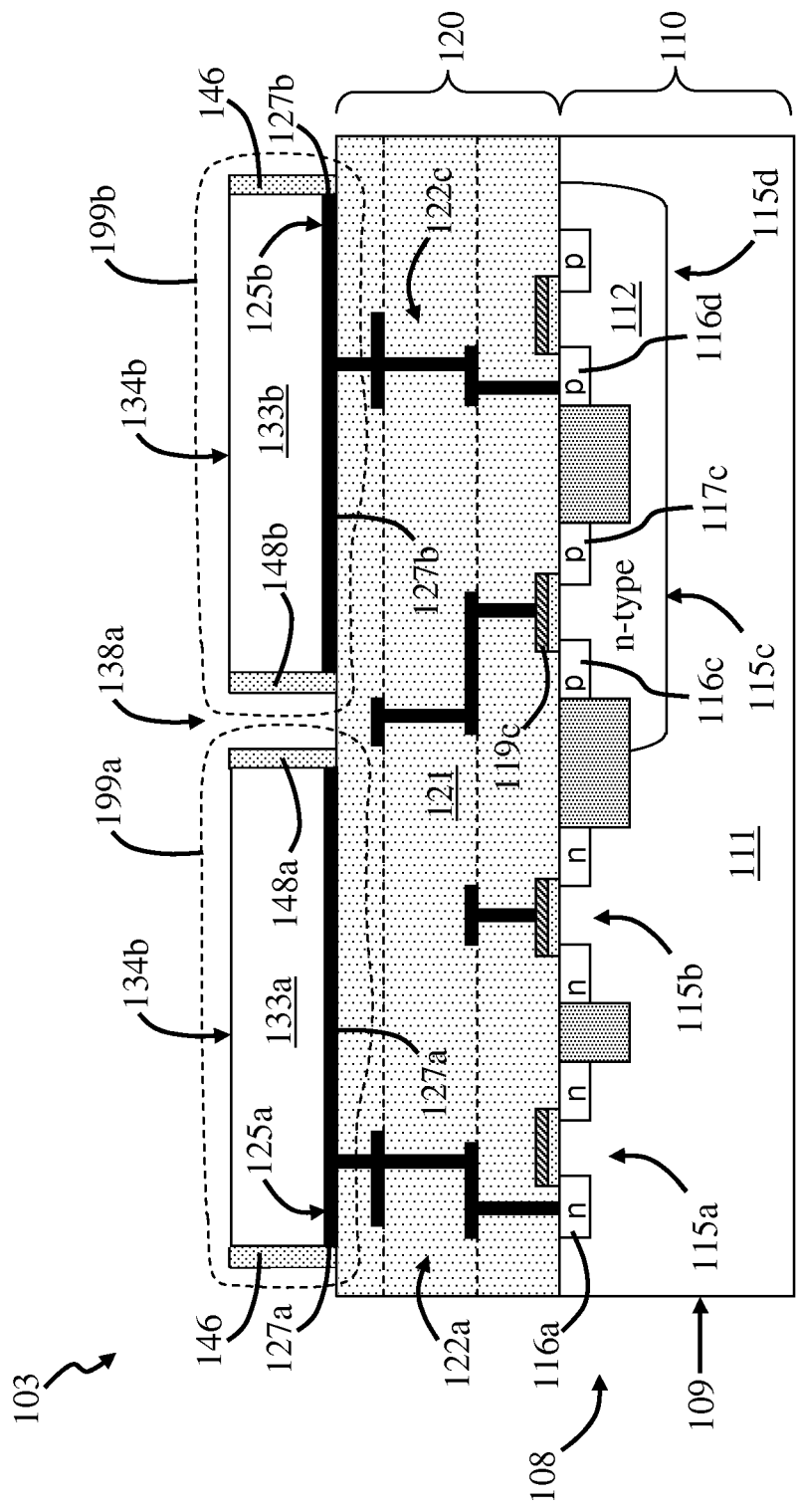

FIG. 9e is a side view of bonded semiconductor structure 103 of FIG. 9d with portions 147a and 147b removed from surfaces 134b of material transfer regions 133a and 133b, respectively. Portion 147a and 147b can be removed from surfaces 134b of material transfer regions 133a and 133b, respectively, in many different ways, such as by using wet and/or dry etching. Portions 147a and 147b are removed from material transfer regions 133a and 133b, respectively, so that respective surfaces 134b are exposed.

In some embodiments, material transfer regions 133a and 133b are processed to form a semiconductor device. The semiconductor device can be of many different types, such as a horizontally oriented semiconductor device and vertically oriented semiconductor device. In some embodiments, the vertically oriented semiconductor device includes a base support structure and, in other embodiments, the vertically oriented semiconductor device does not include a base support structure. More information regarding semiconductor devices can be found in the above-identified U.S. Patent and Patent Applications, which are incorporated herein by reference.

In this embodiment, material transfer regions 133a and 133b are processed to form vertically oriented semiconductor devices having corresponding base support structures. Material transfer regions 133a and 133b are processed to form the vertically oriented semiconductor devices by forming mesa structures which are carried by a corresponding base support structure. In general, material transfer regions 133a and 133b are processed to form one or more vertically oriented semiconductor structures, and the number of mesa structures corresponds to the number of vertically oriented semiconductor structures. It should be noted that the mesa structures and base support structure include portions of material transfer regions 133a and 133b. It should also be noted that mesa structures 133a and 133b can include a stack of device structure layers, as indicated by indication arrow 198 of FIG. 7b. More information regarding vertically oriented semiconductor devices having a base support structure can be found in the above referenced U.S. patent application Ser. No. 11/180,286.

Figure 9F:
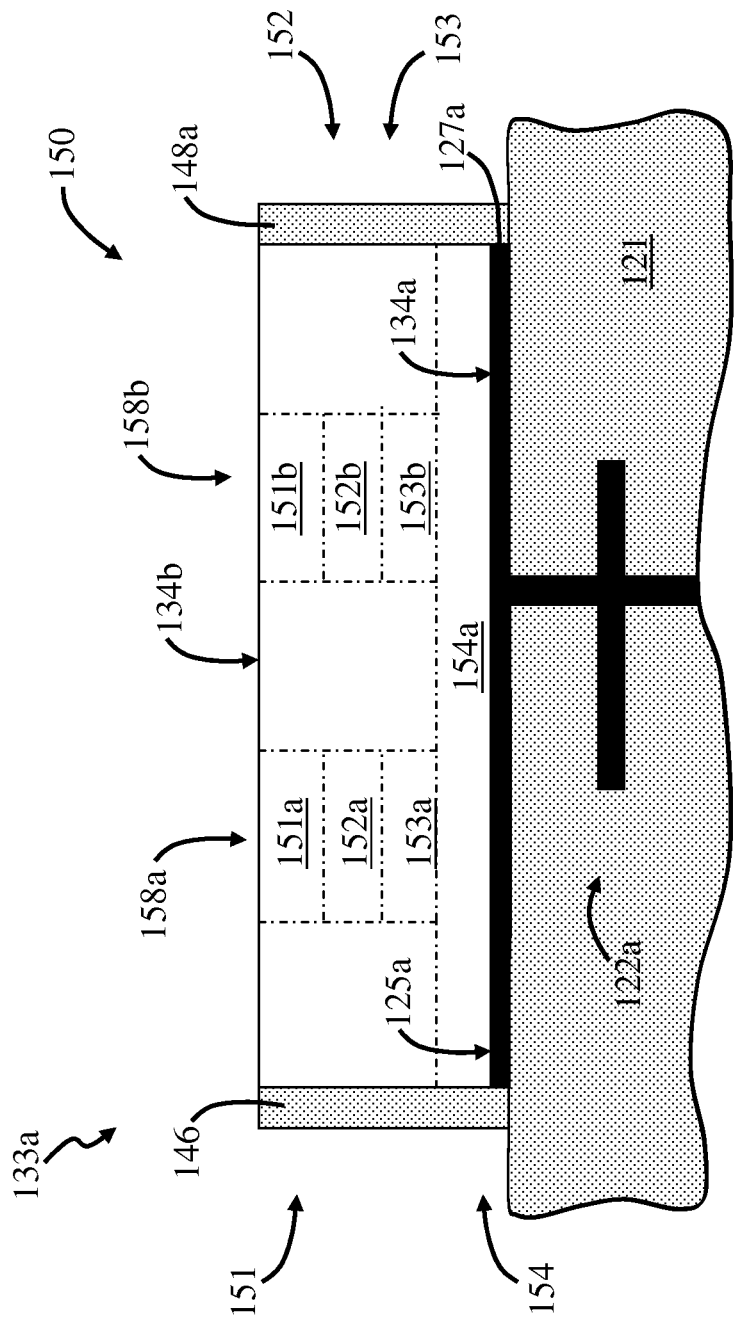

FIG. 9f is a side view of a portion of bonded semiconductor structure 103 of FIG. 9e in a region 199a. In this embodiment, material transfer region 133a includes stack 150, wherein stack 150 includes semiconductor layers 151, 152, 153 and 154, which are described in more detail above.

In this embodiment, material transfer region 133a is processed to form two mesa structures which are carried by a base support structure. In this embodiment, the mesa structures are denoted as mesa structures 158a and 158b, and the base support structure is denoted as a base support structure 154a. It should be noted that the mesa structures and base support structure of FIG. 9f are shown in phantom. The portions of semiconductor layers 151, 152 and 153 included with mesa structure 158a are denoted as semiconductor layers 151a, 152a and 153a. Further, the portions of semiconductor layers 151, 152 and 153 included with mesa structure 158b are denoted as semiconductor layers 151b, 152b and 153b. Base support structure 154a is a portion of semiconductor layer 154.

In this embodiment, base support structure 154a is coupled to interconnect region 120 through conductive bonding layer 127a and bonding interface 125a. In this embodiment, mesa structures 158a and 158b extend away from conductive bonding layer 127a and bonding interface 125a. In this embodiment, interconnect region 120 includes conductive line 122a which is in communication with conductive bonding layer 127a.

FIG. 9g is a side view of a portion of bonded semiconductor structure 103 of FIG. 9e in a region 199b. In this embodiment, material transfer region 133b includes stack 150, wherein stack 150 includes semiconductor layers 151, 152, 153 and 154, which are described in more detail above.

In this embodiment, material transfer region 133b is processed to form two mesa structures which are carried by a base support structure. In this embodiment, the mesa structures are denoted as mesa structures 158c and 158d, and the base support structure is denoted as a base support structure 154b. It should be noted that the mesa structures and base support structure of FIG. 9g are shown in phantom. The portions of semiconductor layers 151, 152 and 153 included with mesa structure 158c are denoted as semiconductor layers 151c, 152c and 153c. Further, the portions of semiconductor layers 151, 152 and 153 included with mesa structure 158d are denoted as semiconductor layers 151d, 152d and 153d. Base support structure 154b is a portion of semiconductor layer 154.

In this embodiment, base support structure 154b is coupled to interconnect region 120 through conductive bonding layer 127b and bonding interface 125b. In this embodiment, mesa structures 158c and 158d extend away from conductive bonding layer 127b and bonding interface 125b. In this embodiment, interconnect region 120 includes conductive line 122c which is in communication with conductive bonding layer 127b.

Figure 9H:
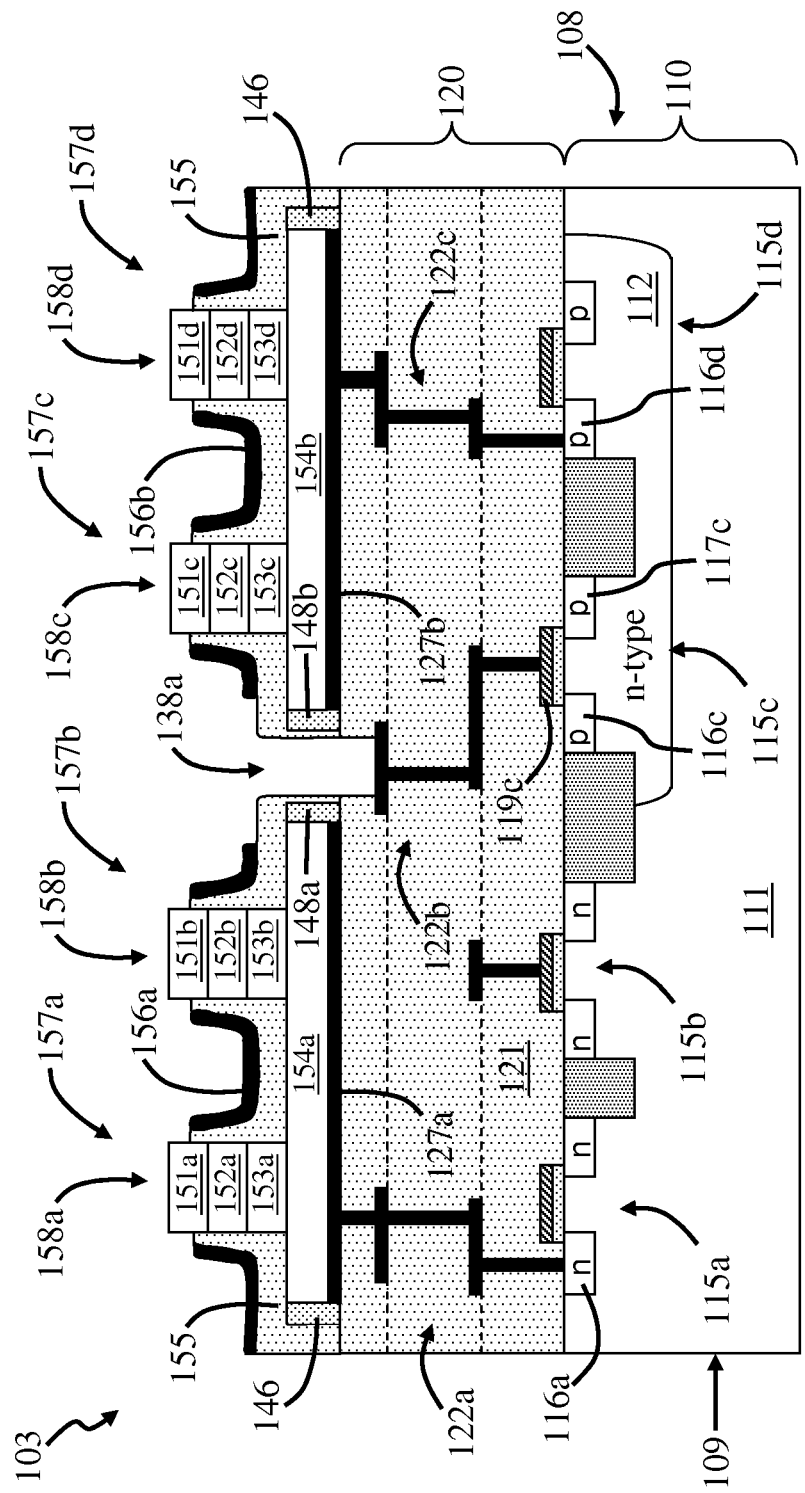

FIG. 9h is a side view of bonded semiconductor structure 103, wherein material transfer regions 133a and 133b of FIGS. 9e, 9f and 9g have been processed to form vertically oriented semiconductor devices 157a, 157b, 157c and 157d. It should be noted that material transfer regions 133a and 133b can be processed as described in more detail above with FIGS. 7a-7o.

In this embodiment, vertically oriented semiconductor devices 157a and 157b include mesa structures 158a and 158b, respectively. Vertically oriented semiconductor devices 157a and 157b include base support structure 154a, which carries mesa structures 158a and 158b. In this embodiment, vertically oriented semiconductor devices 157c and 157d include mesa structures 158c and 158d, respectively. Vertically oriented semiconductor devices 157c and 157d include base support structure 154b, which carries mesa structures 158c and 158d.

In this embodiment, vertically oriented semiconductor devices 157a and 157b include dielectric material region 155 formed on mesa structures 158a and 158b and base support structure 154a. Dielectric material region 155 is processed so it surrounds mesa structures 158a and 158b. Portions of dielectric material region 155 proximate to mesa structures 158a and 158b operate as control dielectrics for vertically oriented semiconductor devices 157a and 157b, as will be discussed in more detail below.

In this embodiment, vertically oriented semiconductor devices 157a and 157b include control terminal 156a formed on dielectric material region 155. Control terminal 156a is processed so it surrounds mesa structures 158a and 158b and is spaced apart from mesa structures 158a and 158b. Portions of control terminal 156a proximate to mesa structures 158a and 158b operate as control terminals for vertically oriented semiconductor devices 157a and 157b, as will be discussed in more detail below. It should be noted that, in some embodiments, the control terminal operates as a word line.

In this embodiment, vertically oriented semiconductor devices 157c and 157d include dielectric material region 155 formed on mesa structures 158c and 158d and base support structure 154ba. Dielectric material region 155 is processed so it surrounds mesa structures 158c and 158d. Portions of dielectric material region 155 proximate to mesa structures 158c and 158d operate as control dielectrics for vertically oriented semiconductor devices 157c and 157d, as will be discussed in more detail below.

In this embodiment, vertically oriented semiconductor devices 157c and 157d include control terminal 156b formed on dielectric material region 155. Control terminal 156b is processed so it surrounds mesa structures 158c and 158d and is spaced apart from mesa structures 158c and 158d. Portions of control terminal 156b proximate to mesa structures 158c and 158d operate as control terminals for vertically oriented semiconductor devices 157c and 157d, as will be discussed in more detail below. It should be noted that, in some embodiments, the control terminal operates as a word line.

Figure 9I:
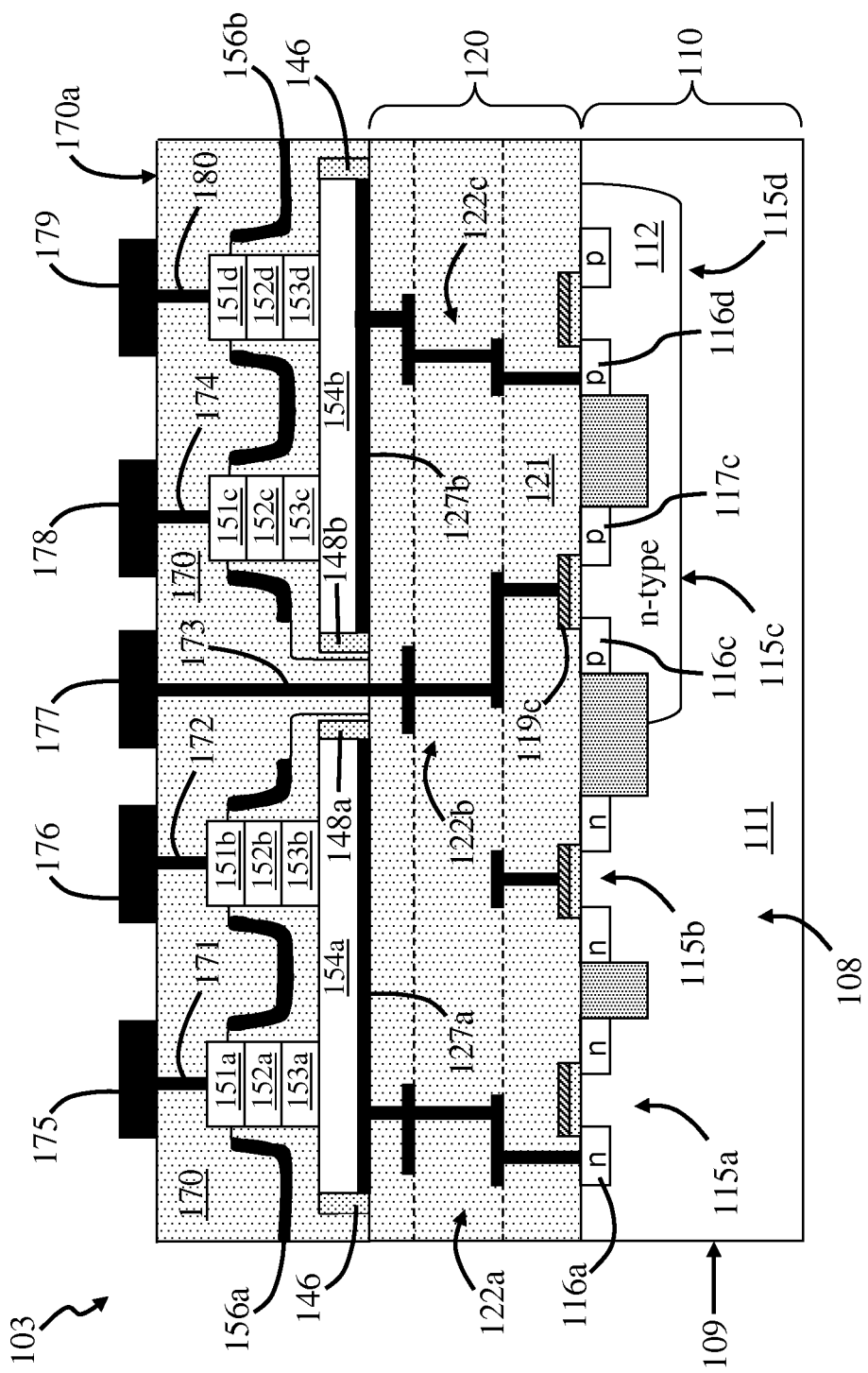

FIG. 9i is a side view of bonded semiconductor structure 103 of FIG. 9h, wherein a dielectric material region 170 is formed on vertically oriented semiconductor devices 157a, 157b, 157c and 157d. In this embodiment, a portion of dielectric material region 170 extends through trench 138a and covers conductive line 122b.

In this embodiment, bonded semiconductor structure 102 is processed to form conductive via 171 which extends through dielectric material region 170 between mesa structure 158a and surface 170a of dielectric material region 170. In particular, conductive via 171 extends through dielectric material region 170 between device structure layer 151a and surface 170a of dielectric material region 170. Conductive via 171 is formed by etching through dielectric material region 170 and depositing the material of conductive via 172 therein.

In this embodiment, bonded semiconductor structure 102 is processed to form conductive via 172 which extends through dielectric material region 170 between mesa structure 158b and surface 170a of dielectric material region 170. In particular, conductive via 172 extends through dielectric material region 170 between device structure layer 151b and surface 170a of dielectric material region 170. Conductive via 172 is formed by etching through dielectric material region 170 and depositing the material of conductive via 172 therein.

In this embodiment, bonded semiconductor structure 102 is processed to form conductive via 173 which extends through dielectric material regions 121 and 170 between conductive line 122b and surface 170a of dielectric material region 170. Conductive via 173 is formed by etching through dielectric material regions 121 and 170 and depositing the material of conductive via 173 therein.

In this embodiment, bonded semiconductor structure 102 is processed to form conductive via 174 which extends through dielectric material region 170 between mesa structure 158c and surface 170a of dielectric material region 170. In particular, conductive via 174 extends through dielectric material region 170 between device structure layer 151c and surface 170a of dielectric material region 170. Conductive via 174 is formed by etching through dielectric material region 170 and depositing the material of conductive via 174 therein.

In this embodiment, bonded semiconductor structure 102 is processed to form a conductive via 180 which extends through dielectric material region 170 between mesa structure 158d and surface 170a of dielectric material region 170. In particular, conductive via 180 extends through dielectric material region 170 between device structure layer 151d and surface 170a of dielectric material region 170. Conductive via 180 is formed by etching through dielectric material region 170 and depositing the material of conductive via 180 therein.

In this embodiment, bonded semiconductor structure 102 is processed to form conductive contact 175, which is in communication with conductive via 171. In this embodiment, conductive contact 175 is formed on surface 170a of interconnect region 170. Conductive contact 175 is in communication with control terminal 156a through conductive via 171. It should be noted that, in some embodiments, conductive contact 175 is in communication with electronic circuit 108 through dielectric material regions 121 and 170.

In this embodiment, the conductivity of mesa structure 158a is adjustable in response to adjusting a signal provided to control terminal 156a. In particular, the conductivity of device structure layer 152a is adjustable in response to adjusting the signal provided to control terminal 156a.

In this embodiment, a current flow through mesa structure 158a is adjustable in response to adjusting the signal provided to control terminal 156a. In particular, the current flow through device structure layers 151a, 152a and 153a is adjustable in response to adjusting the signal provided to control terminal 156a.

In this embodiment, a current flow through base support structure 154a is adjustable in response to adjusting the signal provided to control terminal 156a. Further, the current flow through device structure layers 151a, 152a and 153a and base support structure 154a is adjustable in response to adjusting the signal provided to control terminal 156a.

In this embodiment, a current flow through base support structure 154a is adjustable in response to adjusting the signal provided to control terminal 156a. Further, the current flow through device structure layers 151a, 152a and 153a and base support structure 154a is adjustable in response to adjusting the signal provided to control terminal 156a.

In this embodiment, a current flow through conductive bonding layer 127a is adjustable in response to adjusting the signal provided to control terminal 156a. Further, the current flow through conductive bonding layer 127a and bonding interface 125a is adjustable in response to adjusting the signal provided to control terminal 156a.

In this embodiment, a current flow through bonding interface 125a and conductive line 122a is adjustable in response to adjusting the signal provided to control terminal 156a. In this embodiment, a current flow through bonding interface 125a and transistor 115a is adjustable in response to adjusting the signal provided to control terminal 156a.

In this embodiment, bonded semiconductor structure 102 is processed to form conductive contact 176, which is in communication with conductive via 172. In this embodiment, conductive contact 176 is formed on surface 170a of interconnect region 170. Conductive contact 176 is in communication with mesa structure 158a through conductive via 172. In particular, conductive contact 176 is in communication with device structure layer 151b through conductive via 172. It should be noted that, in some embodiments, conductive contact 176 is in communication with electronic circuit 108 through dielectric material regions 121 and 170.

In this embodiment, conductive contact 176 is in communication with conductive bonding layer 127a through mesa structure 158b. In this embodiment, conductive contact 176 is in communication with conductive bonding layer 127a through mesa structure 158b and base support structure 154a. In this embodiment, conductive contact 176 is in communication with conductive bonding layer 127a through mesa structure 158b, base support structure 154a and bonding interface 125a.

In this embodiment, conductive contact 176 is in communication with conductive line 122a through mesa structure 158b. In this embodiment, conductive contact 176 is in communication with conductive line 122a through mesa structure 158b and base support structure 154a. In this embodiment, conductive contact 176 is in communication with conductive line 122a through mesa structure 158b, base support structure 154a and bonding interface 125a. In this embodiment, conductive contact 176 is in communication with conductive line 122a through mesa structure 158b, base support structure 154a, bonding interface 125a and conductive bonding layer 127a.

In this embodiment, conductive contact 176 is in communication with transistor 115a through mesa structure 158b. In this embodiment, conductive contact 176 is in communication with transistor 115a through mesa structure 158b and base support structure 154a. In this embodiment, conductive contact 176 is in communication with transistor 115a through mesa structure 158b, base support structure 154a and bonding interface 125a. In this embodiment, conductive contact 176 is in communication with transistor 115a through mesa structure 158b, base support structure 154a, bonding interface 125a and conductive bonding layer 127a. In this embodiment, conductive contact 176 is in communication with transistor 115a through mesa structure 158b, base support structure 154a, bonding interface 125a, conductive bonding layer 127a and conductive line 122a.

In this embodiment, conductive contact 176 is in communication with source 116a through mesa structure 158b and base support structure 154a. In this embodiment, conductive contact 176 is in communication with source 116a through mesa structure 158b, base support structure 154a and bonding interface 125a. In this embodiment, conductive contact 176 is in communication with source 116a through mesa structure 158b, base support structure 154a, bonding interface 125a and conductive bonding layer 127a. In this embodiment, conductive contact 176 is in communication with source 116a through mesa structure 158b, base support structure 154a, bonding interface 125a, conductive bonding layer 127a and conductive line 122a.

In this embodiment, bonded semiconductor structure 102 is processed to form conductive contact 177, which is in communication with conductive via 173. In this embodiment, conductive contact 177 is formed on surface 170a of interconnect region 170. Conductive contact 177 is in communication with transistor 115c through conductive via 173 and conductive line 122b. In particular, conductive contact 177 is in communication with control terminal 119c through conductive via 173 and conductive line 122b. In this embodiment, the conductivity of well region 112 between source 116c and drain 117c is adjustable in response to adjusting a signal provided to conductive contact 177.

In this embodiment, bonded semiconductor structure 102 is processed to form conductive contact 178, which is in communication with conductive via 174. In this embodiment, conductive contact 178 is formed on surface 170a of interconnect region 170. Conductive contact 178 is in communication with mesa structure 158c through conductive via 174. In particular, conductive contact 178 is in communication with device structure layer 151c through conductive via 174. It should be noted that, in some embodiments, conductive contact 178 is in communication with electronic circuit 108 through dielectric material regions 121 and 170.

In this embodiment, conductive contact 178 is in communication with conductive bonding layer 127b through mesa structure 158c. In this embodiment, conductive contact 178 is in communication with conductive bonding layer 127b through mesa structure 158c and base support structure 154b. In this embodiment, conductive contact 178 is in communication with conductive bonding layer 127b through mesa structure 158c, base support structure 154b and bonding interface 125b. In this embodiment, conductive contact 178 is in communication with conductive line 122b through mesa structure 158c. In this embodiment, conductive contact 178 is in communication with conductive line 122b through mesa structure 158c and base support structure 154b. In this embodiment, conductive contact 178 is in communication with conductive line 122b through mesa structure 158c, base support structure 154b and bonding interface 125b. In this embodiment, conductive contact 178 is in communication with conductive line 122b through mesa structure 158c, base support structure 154a, bonding interface 125b and conductive bonding layer 127b.

In this embodiment, conductive contact 178 is in communication with transistor 115b through mesa structure 158c. In this embodiment, conductive contact 178 is in communication with transistor 115b through mesa structure 158c and base support structure 154a. In this embodiment, conductive contact 178 is in communication with transistor 115b through mesa structure 158c, base support structure 154b and bonding interface 125b. In this embodiment, conductive contact 178 is in communication with transistor 115b through mesa structure 158c, base support structure 154b, bonding interface 125b and conductive bonding layer 127b. In this embodiment, conductive contact 178 is in communication with transistor 115b through mesa structure 158c, base support structure 154b, bonding interface 125b, conductive bonding layer 127b and conductive line 122b.

In this embodiment, conductive contact 178 is in communication with source 116b through mesa structure 158c and base support structure 154b. In this embodiment, conductive contact 178 is in communication with source 116b through mesa structure 158c, base support structure 154b and bonding interface 125b. In this embodiment, conductive contact 178 is in communication with source 116b through mesa structure 158c, base support structure 154b, bonding interface 125b and conductive bonding layer 127b. In this embodiment, conductive contact 178 is in communication with source 116b through mesa structure 158c, base support structure 154b, bonding interface 125b, conductive bonding layer 127b and conductive line 122b.

In this embodiment, bonded semiconductor structure 102 is processed to form conductive contact 179, which is in communication with conductive via 180. In this embodiment, conductive contact 179 is formed on surface 170a of interconnect region 170. Conductive contact 179 is in communication with mesa structure 158d through conductive via 180. In particular, conductive contact 179 is in communication with device structure layer 151d through conductive via 180. It should be noted that, in some embodiments, conductive contact 179 is in communication with electronic circuit 108 through dielectric material regions 121 and 170.

In this embodiment, conductive contact 179 is in communication with conductive bonding layer 127b through mesa structure 158d. In this embodiment, conductive contact 179 is in communication with conductive bonding layer 127b through mesa structure 158d and base support structure 154b. In this embodiment, conductive contact 179 is in communication with conductive bonding layer 127b through mesa structure 158d, base support structure 154b and bonding interface 125b.

In this embodiment, conductive contact 179 is in communication with conductive line 122c through mesa structure 158d. In this embodiment, conductive contact 179 is in communication with conductive line 122c through mesa structure 158d and base support structure 154b. In this embodiment, conductive contact 179 is in communication with conductive line 122c through mesa structure 158d, base support structure 154b and bonding interface 125b. In this embodiment, conductive contact 179 is in communication with conductive line 122c through mesa structure 158d, base support structure 154b, bonding interface 125b and conductive bonding layer 127b. In this embodiment, conductive contact 179 is in communication with transistor 115d through mesa structure 158d.

In this embodiment, conductive contact 179 is in communication with transistor 115d through mesa structure 158d and base support structure 154b. In this embodiment, conductive contact 179 is in communication with transistor 115d through mesa structure 158d, base support structure 154b and bonding interface 125b. In this embodiment, conductive contact 179 is in communication with transistor 115d through mesa structure 158d, base support structure 154b, bonding interface 125b and conductive bonding layer 127b. In this embodiment, conductive contact 179 is in communication with transistor 115d through mesa structure 158d, base support structure 154b, bonding interface 125b, conductive bonding layer 127b and conductive line 122d.

In this embodiment, conductive contact 179 is in communication with source 116d through mesa structure 158d and base support structure 154b. In this embodiment, conductive contact 179 is in communication with source 116d through mesa structure 158d, base support structure 154b and bonding interface 125b. In this embodiment, conductive contact 179 is in communication with source 116d through mesa structure 158d, base support structure 154b, bonding interface 125b and conductive bonding layer 127b. In this embodiment, conductive contact 179 is in communication with source 116d through mesa structure 158d, base support structure 154b, bonding interface 125b, conductive bonding layer 127b and conductive line 122c.

FIGS. 10a-10d are views of steps of manufacturing a bonded semiconductor structure 104. More information regarding manufacturing a bonded semiconductor structure is provided in more detail above. Further, more information regarding manufacturing a bonded semiconductor structure can be found in the above-identified U.S. Patent and Patent Applications, which are incorporated herein by reference.

Figure 10A:
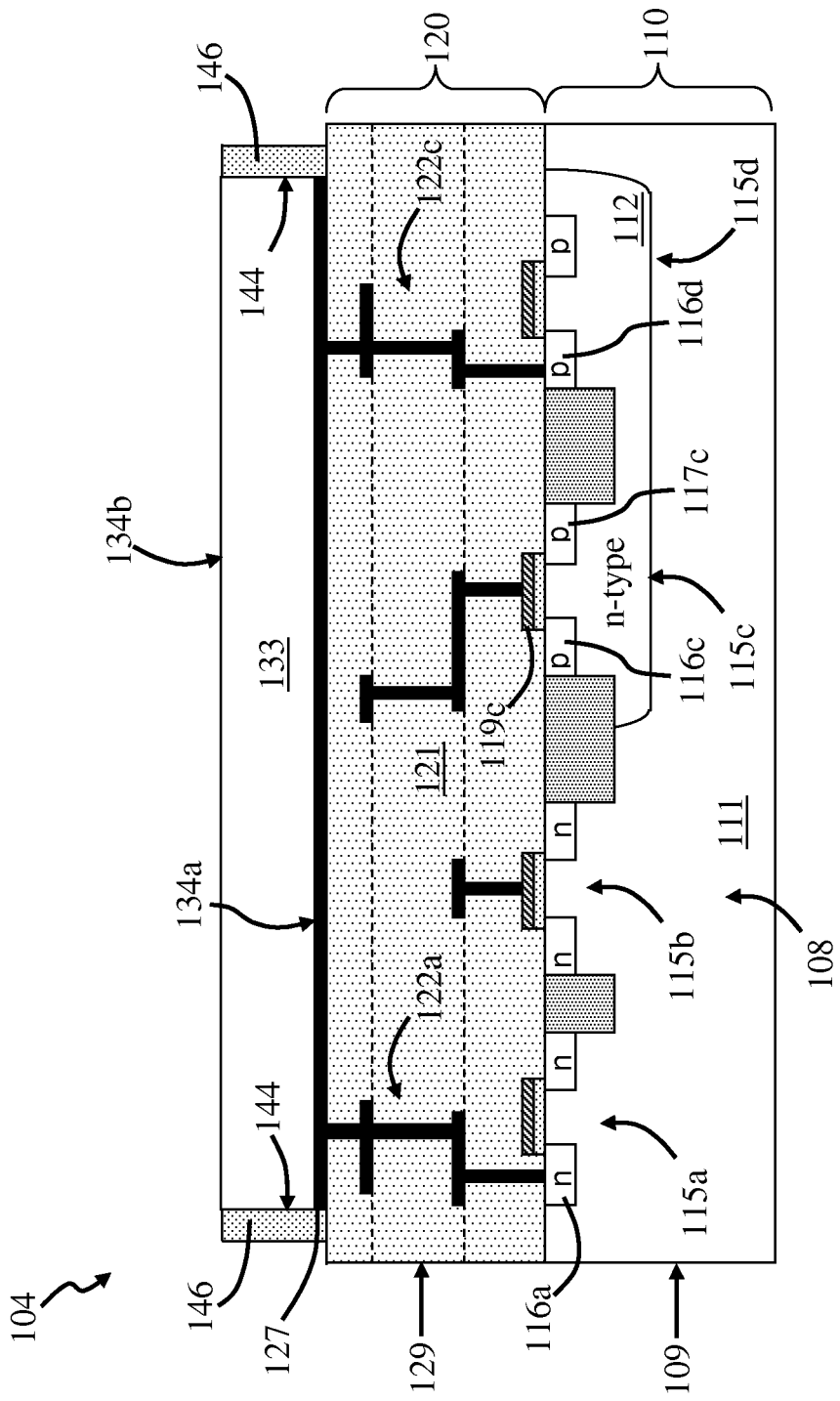
FIGS. 10a-10d are views of steps of manufacturing another embodiment of a bonded semiconductor structure.

In FIG. 10a, bonded semiconductor structure 104 includes the structure shown in FIG. 7i. In this embodiment, conductive line 122c of interconnect region 120 is in communication with electronic circuit 108 and conductive bonding layer 127. In particular, conductive line 122c is in communication with electronic circuit transistor 115d and conductive bonding layer 127. In this embodiment, conductive line 122c is in communication with source 116d and conductive bonding layer 127.

Figure 10B:
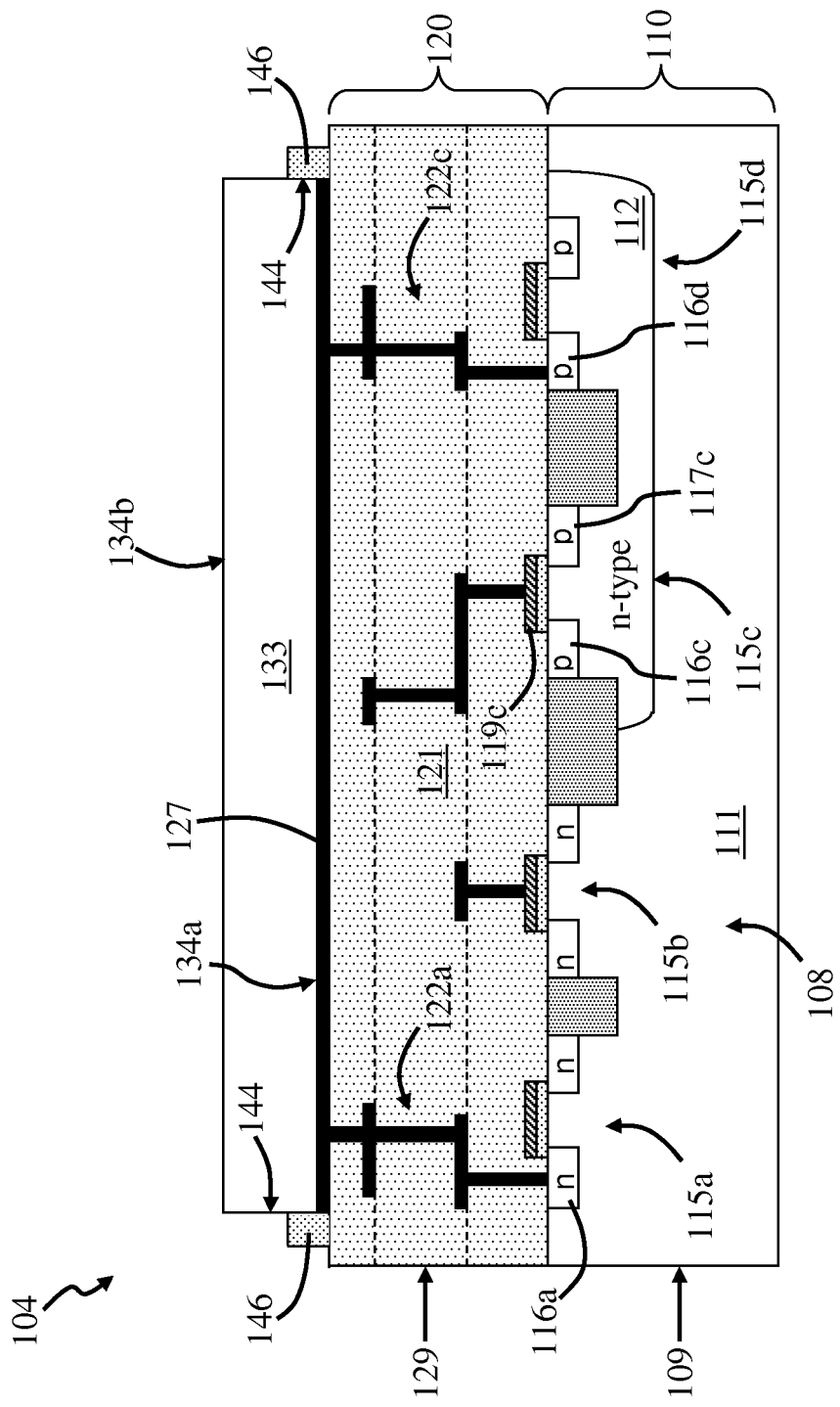

In FIG. 10b, bonded semiconductor structure 104 is processed to remove a portion of capping layer sidewall portion 146 proximate to surface 134b and etched sidewall 144. Capping layer sidewall portion 146 covers etched sidewall 126 of bonding layer 127 to restrict the flow of debris therefrom.

Figure 10C:
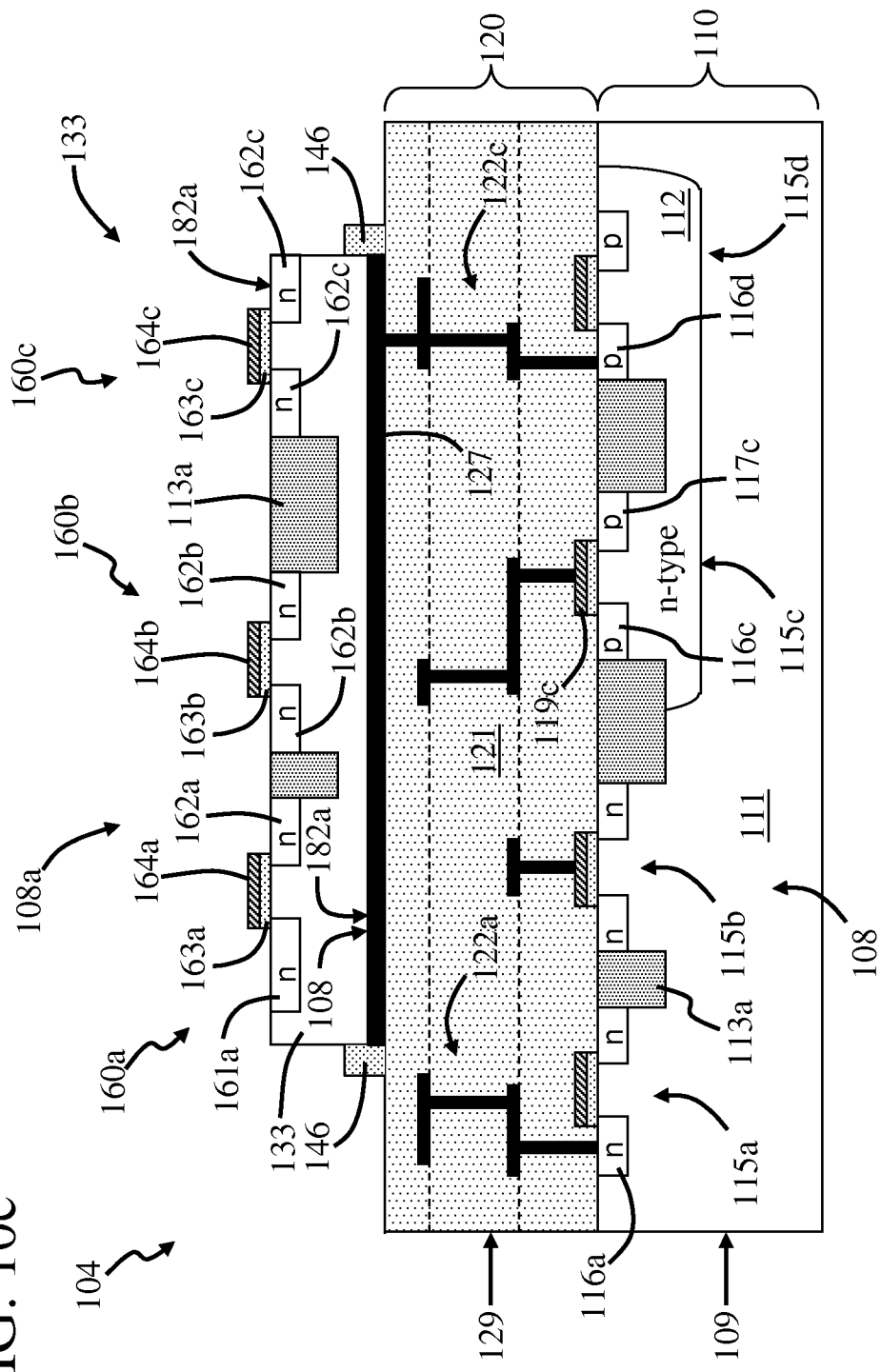

In FIG. 10c, bonded semiconductor structure 104 is processed to form an electronic circuit 108a. In particular, material transfer region 133 is processed to form electronic circuit 108a. Electronic circuit 108a can be of many different types. In this embodiment, electronic circuit 108a includes horizontally oriented semiconductor devices. In particular, electronic circuit 108a includes transistors 160a, 160b and 160c, wherein transistors 160a, 160b and 160c are positioned proximate to surface 134b. In this embodiment, transistors 160a, 160b and 160c are spaced apart from each other by an isolation region 113a, wherein isolation region 113a is the same or similar to isolation region 113.

In this embodiment, transistor 160a includes a source 161a and drain 162a, wherein source 161a and drain 162a include portions of material transfer region 133 proximate to surface 134b. Further, transistor 160a includes a control dielectric 163a which extends along surface 134b proximate to source 161a and drain 162a. In this embodiment, transistor 160a includes a control terminal 164a which is electrically coupled to material transfer region 133 through control dielectric 163a so that transistor 160a operates as a metal oxide semiconductor field effect transistor. In particular, control terminal 164a is electrically coupled to a portion of material transfer region 133 between source 161a and drain 162a through control dielectric 163a. The conductivity of the portion of material transfer region 133 between source 161a and drain 162a is adjustable in response to a signal provided to control terminal 164a. In this way, control terminal 164a is electrically coupled to a portion of material transfer region 133 between source 161a and drain 162a. It should be noted that control terminal 164a can include a metal and doped semiconductor material, such as doped polycrystalline semiconductor material.

In this embodiment, transistor 160b includes a source 161b and drain 162b, wherein source 161b and drain 162b include portions of material transfer region 133 proximate to surface 134b. Further, transistor 160b includes a control dielectric 163b which extends along surface 134b proximate to source 161b and drain 162b. In this embodiment, transistor 160b includes a control terminal 164b which is electrically coupled to material transfer region 133 through control dielectric 163b so that transistor 160b operates as a metal oxide semiconductor field effect transistor. In particular, control terminal 164b is electrically coupled to a portion of material transfer region 133 between source 161b and drain 162b through control dielectric 163b. The conductivity of the portion of material transfer region 133 between source 161b and drain 162b is adjustable in response to a signal provided to control terminal 164b. In this way, control terminal 164b is electrically coupled to a portion of material transfer region 133 between source 161b and drain 162b. It should be noted that control terminal 164b can include a metal and doped semiconductor material, such as doped polycrystalline semiconductor material.

In this embodiment, transistor 160c includes a source 161c and drain 162c, wherein source 161c and drain 162c include portions of material transfer region 133 proximate to surface 134b. Further, transistor 160c includes a control dielectric 163c which extends along surface 134b proximate to source 161c and drain 162c. In this embodiment, transistor 160c includes a control terminal 164c which is electrically coupled to material transfer region 133 through control dielectric 163c so that transistor 160c operates as a metal oxide semiconductor field effect transistor. In particular, control terminal 164c is electrically coupled to a portion of material transfer region 133 between source 161c and drain 162c through control dielectric 163c. The conductivity of the portion of material transfer region 133 between source 161c and drain 162c is adjustable in response to a signal provided to control terminal 164c. In this way, control terminal 164c is electrically coupled to a portion of material transfer region 133 between source 161c and drain 162c. It should be noted that control terminal 164c can include a metal and doped semiconductor material, such as doped polycrystalline semiconductor material.

Figure 10D:
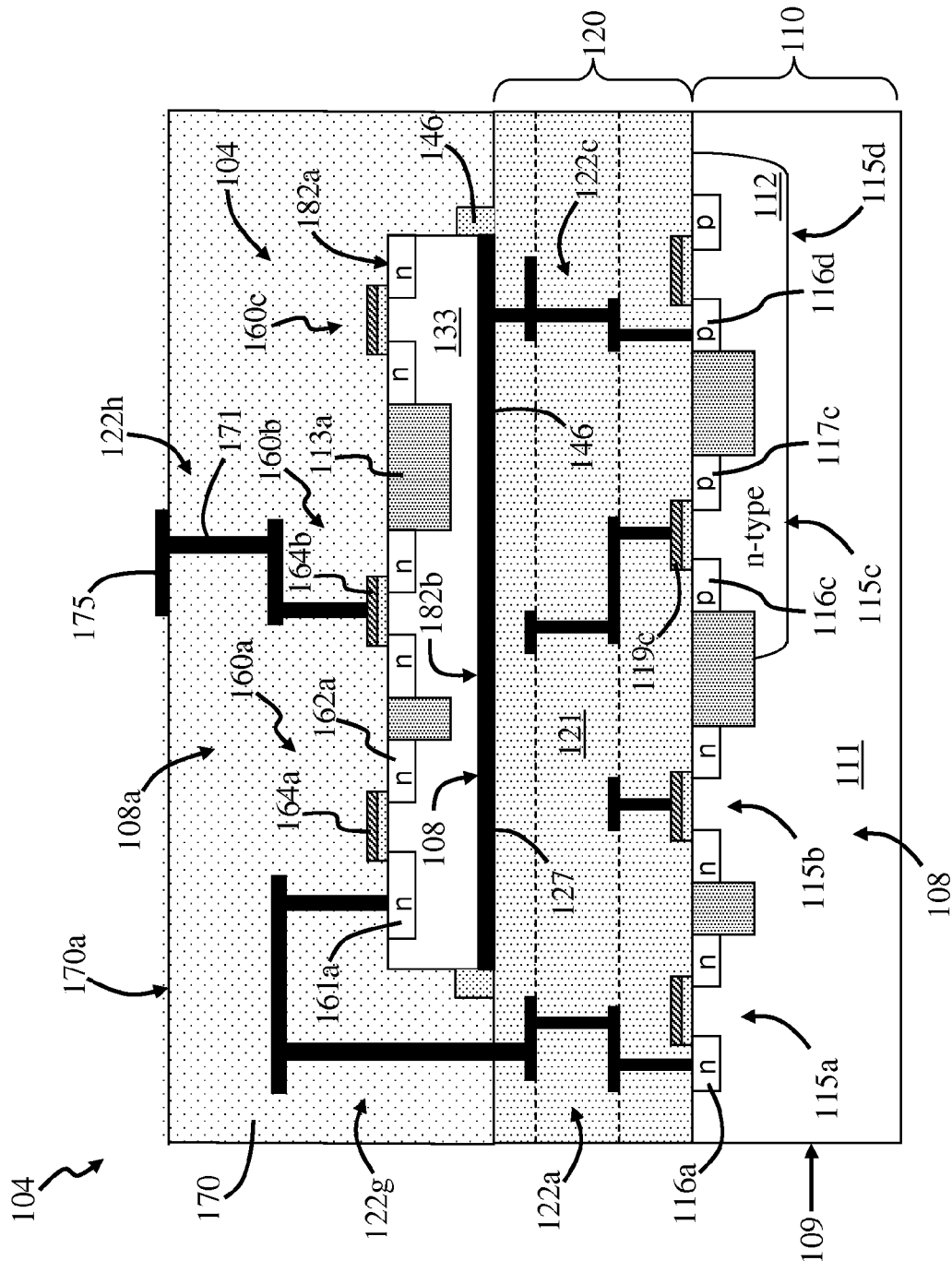

FIG. 10d is a side view of bonded semiconductor structure 104 of FIG. 10e, wherein dielectric material region 170 is formed on material transfer region 133 and transistors 160a, 160b and 160c. In this embodiment, a portion of dielectric material region 170 extends go dielectric material region 121.

In this embodiment, bonded semiconductor structure 104 is processed to form a conductive line 122g which extends through dielectric material region 170 between conductive line 122g and transistor 160a. In particular, conductive line 122g extends through dielectric material region 170 between conductive line 122a and source 161a. Conductive line 122g is formed by etching through dielectric material region 170 and depositing the material of conductive line 122g therein.

In this embodiment, bonded semiconductor structure 104 is processed to form a conductive line 122h which extends through dielectric material region 170 between surface 170a and transistor 160b. In particular, conductive line 122h extends through dielectric material region 170 between surface 170a and control terminal 164b. Conductive line 122h is formed by etching through dielectric material region 170 and depositing the material of conductive line 122h therein.

As mentioned above, conductive line 122a is in communication with electronic circuit 108. Hence, in this embodiment, conductive line 122a is in communication with electronic circuits 108 and 108a because conductive line is in communication with electronic circuit 108a through conductive line 122g. In this way, a signal can flow between electronic circuits 108 and 108a.

Electronic circuits 108 and 108a can be of many different types, such as CMOS circuits. As mentioned above, a CMOS circuit includes PMOS and NMOS devices in communication with each other. The PMOS and NMOS devices are in communication with each other when a signal is capable of flowing between them. In one embodiment, electronic circuits 108 and 108a include PMOS and NMOS devices, respectively. In one embodiment, electronic circuits 108 and 108a include NMOS and PMOS devices, respectively. In one embodiment, electronic circuits 108 and 108a consist of PMOS and NMOS devices, respectively. In one embodiment, electronic circuits 108 and 108a consist of NMOS and PMOS devices, respectively. In one embodiment, electronic circuits 108 and 108a consist essentially of PMOS and NMOS devices, respectively. In one embodiment, electronic circuits 108 and 108a consist essentially of NMOS and PMOS devices, respectively.

Electronic circuits 108 and 108a can operate in many different ways. In some embodiments, electronic circuits 108 and 108a operate as a processor and controller, respectively. In some embodiments, electronic circuits 108 and 108a operate as a controller and processor, respectively.

Figure 11A:
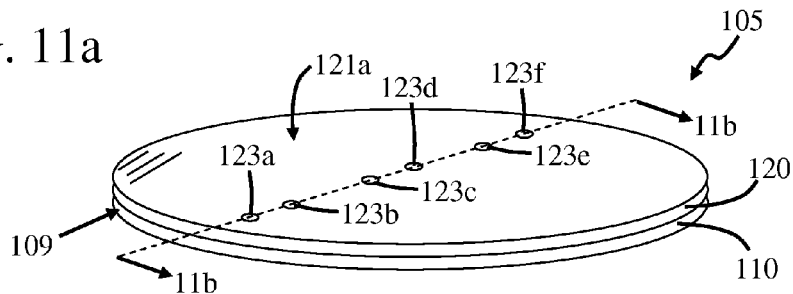
FIGS. 11a-11u are views of steps of manufacturing another embodiment of a bonded semiconductor structure.
Figure 11B:
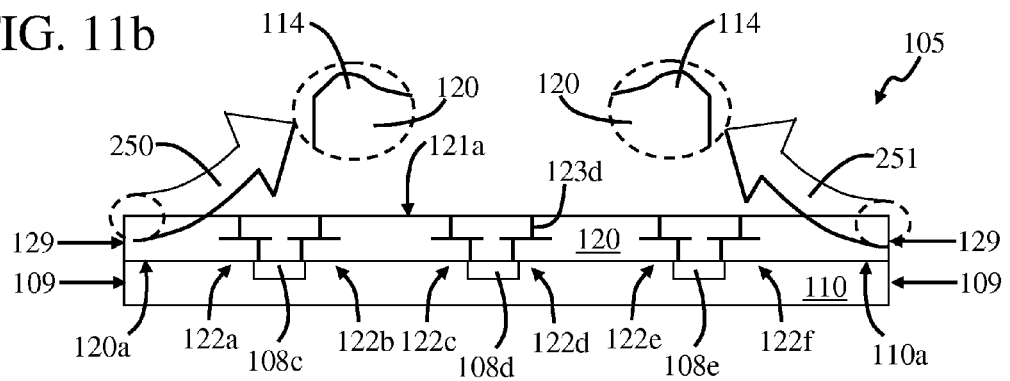
Figure 11C:
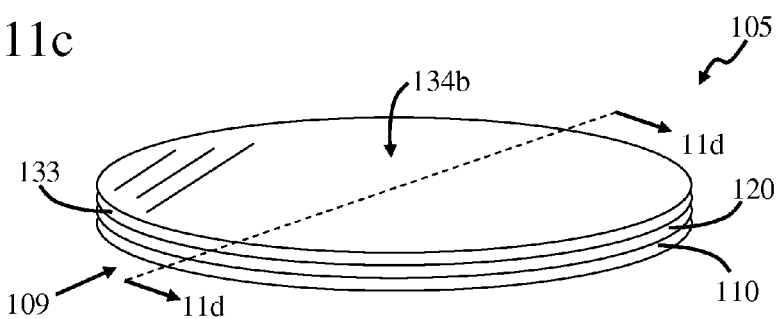
Figure 11D:
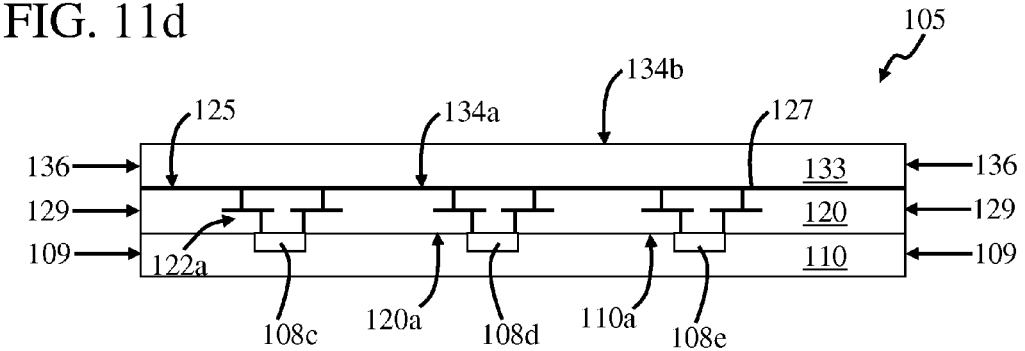
Figure 11E:
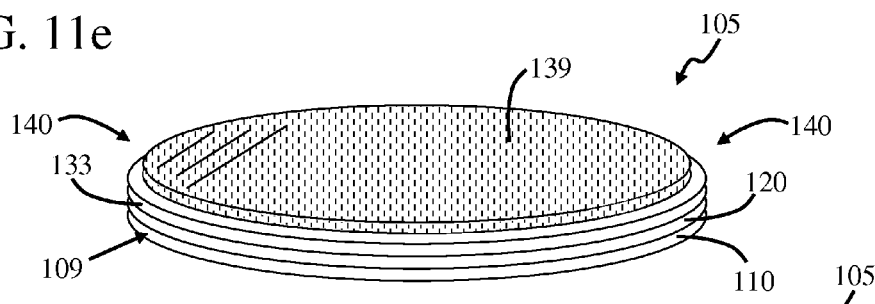
Figure 11F:
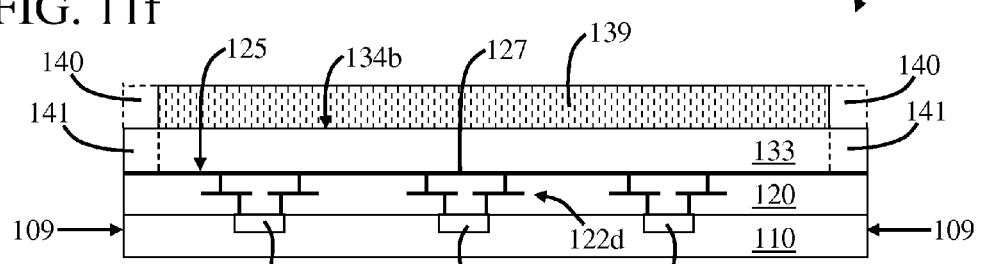
Figure 11G:
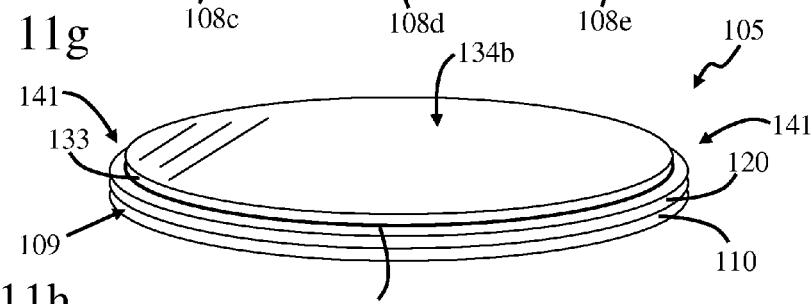
Figure 11H:
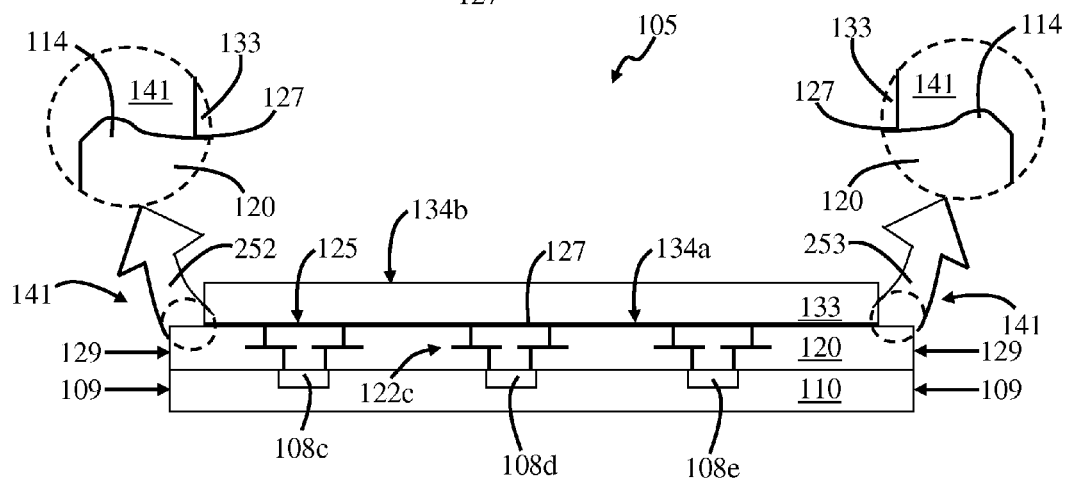
Figure 11I:
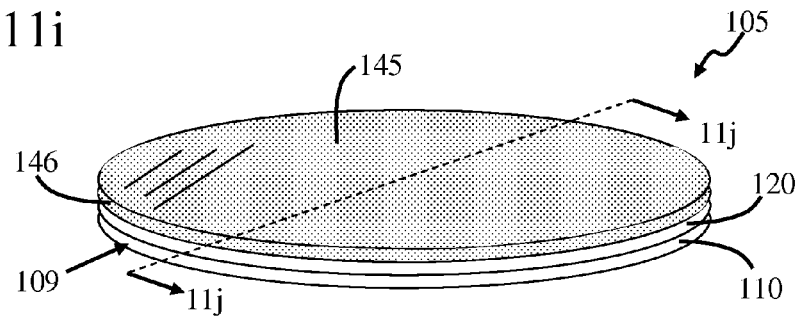
Figure 11J:
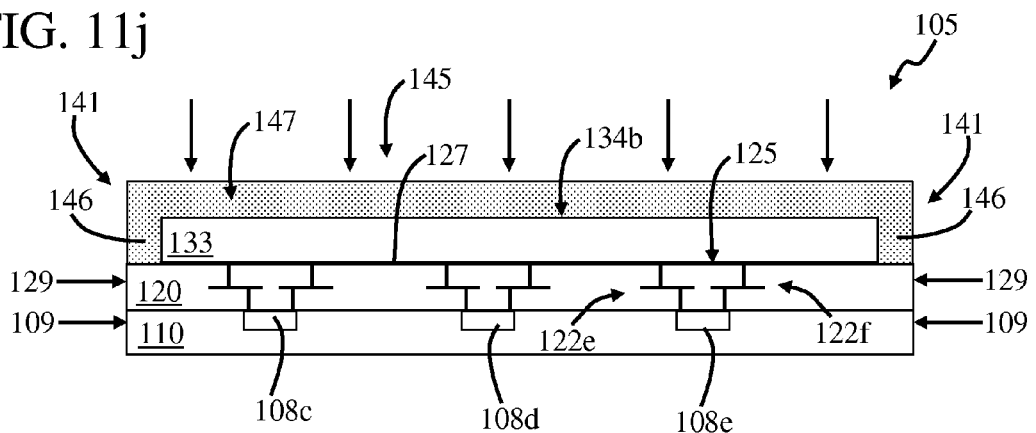
Figure 11K:
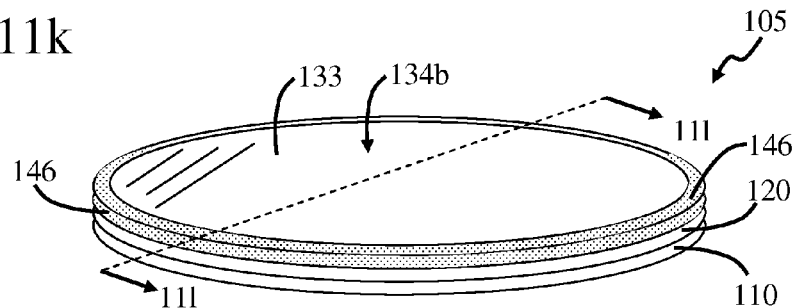
Figure 11L:
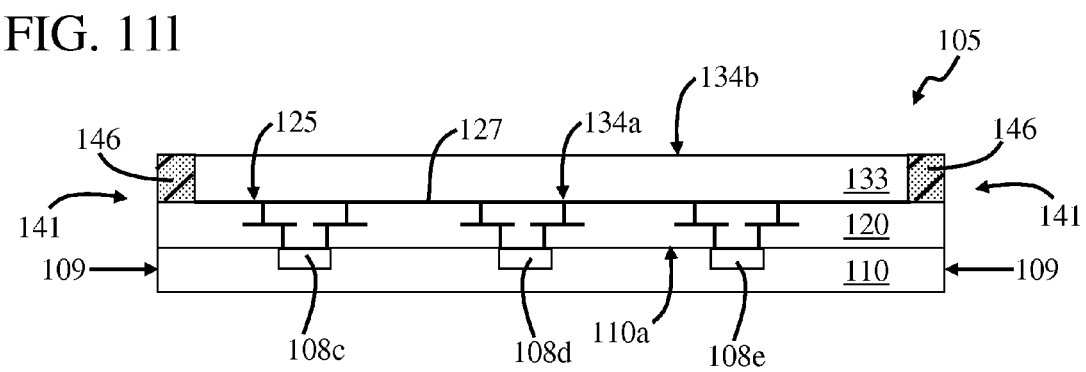
Figure 11M:
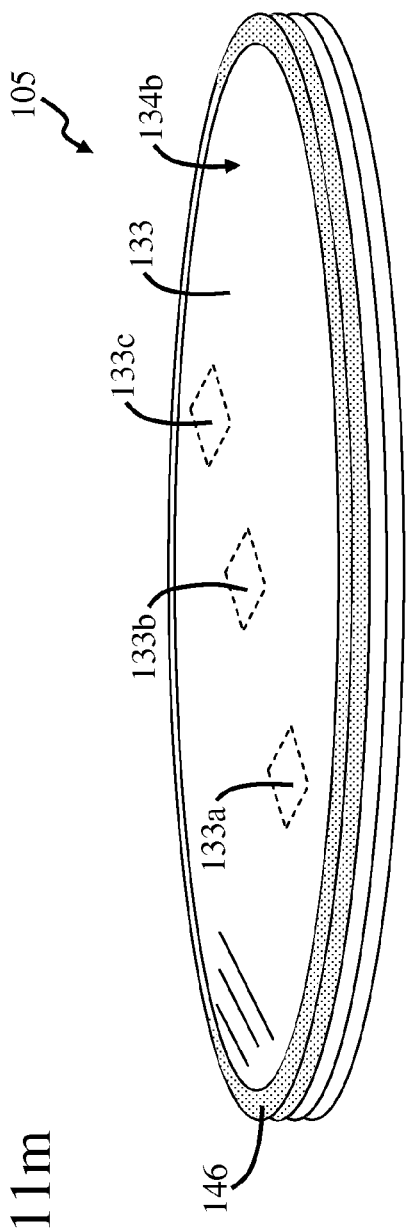
Figure 11N:
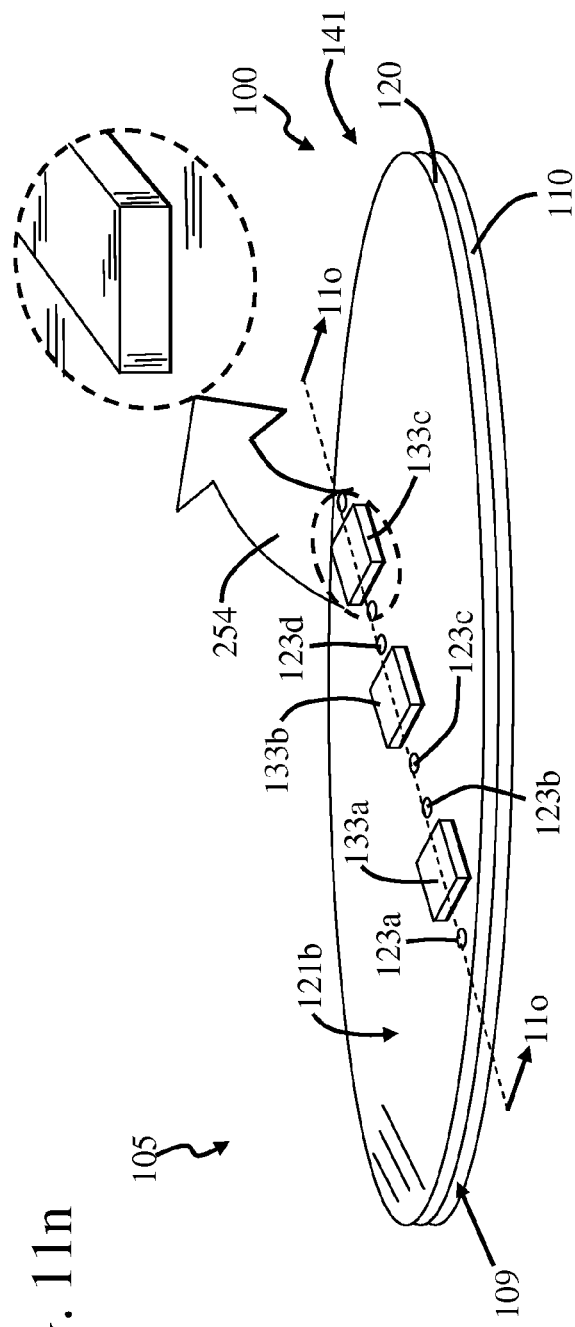
Figure 11O:
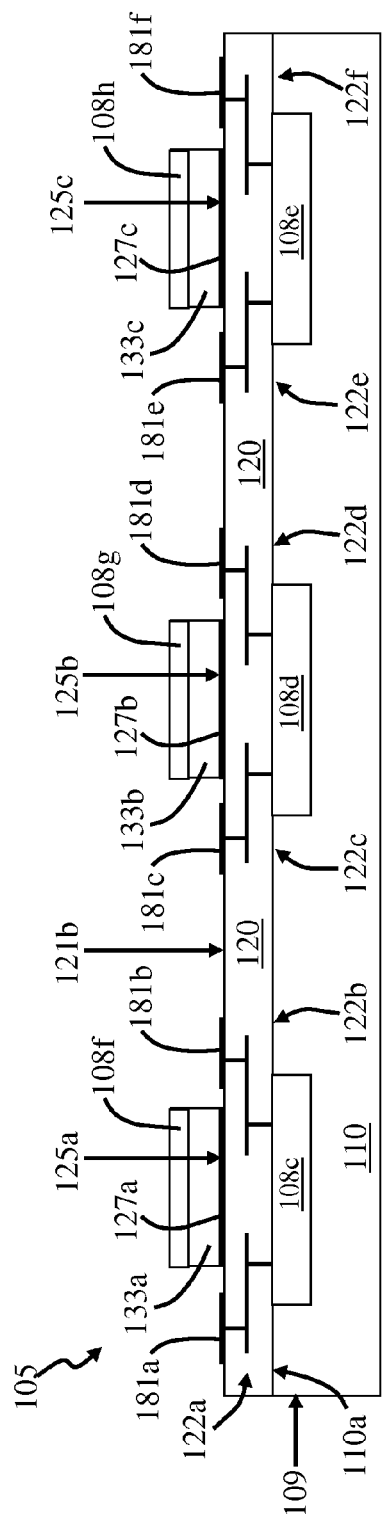
Figure 11P:
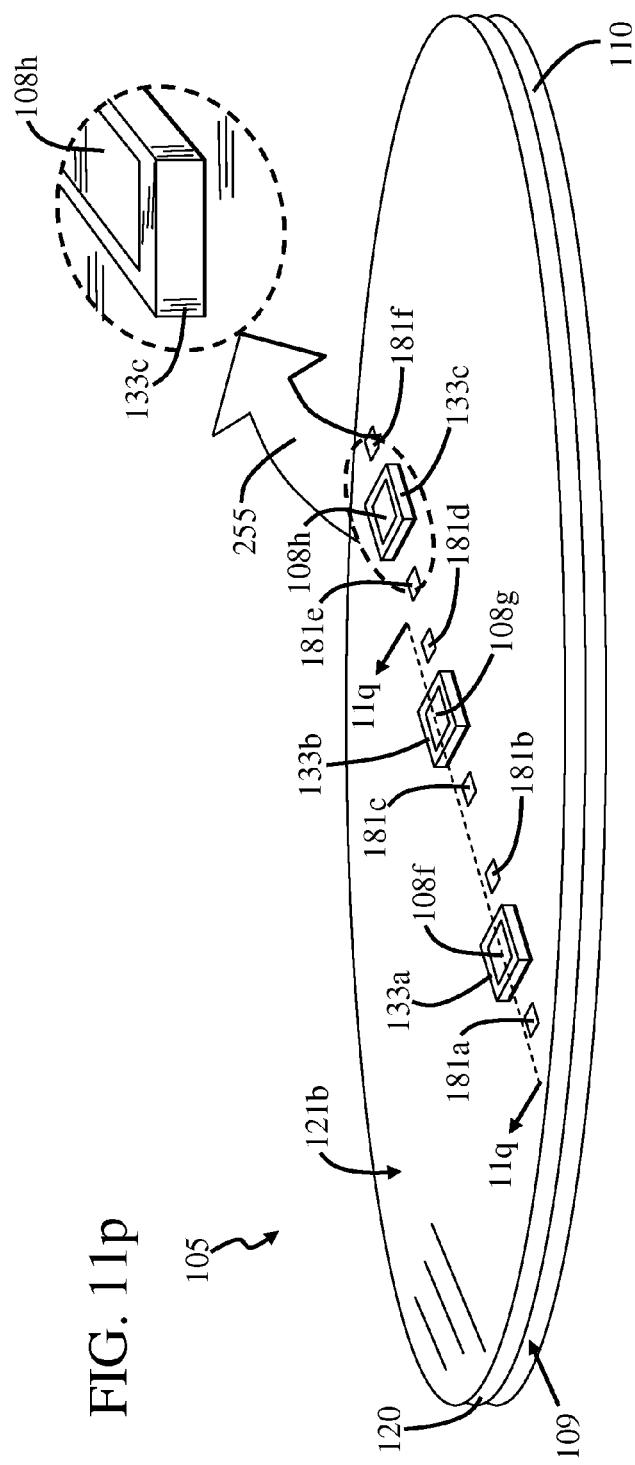
Figure 11U:
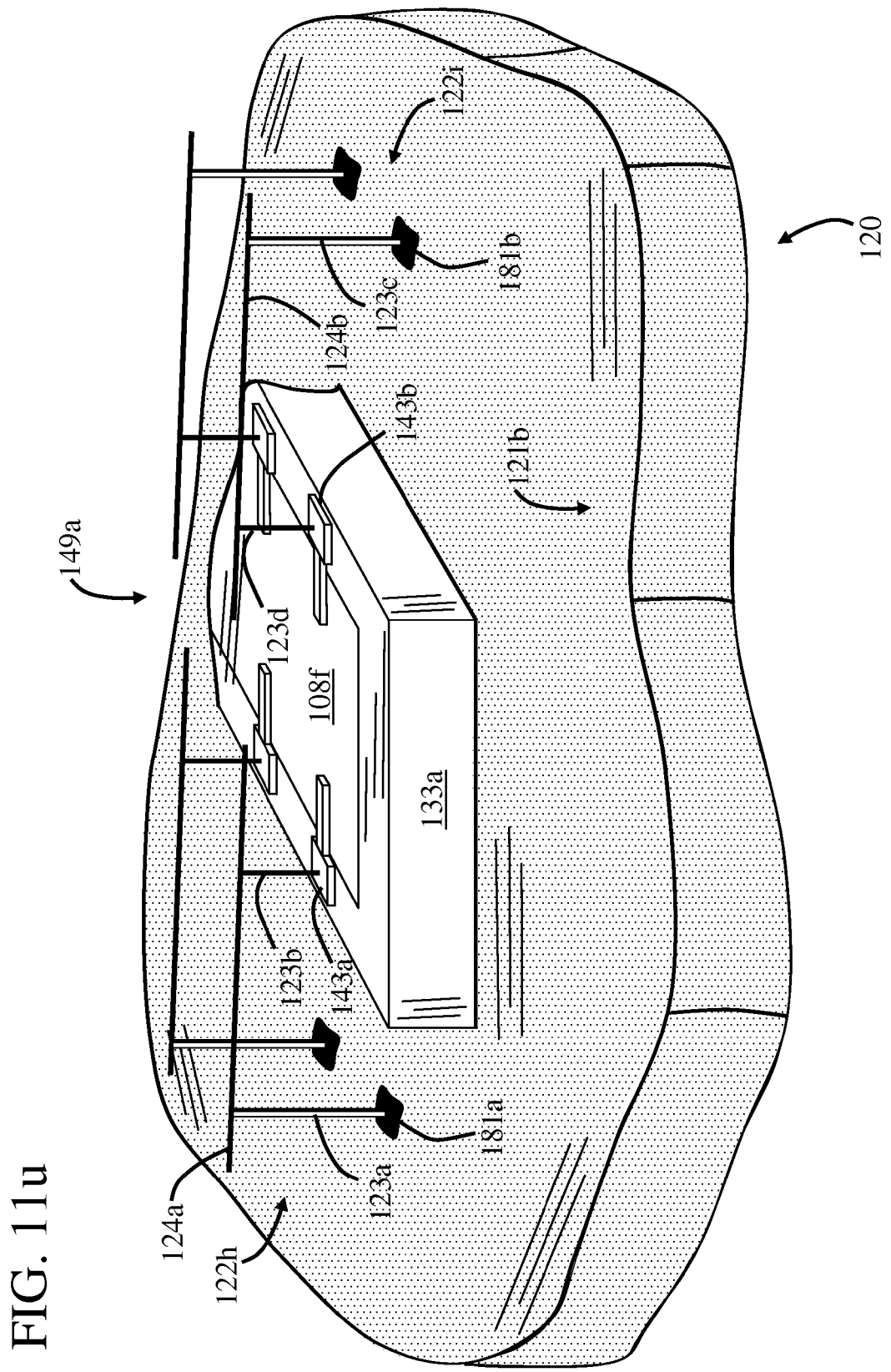

FIGS. 11a-11u are views of steps of manufacturing a bonded semiconductor structure 105. More information regarding manufacturing a bonded semiconductor structure can be found in the above-identified U.S. Patent and Patent Applications, which are incorporated herein by reference.

FIG. 11a is a perspective view of partially fabricated bonded semiconductor structure 105, and FIG. 11b is a cut-away side view of partially fabricated bonded semiconductor structure 105 taken along a cut-line 11b-11b of FIG. 11a. In this embodiment, bonded semiconductor structure 105 includes support substrate 110 and interconnect region 120, wherein interconnect region 120 is carried by support substrate 110. In this embodiment, lip 114 extends annularly around the outer periphery of interconnect region 120, as discussed in more detail above, and as indicated by indication arrows 250 and 251 of FIG. 11b. More information regarding support substrate 110 and interconnect region 120 is provided in more detail above, such as with the discussion of FIGS. 5a, 6a and 7a.

In this embodiment, support substrate 110 carries electronic circuits 108c, 108d and 108e. Electronic circuits 108c, 108d and 108e can be of many different types, such as CMOS circuits. As mentioned above, a CMOS circuit includes PMOS and NMOS devices in communication with each other. The PMOS and NMOS devices are in communication with each other when a signal is capable of flowing between them. Electronic circuits 108c, 108d and 108e can operate in many different ways. In some embodiments, electronic circuits 108c, 108d and 108e operate as a processor and/or controller circuits.

In this embodiment, interconnect region 120 includes conductive lines 122a, 122b, 122c, 122d, 122e and 122f which extend through dielectric material region 121, as shown in FIG. 11b. As discussed in more detail above, a conductive line generally includes a conductive interconnect and/or conductive via. In this embodiment, conductive lines 122a and 122b are in communication with electronic circuit 108c, conductive lines 122c and 122d are in communication with electronic circuit 108d and conductive lines 122e and 122f are in communication with electronic circuit 108e. In this embodiment, conductive lines 122a and 122b include conductive vias 123a and 123b, respectively, which extend through surface 121a, as shown in FIG. 11a. Conductive lines 122c and 122d include conductive vias 123c and 123d, respectively, which extend through surface 121a, as shown in FIG. 11a. Further, conductive lines 122e and 122f include conductive vias 123e and 123f, respectively, which extend through surface 121a, as shown in FIG. 11a.

FIG. 11c is a perspective view of bonded semiconductor structure 105 of FIGS. 11a and 11b, wherein material transfer region 133 is carried by support substrate 110 and FIG. 11d is a cut-away side view of bonded semiconductor structure 105 taken along a cut-line 11d-11d of FIG. 11c.

In FIGS. 11c and 11d, material transfer region 133 is coupled to interconnect region 120 so it is carried by support substrate 110. Material transfer region 133 is bounded by outer sidewall 136 which extends around its outer periphery. Material transfer region 133 can be coupled to interconnect region 120 in many different ways, as discussed in more detail above. In this embodiment, material transfer region 133 is coupled to interconnect region 120 through bonding. In particular, material transfer region 133 is coupled to interconnect region 120 through conductive bonding layer 127 which establishes bonding interface 125. In this way, semiconductor structure 105 is a bonded semiconductor structure.

Bonding interface 125 is formed in response to coupling material transfer region 133 to interconnect region 120 through bonding. In this embodiment, bonding interface 125 is formed between dielectric material region surface 121a and a material transfer region surface 134a of material transfer region 133. Material transfer region surface 134a faces support substrate 110 and interconnect region 120. Bonding interface 125 can be of many different types, such as those mentioned above. It should be noted that bonding interface 125 is not a growth interface.

In this embodiment, material transfer region 133 is positioned so interconnect region 120 extends between support substrate 110 and material transfer region 133. More information regarding material transfer region 133 and bonding can be found in the above-identified U.S. Patent and Patent Applications, which are incorporated herein by reference. As discussed in more detail above, material transfer region 133 can include many different types of material, such as dielectric material and semiconductor material. In some embodiments, material transfer region 133 includes a stack of semiconductor material layers.

In FIGS. 11e and 11f, mask region 139 is positioned on material transfer region 133 so it is carried by support substrate 110. Mask region 139 can be positioned on material transfer region 133 in many different ways. In this embodiment, mask region 139 is deposited on material transfer region 133 so that mask region 139 covers material transfer region 133. In this embodiment, mask region 139 is deposited on material transfer region 133 so that material transfer region 133 extends between mask region 139 and bonding interface 125.

In FIGS. 11e and 11f, mask region 139 is processed to remove portion 140 of it proximate to outer sidewall 129. Portion 140 extends annularly around the outer periphery of mask region 139 proximate to outer sidewall 129. As discussed in more detail above, portion 140 can be removed in many different ways. The etching can be of many different types, such as wet and/or dry etching. In some embodiments, a mask is positioned on a surface 139a of mask region 139, wherein the mask covers some portions of mask region 139 and does not cover other portions of mask region 139. In these embodiments, portion 140 corresponds to the portions of mask region 139 that are not covered by the mask. In this way, portion 140 is etched utilizing a mask.

In one embodiment, mask region 139 includes a photoresist material which is positioned on material transfer region 133 using conventional photoresist deposition techniques, such as spin-on-coating. In these embodiments, portion 140 is removed from material transfer region 133 using conventional photoresist development techniques.

In the embodiment of FIGS. 11g and 11h, material transfer region 133 is processed to remove portion 141 (FIGS. 11e and 11f) of material transfer region 133, and mask region 139 is processed to remove it from surface 134b. It should be noted that FIG. 11h is a side view of bonded semiconductor structure of FIG. 11g. In this embodiment, portion 141 is proximate to outer sidewall 129 and is removed so that lip 114 is exposed, as indicated by indication arrows 252 and 253 in FIG. 11h. Portion 141 extends annularly around the outer periphery of mask region 139 proximate to outer sidewall 129. It should be noted that a portion of bonding interface 125 is exposed in response to removing portion 141 from material transfer region 133. Portion 141 can be removed in many different ways, such as by etching. The etching can be of many different types, such as wet and/or dry etching. As discussed in more detail above, etched sidewall 144 is formed in response to removing portion 141. In this embodiment, mask region 139 is removed from material transfer region 133 to expose material transfer region surface 134b.

The stress of material transfer region 133 is adjusted in response to removing portion 141 of material transfer region 133 proximate to outer sidewall 129 so that lip 114 is exposed. In particular, the stress of material transfer region 133 is reduced in response to removing portion 141 of material transfer region 133 proximate to outer sidewall 129 to expose lip 114. The stress of material transfer region 133 is reduced because material transfer region 133 experiences less bowing in response to removing portion 141 proximate to outer sidewall 129. Material transfer region 133 experiences more bowing when portion 141 is not removed because lip 114 pushes upwardly on material transfer region 133.

FIG. 11*i* is a perspective view of bonded semiconductor structure 100 of FIGS. 11*g* and 11*h* with capping layer 145 positioned on material transfer region so it is carried by support substrate 110. FIG. 11*j* is a cut-away side view of bonded semiconductor structure 100 of FIG. 11*i* taken along a cut-line 11*j*-11*j* of FIG. 11*i*. Capping layer 145 includes portion 147 which extends along surface 134*b* so it covers material transfer region 133. Portion 147 is discussed in more detail above.

Capping layer 145 can include many different types of material. In this embodiment, capping layer 145 includes dielectric material. In some embodiments, capping layer 145 consists of dielectric material. In some embodiments, capping layer 145 consists essentially of dielectric material. The dielectric material of capping layer 145 can be of many different types, such as silicon dioxide and silicon nitride, among others. In some embodiments, the dielectric material of capping layer 145 is the same as the dielectric material of interconnect region and, in other embodiments, the dielectric material of capping layer 145 is different from the dielectric material of interconnect region 110. In one particular embodiment, the dielectric materials of interconnect region 110 and capping layer 145 include silicon dioxide. In another particular embodiment, the dielectric materials of interconnect region 110 and capping layer 145 include silicon dioxide and silicon nitride, respectively.

Capping layer 145 includes portion 146 which extends between portion 147 and interconnect region 120. In particular, portion 146 extends between portion 147 and lip 114. Portion 146 covers lip 114 and the exposed portion of bonding interface 125. Portion 146 extends along sidewall 144 and covers the exposed portion of bonding interface 125 to restrict the flow of heat between outer sidewall 129 and bonding interface 125. Portion 146 covers the exposed portion of bonding interface 125 to restrict the flow of heat between surface 134*b* and bonding interface 125.

FIG. 11*k* is a perspective view of bonded semiconductor structure 105 of FIGS. 11*i* and 11*j*, wherein portion 147 of capping layer 145 is removed so that surface 134*b* of material transfer region is exposed. FIG. 11*l* is a cut-away side view of bonded semiconductor structure 105 of FIG. 11*k* taken along a cut-line 11*l*-11*l*. In FIGS. 11*k* and 11*l*, portion 147 of capping layer 145 is removed so that surface 134*b* of material transfer region is exposed. Portion 147 of capping layer 145 is removed so that portion 146 extends annularly around material transfer region 133, as shown in FIG. 5*k*, and covers lip 114. Portion 146 covers lip 114 and the exposed portion of bonding interface 125, and extends along sidewall 144. Portion 146 covers the exposed portion of bonding interface 125 to restrict the flow of debris between outer sidewall 129 and bonding interface 125. Portion 146 covers the exposed portion of bonding interface 125 to restrict the flow of debris between surface 134*b* and bonding interface 125.

FIG. 11*m* is a perspective view of bonded semiconductor structure 105 of FIGS. 11*k* and 11*l*. In this embodiment, it is desirable to form a material transfer region island, several of which are denoted as material transfer region islands 133*a*, 133*b* and 133*c*. It should be noted that material transfer region islands 133*a*, 133*b* and 133*c* are shown in phantom in FIG. 11*m*, and include portions of material transfer region 133. Further, it should be noted that three material transfer region islands are shown in FIG. 11*m* for illustrative purposes. In general, it is desirable to form one or more material transfer region islands.

In this embodiment, material transfer region islands 133*a*, 133*b* and 133*c* include the same layer structure as material transfer region 133. For example, material transfer region islands 133*a*, 133*b* and 133*c* include a single layer of material when material transfer region 133 includes the single layer of material. Material transfer region islands 133*a*, 133*b* and 133*c* include two layers of material when material transfer region 133 includes two layers of material. Further, material transfer region islands 133*a*, 133*b* and 133*c* include three layers of material when material transfer region 133 includes three layers of material. Material transfer region islands 133*a*, 133*b* and 133*c* include a stack of material layers when material transfer region 133 includes the stack of material layers.

In this embodiment, material transfer region islands 133*a*, 133*b* and 133*c* include the same material as material transfer region 133. For example, material transfer region islands 133*a*, 133*b* and 133*c* include a semiconductor material when material transfer region 133 includes the semiconductor material. Further, material transfer region islands 133*a*, 133*b* and 133*c* include a dielectric material when material transfer region 133 includes the dielectric material.

FIG. 11*n* is a perspective view of bonded semiconductor structure 105 of FIG. 11*m*, and FIG. 11*o* is a cut-away side view of bonded semiconductor structure 105 of FIG. 11*n* taken along a cut-line 11*o*-11*o* of FIG. 11*n*. FIG. 11*p* is a perspective view of bonded semiconductor structure 105 of FIG. 11*o*. In FIGS. 11*n* and 11*o*, a portion of material transfer region 133 has been removed to form material transfer region islands 133*a*, 133*b* and 133*c*. There are many different ways in which the portion of material transfer region 133 can be removed to form material transfer region islands 133*a*, 133*b* and 133*c*, such as by wet and/or dry etching.

In this embodiment, a portion of conductive bonding layer 127 has been removed to form conductive bonding layers 127*a*, 127*b* and 127*c*. There are many different ways in which the portion of conductive bonding layer 127 can be removed to form conductive bonding layers 127*a*, 127*b* and 127*c*, such as by wet and/or dry etching. It should be noted that conductive bonding layers 127*a*, 127*b* and 127*c* extend between interconnect region 120 and material transfer region islands 133*a*, 133*b* and 133*c*, respectively.

In this embodiment, material transfer region island 133*a* is coupled to interconnect region 120 through conductive bonding layer 127*a* which establishes a bonding interface 125*a* therebetween. Material transfer region island 133*b* is coupled to interconnect region 120 through conductive bonding layer 127*b* which establishes a bonding interface 125*b* therebetween. Further, material transfer region island 133*c* is coupled to interconnect region 120 through conductive bonding layer 127*c* which establishes a bonding interface 125*c* therebetween.

In this embodiment, bonded semiconductor structure 105 is processed to from a conductive contact 181*a*, which is in communication with conductive line 122*a*. As mentioned above, conductive line 122*a* is in communication with electronic circuit 108*c*. Hence, conductive contact 181*a* is in communication with electronic circuit 108*c* through conductive line 122*a*. In this embodiment, conductive contact 181*a* is formed on dielectric material region surface 121*b*, as shown in FIGS. 11*o* and 11*p*.

In this embodiment, bonded semiconductor structure 105 is processed to from a conductive contact 181*b*, which is in communication with conductive line 122*b*. As mentioned above, conductive line 122*b* is in communication with electronic circuit 108*c*. Hence, conductive contact 181*b* is in communication with electronic circuit 108*c* through conductive line 122*b*. In this embodiment, conductive contact 181*b* is formed on dielectric material region surface 121*b*, as shown in FIGS. 11*o* and 11*p*.

In this embodiment, bonded semiconductor structure 105 is processed to from a conductive contact 181*c*, which is in communication with conductive line 122*c*. As mentioned above, conductive line 122*c* is in communication with electronic circuit 108*d*. Hence, conductive contact 181*c* is in communication with electronic circuit 108*d* through conductive line 122*c*. In this embodiment, conductive contact 181*c* is formed on dielectric material region surface 121*b*, as shown in FIGS. 11*o* and 11*p*.

In this embodiment, bonded semiconductor structure 105 is processed to from a conductive contact 181*d*, which is in communication with conductive line 122*d*. As mentioned above, conductive line 122*d* is in communication with electronic circuit 108*d*. Hence, conductive contact 181*d* is in communication with electronic circuit 108*d* through conductive line 122*d*. In this embodiment, conductive contact 181*d* is formed on dielectric material region surface 121*b*, as shown in FIGS. 11*o* and 11*p*.

In this embodiment, bonded semiconductor structure 105 is processed to from a conductive contact 181*e*, which is in communication with conductive line 122*e*. As mentioned above, conductive line 122*e* is in communication with electronic circuit 108*e*. Hence, conductive contact 181*e* is in communication with electronic circuit 108*e* through conductive line 122*e*. In this embodiment, conductive contact 181*e* is formed on dielectric material region surface 121*b*, as shown in FIGS. 11*o* and 11*p*.

In this embodiment, bonded semiconductor structure 105 is processed to from a conductive contact 181*f*, which is in communication with conductive line 122*f*. As mentioned above, conductive line 122*f* is in communication with electronic circuit 108*e*. Hence, conductive contact 181*f* is in communication with electronic circuit 108*e* through conductive line 122*f*. In this embodiment, conductive contact 181*f* is formed on dielectric material region surface 121*b*, as shown in FIGS. 11*o* and 11*p*.

In this embodiment, bonded semiconductor structure 105 is processed to form an electronic circuit 108*f*, which is carried by material transfer region island 133*a*, as shown in FIGS. 11*o*, 11*p* and 11*q*. It should be noted that FIG. 11*q* is a cut-away side view of bonded semiconductor structure 105 of FIG. 11*p* taken along a cut-line 11*q*-11*q* of FIG. 11*p*. Bonded semiconductor structure 105 is processed to form an electronic circuit 108*g*, which is carried by material transfer region island 133*b*, as shown in FIGS. 11*o*, 11*p* and 11*q*. Further, bonded semiconductor structure 105 is processed to form an electronic circuit 108*h*, which is carried by material transfer region island 133*c*, as shown in FIGS. 11*o*, 11*p* and 11*q*. Electronic circuit 108*h* is shown in more detail in FIG. 11*p* as indicated by an indication arrow 255.

Electronic circuits 108*f*, 108*g* and 108*h* can be of many different types, such as those mentioned above. In this embodiment, electronic circuits 108*f*, 108*g* and 108*h* are each CMOS circuit. Electronic circuits 108*f*, 108*g* and 108*h* are formed using conventional CMOS processing techniques, such as photolithography, deposition, ion implantation, annealing and etching. In some embodiments, electronic circuits 108*f*, 108*g* and/or 108*h* include vertically oriented semiconductor devices and, in other embodiments, electronic circuits 108*f*, 108*g* and/or 108*h* include horizontally oriented semiconductor devices. For example, electronic circuit 108*f* can include vertically oriented semiconductor devices 158*a* and 158*b*, as indicated by an indication arrow 256 of FIG. 11*q*. Further, electronic circuit 108*g* can include horizontally oriented semiconductor devices 150*a* and 150*b*, as indicated by an indication arrow 257 of FIG. 11*q*. Examples of vertically oriented semiconductor devices 158*a* and 158*b* and horizontally oriented semiconductor devices 150*a* and 150*b* are discussed in more detail above.

FIG. 11*r* is a side view of bonded semiconductor structure 105 as shown in FIG. 11*q*. In this embodiment, dielectric material region 170 is formed on material transfer region islands 133*a* and 133*b*. In this embodiment, a portion of dielectric material region 170 is formed on interconnect region 120, as well as conductive contacts 181*a*, 181*b*, 181*c* and 181*d*.

In this embodiment, bonded semiconductor structure 105 is processed to form a conductive line 122*h* which extends through dielectric material region 170 between electronic circuit 108*f* and conductive contact 181*a*. Conductive line 122*h* is formed by etching through dielectric material region 170 and depositing the material of conductive line 122*h* therein. Electronic circuits 108*c* and 108*f* are in communication with each other through conductive lines 122*a*, 122*h* and conductive contact 181*a*.

In this embodiment, bonded semiconductor structure 105 is processed to form a conductive line 122*i* which extends through dielectric material region 170 between electronic circuit 108*f* and conductive contact 181*b*. Conductive line 122*i* is formed by etching through dielectric material region 170 and depositing the material of conductive line 122*i* therein. Electronic circuits 108*c* and 108*f* are in communication with each other through conductive lines 122*b*, 122*i* and conductive contact 181*b*.

In this embodiment, bonded semiconductor structure 105 is processed to form a conductive line 122*j* which extends through dielectric material region 170 between electronic circuit 108*g* and conductive contact 181*c*. Conductive line 122*j* is formed by etching through dielectric material region 170 and depositing the material of conductive line 122*j* therein. Electronic circuits 108*d* and 108*g* are in communication with each other through conductive lines 122*c*, 122*j* and conductive contact 181*c*.

In this embodiment, bonded semiconductor structure 105 is processed to form a conductive line 122*k* which extends through dielectric material region 170 between electronic circuit 108*g* and conductive contact 181*d*. Conductive line 122*k* is formed by etching through dielectric material region 170 and depositing the material of conductive line 122*k* therein. Electronic circuits 108*d* and 108*g* are in communication with each other through conductive lines 122*d*, 122*k* and conductive contact 181*d*.

It should be noted that bonded semiconductor structure 105 is processed to form conductive lines which extend through dielectric material region 170 between electronic circuit 108*h* (FIG. 11*p*) and conductive contacts 181*e* and 181*f*. These conductive lines can be formed the same way as conductive lines 122*h*, 122*i*, 122*j* and 122*k*.

FIG. 11*s* is a side view of bonded semiconductor structure 105 as shown in FIG. 11*r*, wherein bonded semiconductor 105 is cleaved between material transfer region islands 133*a* and 133*b* to form die 149*a* and 149*b*. In this embodiment, die 149*a* includes electronic circuit 108*c* in communication with electronic circuit 108*f* through interconnect region 120. In particular, die 149*a* includes electronic circuit 108*c* in communication with electronic circuit 108*f* through conductive lines 122*a* and 122*h* and conductive contact 181*a*. Further, die 149*a* includes electronic circuit 108*c* in communication with electronic circuit 108*f* through conductive lines 122*b* and 122*i* and conductive contact 181*b*. Die 149*a* includes material transfer region island 133*a*, which is bonded to interconnect region 120 through conductive bonding layer 127*a* and bonding interface 125*a*, as shown in FIG. 11*o*.

In this embodiment, die 149*b* includes electronic circuit 108*d* in communication with electronic circuit 108*g* through interconnect region 120. In particular, die 149*b* includes electronic circuit 108*d* in communication with electronic circuit 108*g* through conductive lines 122*c* and 122*j* and conductive contact 181*c*. Further, die 149*b* includes electronic circuit 108*d* in communication with electronic circuit 108*g* through conductive lines 122*d* and 122*k* and conductive contact 181*d*. Die 149*b* includes material transfer region island 133*b*, which is bonded to interconnect region 120 through conductive bonding layer 127*b* and bonding interface 125*b*, as shown in FIG. 11*o*.

FIG. 11*t* is a side view of an alternative embodiment of bonded semiconductor structure 105 and die 149*a* and 149*b*, as shown in FIGS. 11*r* and 11*s*, respectively. In this embodiment, die 149*a* includes conductive interconnects 143*a* and 143*b*, which are carried by material transfer region island 133*a* proximate to electronic circuit 108*f*. Conductive interconnects 143*a* and 143*b* of die 149*a* are in communication with electronic circuit 108*f*. In this embodiment, conductive line 122*h* is in communication with conductive contact 181*a* and conductive interconnect 143*a*. Hence, in this embodiment, electronic circuits 108*c* and 108*f* are in communication with each other through conductive lines 122*a*, 122*h*, conductive contact 181*a* and conductive interconnect 143*a*. Further, in this embodiment, electronic circuits 108*c* and 108*f* are in communication with each other through conductive lines 122*b*, 122*i*, conductive contact 181*b* and conductive interconnect 143*b*.

In this embodiment, die 149*b* includes conductive interconnects 143*a* and 143*b*, which are carried by material transfer region island 133*b* proximate to electronic circuit 108*g*. Conductive interconnects 143*a* and 143*b* of die 149*b* are in communication with electronic circuit 108*g*. In this embodiment, conductive line 122*j* is in communication with conductive contact 181*c* and conductive interconnect 143*a*. Hence, in this embodiment, electronic circuits 108*d* and 108*g* are in communication with each other through conductive lines 122*c*, 122*j*, conductive contact 181*c* and conductive interconnect 143*a*. Further, in this embodiment, electronic circuits 108*d* and 108*g* are in communication with each other through conductive lines 122*d*, 122*k*, conductive contact 181*d* and conductive interconnect 143*b*.

FIG. 11*u* is a perspective view of a portion of die 149*a* of FIG. 11*t*. In this embodiment, conductive line 122*h* includes a conductive via 123*a* which is in communication with conductive contact 181*a*. Further, conductive line 122*h* includes a conductive interconnect 124*a* which is in communication with conductive via 123*a*. Conductive line 122*h* includes a conductive via 123*b* which is in communication with conductive interconnect 124*a* and conductive interconnect 143*a*.

In this embodiment, conductive line 122*i* includes a conductive via 123*c* which is in communication with conductive contact 181*b*. Further, conductive line 122*h* includes a conductive interconnect 124*b* which is in communication with conductive via 123*c*. Conductive line 122*h* includes a conductive via 123*d* which is in communication with conductive interconnect 124*b* and conductive interconnect 143*b*. As mentioned above, conductive interconnects 143*a* and 143*b* are in communication with electronic circuit 108*f*.

FIGS. 12*a* and 12*b* are perspective views of different embodiments of a bonded semiconductor structure 106 which includes a plurality of electronic circuits carried by corresponding material transfer region islands. For example, as indicated by an indication 258 in FIG. 12*a*, electronic circuit 108*f* is carried by material transfer region island 133*a*. Bonded semiconductor structure 106 includes a plurality of electronic circuits carried by corresponding material transfer region islands so that a plurality of die, such as die 149*a* and 149*b*, can be formed, as discussed in more detail above with FIGS. 11*r*, 11*s*, 11*t* and 11*u*. It should be noted that the plurality of material transfer region islands are spaced apart from each other so that conductive lines can extend between them, as shown in FIGS. 11*r*, 11*s*, 11*t* and 11*u*. FIG. 12*b* shows an alternative embodiment of bonded semiconductor structure 106, which can include conductive interconnects 143*a* and 143*b*, as shown in FIGS. 11*t* and 11*u*. In this embodiment, and as indicated by an indication 259 in FIG. 12*b*, electronic circuit 108*f* is carried by material transfer region island 133*a* and positioned so that conductive interconnects 143*a* and 143*b* can be carried by material transfer region island 133*a*.

Figure 13A:
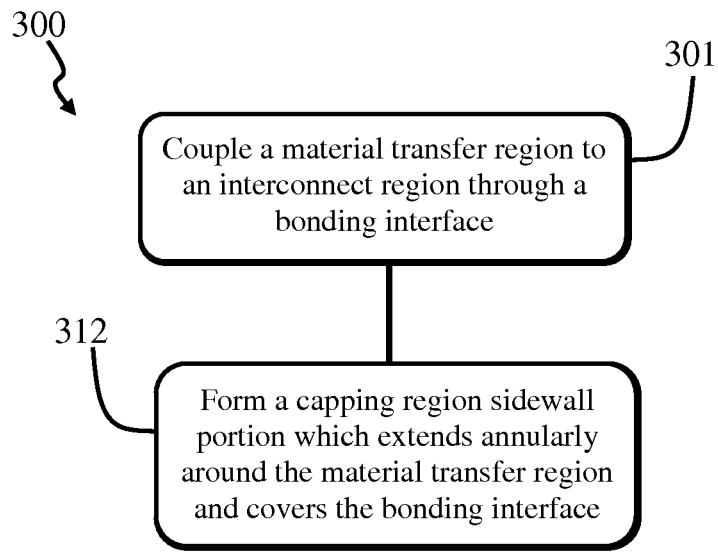
FIGS. 13a and 13b are flow diagrams of method of forming a bonded semiconductor structure.

FIG. 13*a* is a flow diagram of a method 300 of forming a bonded semiconductor structure. In this embodiment, method 300 includes a step 301 of coupling a material transfer region to an interconnect region through a bonding interface. Method 300 includes a step 302 of forming a capping layer sidewall portion which extends annularly around the material transfer region and covers the bonding interface. The capping layer sidewall portion is formed in response to removing a portion of the material transfer region.

In some embodiments, the bonding interface is established with a conductive bonding layer. The conductive bonding layer extends between the material transfer region and interconnect region. In some embodiments, the bonding interface is a metal-to-metal bonding interface. In some embodiments, the bonding interface is a metal-to-dielectric bonding interface.

In some embodiments, method 300 includes a step of polishing a surface of the material transfer region which faces the interconnect region. In some embodiments, method 300 includes a step of polishing an opposed surface of the material transfer region which faces away from the interconnect region. In some embodiments, the capping layer sidewall portion extends between opposed polished surfaces of the material transfer region.

In some embodiments, method 300 includes a step of removing a portion of the material transfer region to form a mesa structure. In some embodiments, the interconnect region includes a conductive line in communication with the mesa structure through the conductive bonding region. In some embodiments, the mesa structure includes a stack of device structure layers. In some embodiments, the mesa structure includes a stack of device structure layers, which include semiconductor material. In some embodiments, the mesa structure includes a stack of device structure layers, which include crystalline semiconductor material. In some embodiments, the mesa structure includes a stack of device structure layers, which include single crystalline semiconductor material. In some embodiments, the mesa structure includes a pn junction.

In some embodiments, method 300 includes forming the interconnect region by forming a conductive line which extends through a dielectric material region. In some embodiments, the conductive line is in communication with the conductive bonding layer.

In some embodiments, the interconnect region is carried by a wafer. The wafer can be of many different types, such as a semiconductor wafer. The wafer can be of many different sizes. For example, in some embodiments, the wafer is an eight inch wafer and, in other embodiments, the wafer is a twelve inch wafer. In some embodiments, the wafer carries an electronic device. In some embodiments, the interconnect region includes a conductive line in communication with the electronic device and conductive bonding layer.

Figure 13B:
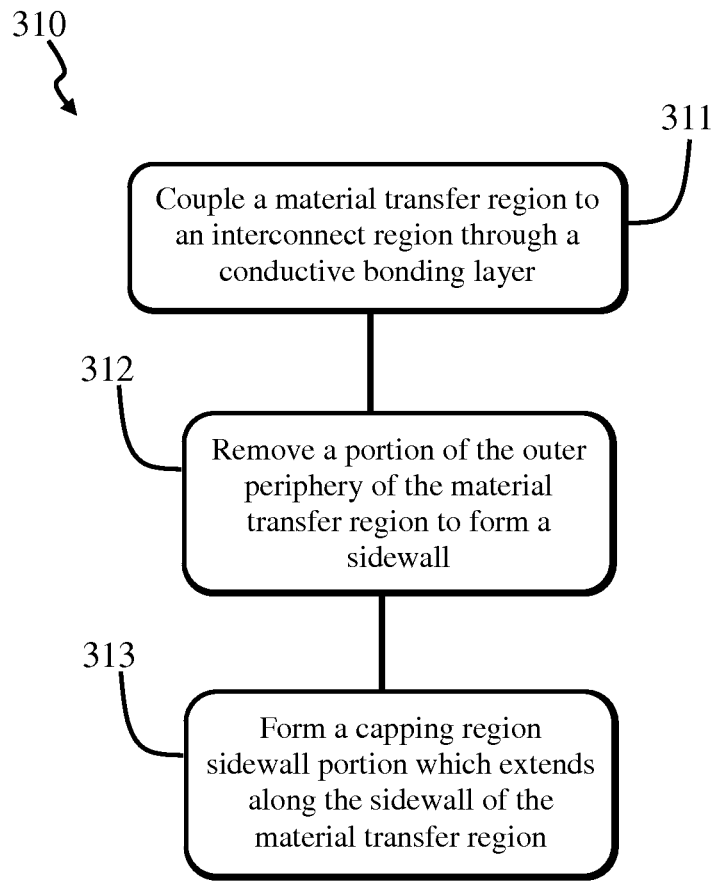

FIG. 13b is a flow diagram of a method 310 of forming a bonded semiconductor structure. In this embodiment, method 310 includes a step 311 of coupling a material transfer region to an interconnect region through a conductive bonding layer. Method 310 includes a step 312 of removing a portion of the outer periphery of the material transfer region to form a sidewall. Method 310 includes a step 313 of forming a capping layer sidewall portion which extends along the sidewall of the material transfer region.

In some embodiments, the bonding interface is established with a conductive bonding layer. The conductive bonding layer extends between the material transfer region and interconnect region. In some embodiments, the bonding interface is a metal-to-metal bonding interface. In some embodiments, the bonding interface is a metal-to-dielectric bonding interface.

In some embodiments, method 310 includes a step of polishing a surface of the material transfer region which faces the interconnect region. In some embodiments, method 310 includes a step of polishing an opposed surface of the material transfer region which faces away from the interconnect region. In some embodiments, the capping layer sidewall portion extends between opposed polished surfaces of the material transfer region.

In some embodiments, method 310 includes a step of removing a portion of the material transfer region to form a mesa structure. In some embodiments, the interconnect region includes a conductive line in communication with the mesa structure through the conductive bonding region. In some embodiments, the mesa structure includes a stack of device structure layers. In some embodiments, the mesa structure includes a stack of device structure layers, which include semiconductor material. In some embodiments, the mesa structure includes a stack of device structure layers, which include crystalline semiconductor material. In some embodiments, the mesa structure includes a stack of device structure layers, which include single crystalline semiconductor material. In some embodiments, the mesa structure includes a pn junction.

In some embodiments, method 310 includes forming the interconnect region by forming a conductive line which extends through a dielectric material region. In some embodiments, the conductive line is in communication with the conductive bonding layer.

In some embodiments, the interconnect region is carried by a wafer. The wafer can be of many different types, such as a semiconductor wafer. The wafer can be of many different sizes. For example, in some embodiments, the wafer is an eight inch wafer and, in other embodiments, the wafer is a twelve inch wafer. In some embodiments, the wafer carries an electronic device. In some embodiments, the interconnect region includes a conductive line in communication with the electronic device and conductive bonding layer.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. A semiconductor structure, comprising: an interconnect region; a material transfer region coupled to the interconnect region through a bonding interface established by a conductive bonding layer; and a capping layer sidewall portion which extends annularly around the material transfer region and covers the outer periphery of the bonding interface, the capping layer sidewall portion being adjacent to the conductive bonding layer and extending along an etched sidewall of the material transfer region, wherein the capping layer sidewall portion includes a dielectric material having a larger permittivity than the dielectric material of the interconnect region.

2. The structure of claim 1, wherein the capping layer sidewall portion consists of a dielectric material.

3. The structure of claim 1, wherein the interconnect region includes a conductive line which extends through a dielectric material region.

4. The structure of claim 3, further including a support substrate which carries the interconnect region and an electronic device in communication with the conductive line.

5. The structure of claim 3, wherein establishes the bonding interface, wherein the conductive bonding layer being is in communication with the conductive line.

6. The structure of claim 1, wherein the bonding interface is a metal-to-semiconductor bonding interface.

7. The structure of claim 1, wherein the capping layer sidewall portion extends adjacent to the interconnect region.

8. The structure of claim 1, wherein the capping layer sidewall portion extends adjacent to an outer periphery of the interconnect region.

9. The structure of claim 1, wherein the capping layer sidewall portion extends proximate to an outer periphery of the interconnect region and material transfer region.

10. The structure of claim 1, wherein the capping layer sidewall portion covers a lip of the interconnect region.

11. A semiconductor structure, comprising: a support substrate which carries an electronic device; an interconnect region carried by the support substrate, the interconnect region including a dielectric material and a conductive line in communication with the electronic device; a conductive bonding layer coupled to the interconnect region, the conductive bonding layer being in communication with the conductive line; a material transfer region coupled to the interconnect region through the conductive bonding layer; and a capping layer sidewall portion which extends annularly around the conductive bonding layer, the capping layer sidewall portion being adjacent to the conductive bonding layer and extending along an etched sidewall of the material transfer region, wherein the capping layer sidewall portion includes a dielectric material having a larger permittivity than the dielectric material of the interconnect region.

12. The structure of claim 11, wherein the material transfer region includes a dielectric material region.

13. The structure of claim 11, wherein the material transfer region includes a semiconductor material region.

14. The structure of claim 11, wherein the material transfer region includes a single crystalline semiconductor material region.

15. The structure of claim 11, wherein the material transfer region includes a stack of single crystalline semiconductor material layers.

16. The structure of claim 11, wherein the dielectric material of the capping layer sidewall portion having a larger permittivity than the material of the material transfer region.

17. The structure of claim 11, wherein the conductive line extends through the dielectric material of the interconnect region.

* * * * *